(12) United States Patent
Drabe et al.

(10) Patent No.: US 12,151,935 B2
(45) Date of Patent: Nov. 26, 2024

(54) MICROMECHANICAL STRUCTURE, MICROMECHANICAL SYSTEM AND METHOD OF PROVIDING A MICROMECHANICAL STRUCTURE

(71) Applicant: Fraunhofer-Gesellschaft zur Förderung der angewandten Forschung e.V., Munich (DE)

(72) Inventors: Christian Drabe, Dresden (DE); André Dreyhaupt, Dresden (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 353 days.

(21) Appl. No.: 17/412,104

(22) Filed: Aug. 25, 2021

(65) Prior Publication Data

US 2021/0380401 A1    Dec. 9, 2021

Related U.S. Application Data

(63) Continuation of application No. PCT/EP2020/054863, filed on Feb. 25, 2020.

(30) Foreign Application Priority Data

Feb. 27, 2019  (DE) .......................... 102019202656.7
Feb. 27, 2019  (DE) .......................... 102019202658.3

(51) Int. Cl.
  *B81B 3/00*   (2006.01)
  *G02B 26/08*  (2006.01)
(52) U.S. Cl.
  CPC ........ *B81B 3/0051* (2013.01); *G02B 26/0833* (2013.01); *G02B 26/0841* (2013.01);
  (Continued)

(58) Field of Classification Search
  CPC ............ B81B 3/0051; B81B 2201/033; B81B 2201/035; B81B 2201/037;
  (Continued)

(56) References Cited

U.S. PATENT DOCUMENTS 6,445,107 B1 *  9/2002  Jeong ..................... B82Y 10/00
                                                      310/309
7,466,474 B2    12/2008  Jung et al.
  (Continued)

FOREIGN PATENT DOCUMENTS

DE         10235370 A1   2/2004
DE      102009045720 A1   4/2011
  (Continued)

OTHER PUBLICATIONS

Cagdaser, B., et al., "Capacitive sense feedback control for MEMS beam steering mirrors", Proc. 2004 Solid-State Sensor and Actuator Workshop, pp. 348-351, Jun. 2004.
  (Continued)

*Primary Examiner* — David Luo
(74) *Attorney, Agent, or Firm* — PERKINS COIE LLP; Michael A. Glenn

(57) ABSTRACT

A micromechanical apparatus includes a substrate, a movable element disposed in a reference plane in an undeflected state, a transmission structure having a first transmission side coupled to the substrate, and a second transmission side coupled to the movable element, and an actuator configured to provide a force along a force direction parallel to the reference plane and apply the same to the first transmission side. The transmission structure is configured to transfer the force along the force direction to a movement of the movable element out of the reference plane.

38 Claims, 33 Drawing Sheets

(52) U.S. Cl.
CPC ... *B81B 2201/033* (2013.01); *B81B 2201/035* (2013.01); *B81B 2201/037* (2013.01); *B81B 2201/042* (2013.01); *B81B 2203/0154* (2013.01); *B81B 2203/04* (2013.01); *B81B 2203/051* (2013.01); *B81B 2203/053* (2013.01); *B81B 2203/058* (2013.01)

(58) Field of Classification Search
CPC ...... B81B 2201/042; B81B 2203/0154; B81B 2203/04; B81B 2203/051; B81B 2203/053; B81B 2203/058; G02B 26/0833; G02B 26/0841; G02B 26/0808
USPC .............................................. 318/116, 3, 558
See application file for complete search history.

(56) References Cited

U.S. PATENT DOCUMENTS

| | | | |
|---|---|---|---|
| 7,508,111 B2 | 3/2009 | Ko et al. | |
| 7,535,620 B2 | 5/2009 | Zhou | |
| 7,538,471 B2 * | 5/2009 | Kurozuka | H02N 1/008 |
| | | | 359/223.1 |
| 9,306,475 B1 * | 4/2016 | Ba-Tis | H02N 1/006 |
| 9,733,470 B2 | 8/2017 | Gu-Stoppel et al. | |
| 2003/0053186 A1 | 3/2003 | Arima | |
| 2003/0057350 A1 | 3/2003 | Miller et al. | |
| 2003/0174931 A1 | 9/2003 | Rodgers et al. | |
| 2005/0046504 A1 | 3/2005 | Xiaoyu et al. | |
| 2005/0174624 A1 | 8/2005 | Greywall | |
| 2006/0107743 A1 | 5/2006 | Ullmann | |
| 2006/0125347 A1 | 6/2006 | Yoda et al. | |
| 2006/0220492 A1 | 10/2006 | Greywall | |
| 2008/0073163 A1 | 3/2008 | Weir et al. | |
| 2008/0074718 A1 | 3/2008 | Bush et al. | |
| 2008/0151345 A1 | 6/2008 | Zhou | |
| 2009/0201095 A1 | 8/2009 | Onuma | |
| 2011/0090551 A1 | 4/2011 | Pirk et al. | |
| 2011/0205609 A1 | 8/2011 | Mizoguchi | |
| 2012/0119614 A1 | 5/2012 | Gutierrez | |
| 2014/0300942 A1 | 10/2014 | Wilhelmus et al. | |
| 2014/0340726 A1 | 11/2014 | Gu-Stoppel et al. | |
| 2015/0203346 A1 | 7/2015 | Fujimoto et al. | |
| 2018/0017783 A1 | 1/2018 | Ji et al. | |

FOREIGN PATENT DOCUMENTS

| | | |
|---|---|---|
| DE | 102008012825 B4 | 8/2011 |
| DE | 102013209234 A1 | 11/2014 |
| EP | 1123526 B1 | 7/2002 |
| JP | 2006167860 A | 6/2006 |
| JP | 4285005 B2 | 6/2009 |
| JP | 2015229220 A | 12/2015 |
| WO | 0025170 A1 | 5/2000 |
| WO | 0196930 A1 | 12/2001 |

OTHER PUBLICATIONS

Fritz, et al., "Microscanner Using Self Aligned Vertical Comb Drives in a Switched Electrode Configuration for Large Static Rotation", Topic: Optical scanners and micromirrors, 2009; pp. 37-38.

Kaiser, B., "DRAFED_Zwischenbericht", rev2, 170731, reference available in German only; Sep. 25, 2017.

Milanovic, V., et al., "Laterally Actuated Torsional Micromirrors for Large Static Deflection", IEEE Photonics Technology Letters, vol. 15, No. 2, pp. 245-247, Feb. 2003.

Zhou, L., et al., "Scanning micromirrors fabricated by an SOI-SOI Wafer-Bonding Process", Journal of Microelectromechanical Systems, vol. 15, No. 1, pp. 24-32, Feb. 2006.

* cited by examiner

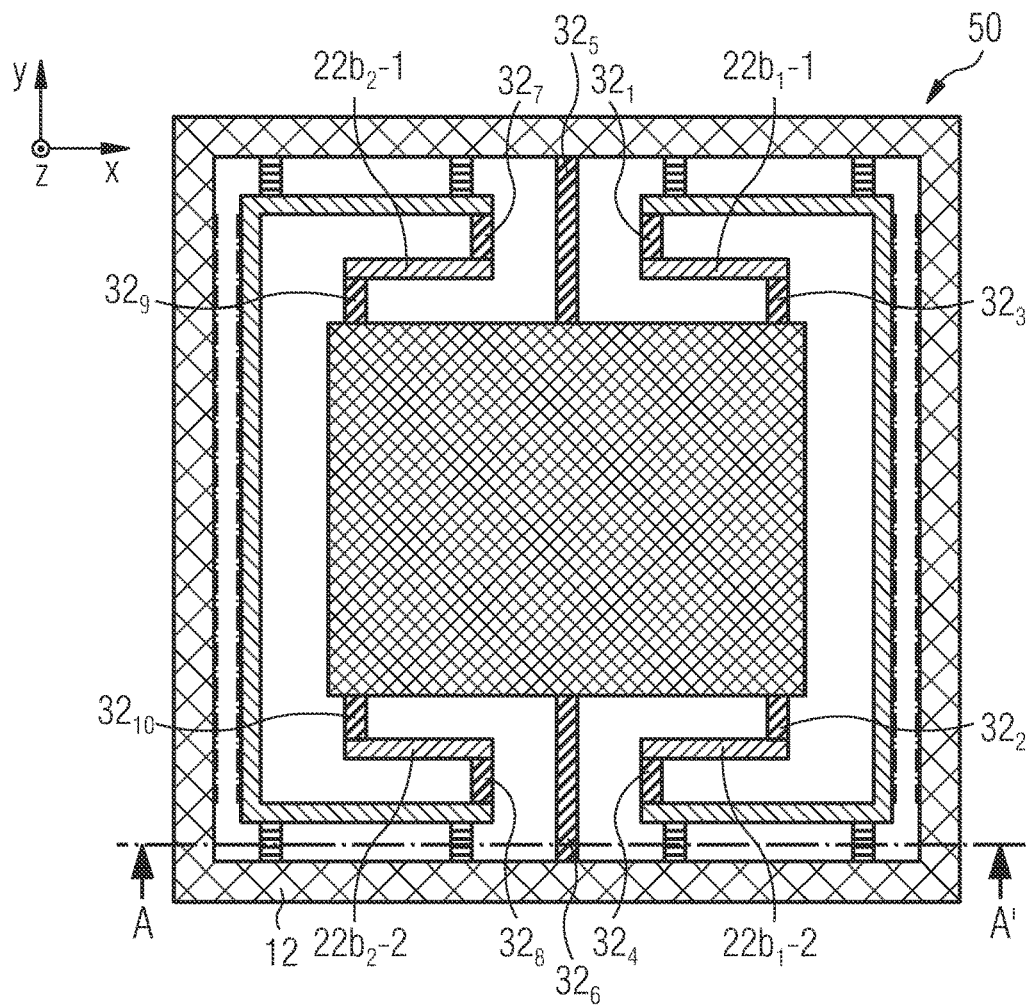
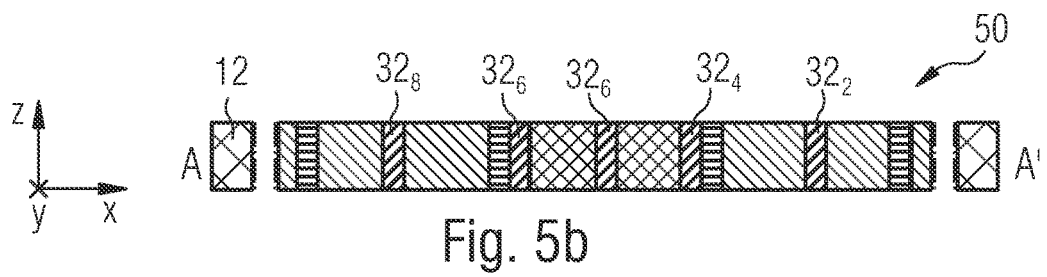
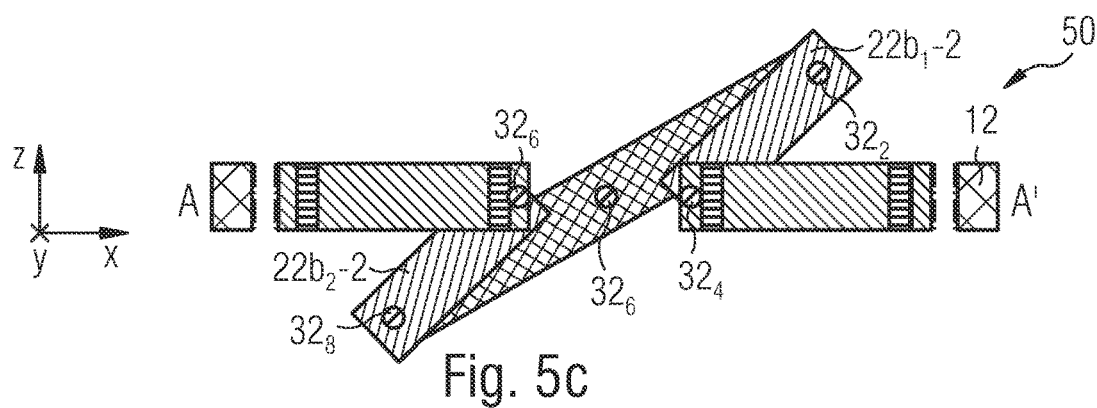
Fig. 5a
Fig. 5b
Fig. 5c

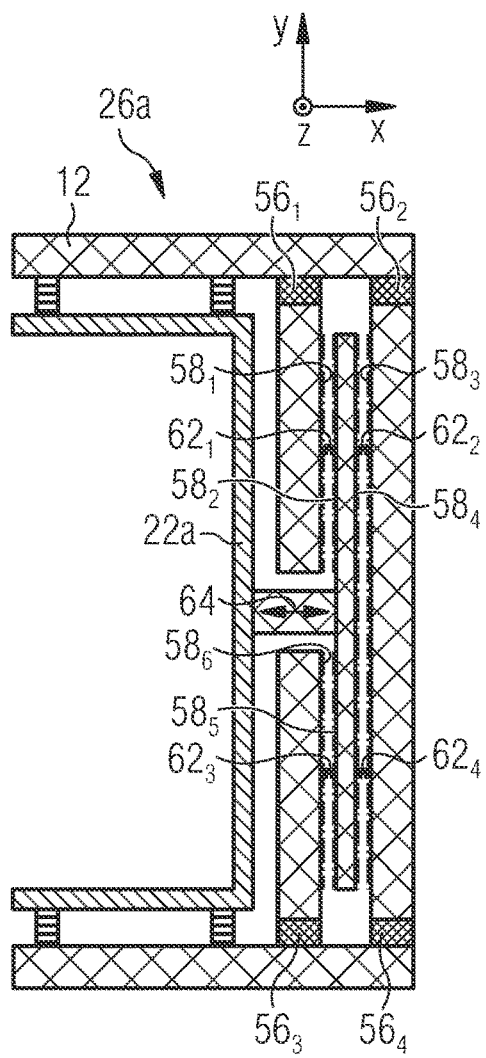
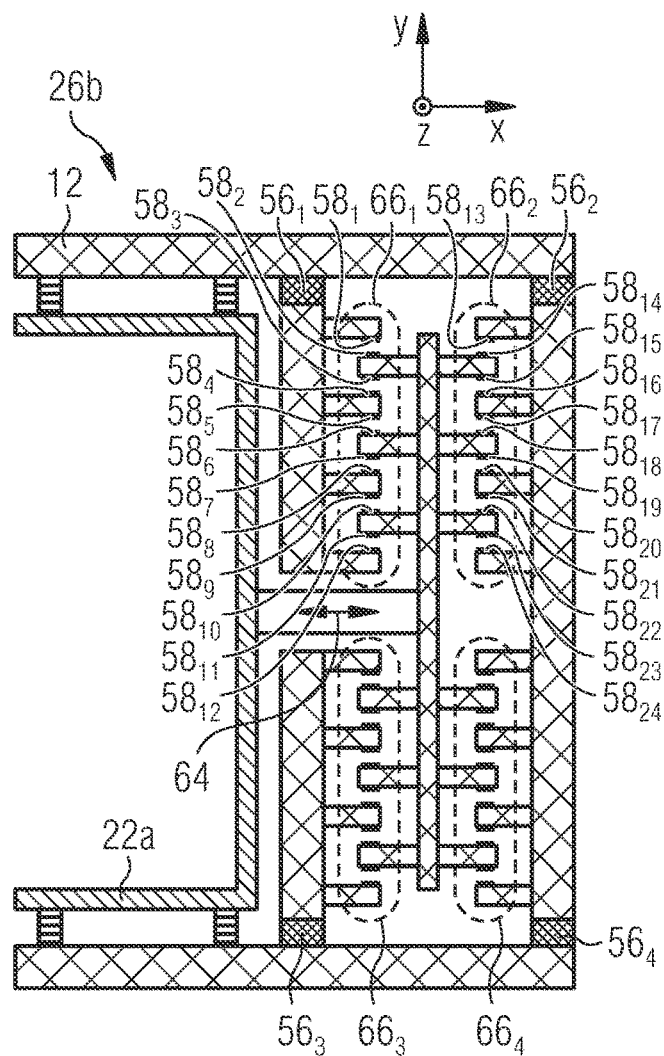
Fig. 23a
Fig. 23b
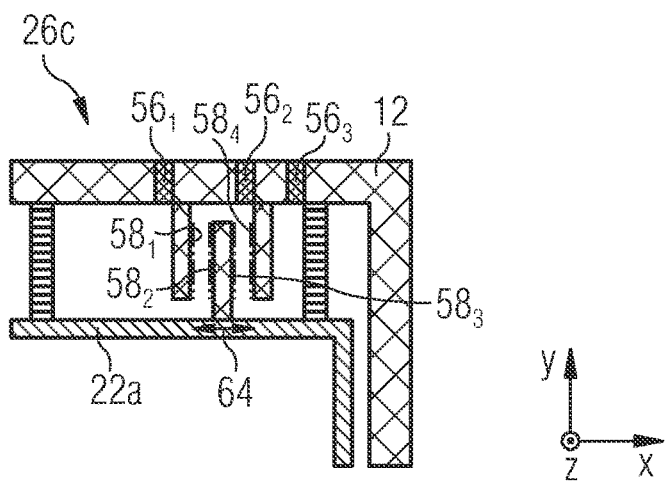
Fig. 23c

MICROMECHANICAL STRUCTURE, MICROMECHANICAL SYSTEM AND METHOD OF PROVIDING A MICROMECHANICAL STRUCTURE

CROSS-REFERENCE TO RELATED APPLICATIONS

This application is a continuation of copending International Application No. PCT/EP2020/054863, filed Feb. 25, 2020, which is incorporated herein by reference in its entirety, and additionally claims priority from German Application No. 102019202656.7, filed Feb. 27, 2019, and from German Application No. 102019202658.3, filed Feb. 27, 2019, both of which are also incorporated herein by reference in their entirety.

BACKGROUND OF THE INVENTION

The present invention relates to a micromechanical structure, and more particularly to a micromechanical structure having a movable element deflectable out of a reference plane. The present invention also relates to a micromechanical system, to an apparatus comprising a micromechanical structure or a micromechanical system, and to a method of providing a micromechanical structure. The present invention further relates to linearizable resonant devices.

To move micro-electro-mechanical systems (MEMS), such as micromirrors or microgratings, out of their plane (out-of-plane), in addition to various physical methods, such as magnetic, piezoelectric and acoustic methods, three basic electrostatic methods are available:

The devices can be operated as follows using laterally arranged electrodes, such as those shown in FIG. 30, or laterally arranged interdigitated electrode combs, such as those shown in FIG. 31, or plate capacitors, such as those shown in FIG. 32. Thus, FIG. 30 shows a schematic perspective view of a known MEMS in which a drive electrode 1002 is configured to deflect a mirror plate 1004 attached via torsion springs 1006 to an armature 1012 attached to a frame. For this purpose, the drive electrode 1002 is electrically insulated with respect to the frame 1008 by an oxide layer 1014. By applying a pulsed voltage in the range of twice the natural frequency of the torsional oscillator shown in FIG. 30 to the drive electrode 1002, the mirror plate 1004 can be set into resonant oscillation.

In contrast, FIG. 31 shows a perspective scanning electron micrograph of interdigital electrodes 1016a and 1016b, in which a tilt of the interdigital electrodes 1016a and 1016b relative to each other can be obtained by applying an electric voltage.

FIG. 32 shows a schematic lateral sectional view in which the mirror plate 1004 is deflectable by the angle φ by applying an electric voltage to the mirror plate 1004 and one of the opposing electrodes 1018a or 1018b, that is a deflection of a rotatably supported mirror plate 1004 can be obtained by applying an electric voltage between plate capacitors.

Operation can be classically resonant, as described for example in EP 1 123 526 B1. If the electrodes (combs) are in the same plane, applying a suitable square-wave voltage in the vicinity of twice the resonant frequency can set the components into resonant oscillation, as shown in FIG. 33 and FIG. 34. The electrode combs are interdigitated in the rest position. In other words, FIG. 33 shows a schematic diagram for resonant operation of micromechanical components. A square-wave voltage of twice the frequency of the resonant frequency generates the drive, the accelerating voltage is switched on at the upper and lower reversal points of the oscillation, and switched off in the rest position. FIG. 34 shows a response curve of a resonantly operated micromirror.

Furthermore, there is a classical quasi-static drive which can also be used resonantly. Such concepts are described, for example, in DE 10 2008 012 825 B4, JP 4285005 B2, U.S. Pat. No. 7,508,111 B2 or U.S. Pat. No. 7,535,620 B2. If electrodes (combs) are located in two superimposed or tilted planes, the components can be moved quasi-statically (as well as resonantly in the range of the resonant frequency), as shown, for example, in FIG. 35. Here, the electrode combs are interdigitated in the deflected state. In other words, FIG. 35 shows a schematic diagram and SEM images of a micromirror system for quasi-static operation. The electrode combs are located on two planes in the rest position, as shown in the right part of FIG. 35, or are pre-deflected at an angle, as shown in the left art of FIG. 35. Applying a static electric voltage results in deflection.

Referring again to FIG. 32, parallel plate capacitors mounted below a plate there can be used to deflect plate 1004 both quasi-statically and resonantly. With a classical lever system mounted in several planes, lateral forces can be converted into out-of-plane motion, as described, for example, in "Laterally Actuated Torsional Micromirrors for Large Static Deflection (Melanovic et al., IEEE Photonics Technology Letters, vol. 15, No. 2, February 2003).

All of the above methods entail a number of technical problems, most notably the technologically complex production of multiple functional planes to operate the devices.

It would be desirable to have MEMS that are easy to manufacture and can be controlled reliably.

An object underlying the present invention is providing MEMS that are easy to manufacture and can be controlled reliably.

SUMMARY

According to an embodiment, a micromechanical structure may have: a substrate; a movable element arranged in a reference plane in an undeflected state; a transmission structure having a first transmission side coupled to the substrate, and a second transmission side coupled to the movable element; and an actuator configured to provide a force along a force direction parallel to the reference plane and apply the same to the first transmission side; wherein the transmission structure is configured to transfer the force along the force direction to a movement of the movable element out of the reference plane; wherein the substrate, the movable element and the transmission structure are arranged in a common substrate plane.

Another embodiment may have a micromechanical system having a first inventive micromechanical structure as mentioned above, arranged as a movable element of a second inventive micromechanical structure as mentioned above.

According to another embodiment, an apparatus may have: an inventive micromechanical structure as mentioned above, or a micromechanical system having a first inventive micromechanical structure as mentioned above, arranged as a movable element of a second inventive micromechanical structure as mentioned above; and control means configured to control the actuator; wherein the control means is configured for adjusting an oscillation of the movable element at a target frequency to apply a control signal to the actuator, having a value of a start frequency, the value of the start frequency being greater than the target frequency, and to reduce the frequency of the control signal in a plurality of steps until the target frequency is obtained; or wherein the control means is configured for adjusting an oscillation of the movable element at a target frequency to apply a control signal to the actuator, having a value of a start frequency, the value of the start frequency being smaller than the target frequency, and to increase the frequency of the control signal in a plurality of steps until the target frequency is obtained, wherein the target frequency is a resonant frequency of the apparatus.

The inventors have realized that the inventive arrangement of a transmission (or gear mechanism) allows manufacturing MEMS which include only a few, possibly only one functional plane and therefore are easy to manufacture and can be controlled easily and reliably due to the transmission.

According to an embodiment, a micromechanical structure comprises a substrate or frame and a movable element which is arranged in a reference plane in an undeflected state. The micromechanical structure comprises a transmission structure having a first transmission side coupled to the substrate, and a second transmission side coupled to the movable element. The micromechanical structure comprises an actuator configured to provide a force along a force direction parallel to the reference plane and apply the same to the first transmission side. The transmission structure is configured to transfer (or translate) the force along the force direction to a movement of the movable element out of or from the reference plane. All the elements can be located in the reference plane in the rest position.

This allows the actuator to be operated in the reference plane (in-plane) and the movement of the actuator via the transmission structure can be used to move the movable element out of the reference plane. Thus, high precision and reliability of the control can be obtained, since a dependence of the actuator force on a deflection angle or a position of the movable element is small or can be prevented.

According to an embodiment, a micromechanical system comprises a first micromechanical structure according to an embodiment arranged as a movable element of a second micromechanical structure according to any of the preceding claims. This allows coupling of multiple transmission structures.

According to an embodiment, an apparatus comprises a micromechanical structure or micromechanical system according to an embodiment. The apparatus further comprises control means configured to control the actuator. The control means is configured to adjust an oscillation or vibration of the movable element at a target frequency. For this purpose, the control means is configured to apply to the actuator a control signal having a value of a start frequency, wherein the value of the start frequency is greater or smaller than the target frequency. The control means is configured to vary the frequency of the control signal in a plurality of steps until the target frequency is reached. This allows excitation of the movable element at high precision.

According to an embodiment, a method of providing a micromechanical structure comprises providing a substrate, arranging a movable element such that it is arranged in a reference plane in an undeflected state, arranging a transmission structure such that a first transmission side is coupled to the substrate and a second transmission side is coupled to the movable element. The method comprises arranging an actuator such that the actuator is configured to provide a force along a force direction parallel to the reference plane and apply the same to the first transmission side such that the transmission structure is configured to transfer the force along the force direction to a movement of the movable member out of the reference plane.

BRIEF DESCRIPTION OF THE DRAWINGS

Embodiments of the present invention will be explained below with reference to the accompanying drawings, in which:

FIGS. 5*a-c* show schematic views of an MMS according to an embodiment in which, compared to the MMS of FIGS. 2*a-c*, second transmission sides are formed in two parts;

FIGS. 23a-c show schematic views of exemplary implementations of actuators according to embodiments which can be used in MMS and micromechanical systems;

DETAILED DESCRIPTION OF THE INVENTION

Before embodiments of the present invention are explained in detail below with reference to the drawings, it is pointed out that identical elements, objects and/or structures or those of equal function or equal effect are provided with the same reference signs in the different figures so that the description of these elements shown in different embodiments is interchangeable or mutually applicable.

The following embodiments relate to micromechanical structures (MMS) comprising an actuator. The actuator may be formed electrically or non-electrically, for example as a thermal actuator. If the actuator is formed as an electrical actuator, for example an electrostatic actuator, piezoelectric actuator, pneumatic actuator, and/or hydraulic actuator, the MMS may also be referred to as a micro-electro-mechanical system (MEMS). The terms MMS and MEMS used herein are therefore combinable or interchangeable as desired and are used as synonyms unless specific differences are discussed.

Subsequent embodiments relate to coupling structures. For example, a first transmission side is coupled to the substrate of the MMS and a second transmission side is coupled to the movable element. Thus, mechanical coupling may or may not refer to direct mechanical coupling. Rather, it is equally within the scope of the embodiments described herein that further elements are arranged between two coupled elements, that is that an indirect mechanical connection is established. In this context, a transmission structure is further understood to be a structure in which substantially inelastic elements or rigid bodies are coupled to one another by means of spring elements in order to provide a lever transmission. This means that, unlike a spring element, the transmission structure is essentially inelastic (i.e. within the limits of material stiffness) so that a deformation to the extent of at least 50%, at least 70%, or at least 90% occurs in spring elements coupled to rigid bodies and only to a lesser extent in the rigid bodies.

MEMS and/or MMS as illustrated in embodiments described herein may be manufactured, for example, as part of semiconductor manufacturing, such as a complementary metal oxide semiconductor (CMOS) process. This may involve forming structures from a layered structure or a layered stack structure, for example by etching processes. Suitable materials for the MEMS described herein may include, for example, silicon materials, such as silicon, silicon oxide, silicon nitride, and/or silicon oxynitride, but may also include other materials, like metals such as copper, aluminum, or the like. Other or different semiconductor materials may also be used, such as gallium arsenide.

Figure 1A:
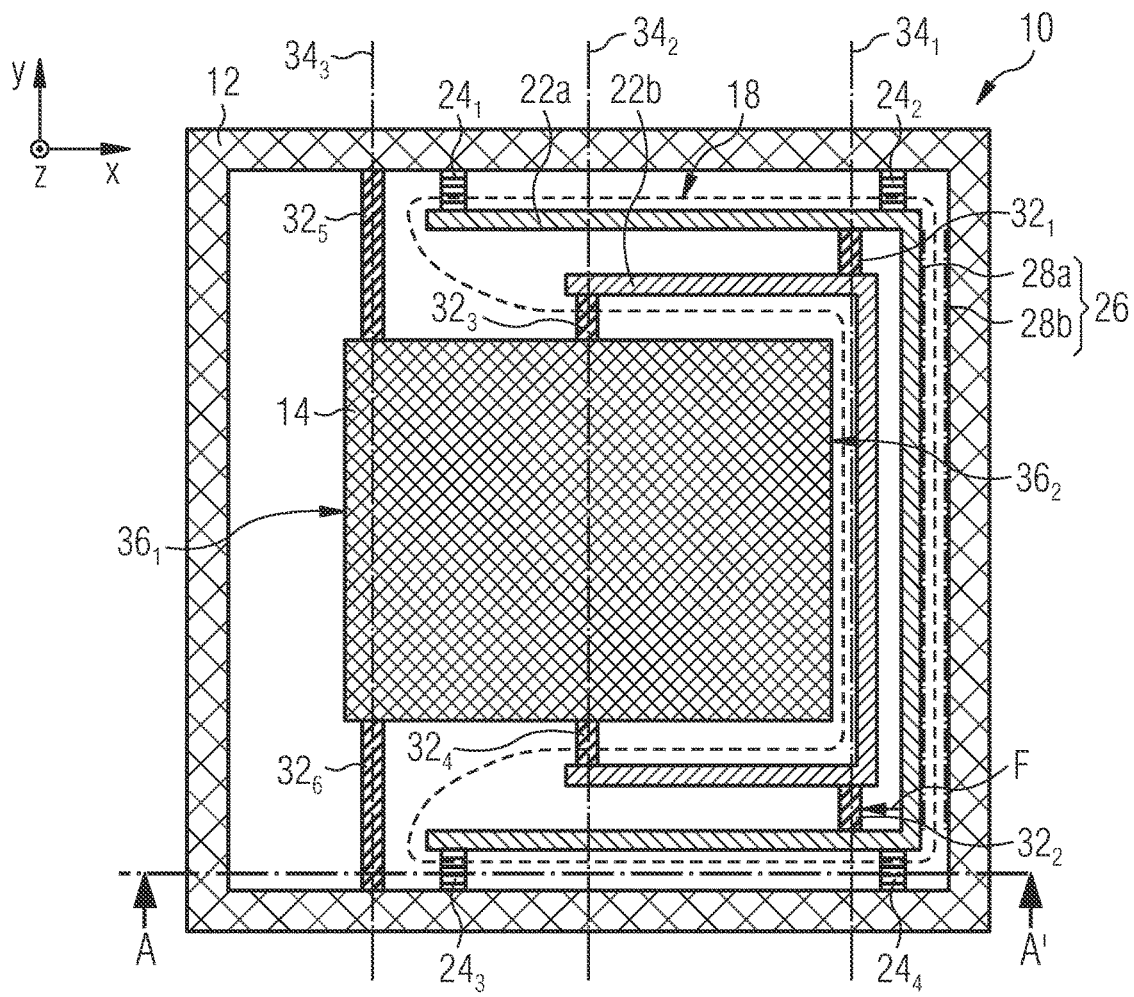
FIGS. 1*a-c* show schematic views of an MMS according to an embodiment having a movable element.
Figure 1B:
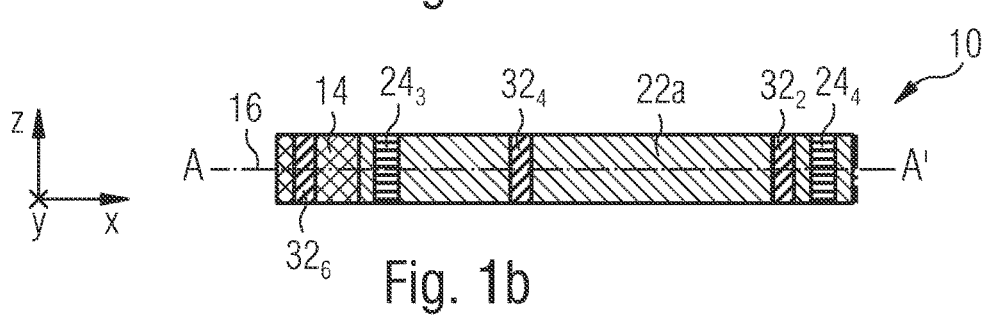

FIG. 1a shows a schematic top view of an MMS 10 according to an embodiment. The MMS 10 comprises a substrate, for example made of a semiconductor material. The substrate may also be referred to as a frame and may provide a reference structure. The substrate or frame is understood to be rigid or immovable in embodiments described herein. Formed as a frame, the substrate may be disposed at or on another substrate. The MMS further comprises a movable element, for example an optical mirror, optical grating, or other element, for example an element for electrically switching currents. Referring to FIG. 1b, which shows a schematic lateral sectional view of the MMS 10 in an undeflected state in a portion of the sectional axis A-A', it is clear that, in an undeflected state shown in FIG. 1b, the movable element is arranged in a reference plane 16 arranged, for example, parallel to planes along which layers of the stack of layers from which the MMS 10 is formed are arranged.

The MMS 10 includes a transmission structure 18 having a first transmission side 22a and a second transmission side 22b. The two transmission sides 22a and 22b may be understood to be rigid bodies. The first transmission side 22a may be coupled to the substrate 12, whereas the second transmission side 22b may be coupled to the movable element 14. Although any other mechanical couplings may be provided, a plurality or multitude of leaf spring elements $24_1$, $24_2$, $24_3$, and $24_4$ may be disposed between the first transmission side $22a$ and the substrate 12 such that the first transmission side $22a$ is coupled to and supported by the substrate 12 via the leaf spring elements $24_i$. Leaf spring elements $24_i$ may be understood to be asymmetrical flexure springs. In this regard, the asymmetry may be adapted to a direction of effect of an actuator 26 of the MMS 10. For example, the actuator 26 may have a first actuator side $28a$ and a second actuator side $28b$ between which a force F is generated. For example, a first actuator side $28a$ may be coupled to the first transmission side $22a$ and a second actuator side $28b$ may be coupled to the substrate 12. The actuator 26 may be configured to generate the force F as a tensile force and/or a compressive force such that the force F may be generated substantially in parallel to the reference plane 16. As will be detailed later, this does not preclude the movable element 14 from having a slight inclination relative to the other layers or stacks of layers, which may be understood both to be an inclination of the movable element 14 relative to the reference plane in the rest state and an inclination of the reference plane 16 relative to the arrangement of the other layers. Such an inclination may be obtained, for example, by utilizing mechanical bias so as to obtain deflections of, for example, at most 10°, at most 8°, at most 5°, or at most 2°.

If the reference plane 16 is tilted due to a tilt of the movable element 14, the actuator 26 is still configured to generate at least one component of the generated force F parallel to the reference plane. The actuator 26 is configured to apply the force F to the first transmission side $22a$, for example as a compressive force, to increase a distance between the first transmission side $22a$ and the substrate 12. Conforming to this, the leaf spring elements $24_i$ may be configured to be rigid within the plane, for example parallel to the z direction and the y direction, and soft perpendicular thereto, for example parallel to an x direction, to allow movement of the transmission side $22a$ along the x direction, i.e. parallel to the direction of the force.

The transmission structure 18 is configured to transfer the force F along the force direction, for example x direction, to a movement of the movable element out of the reference plane 16. This includes both tilting of the movable element 16 and a translational movement of the movable element 14 parallel to the z direction.

Figure 1C:
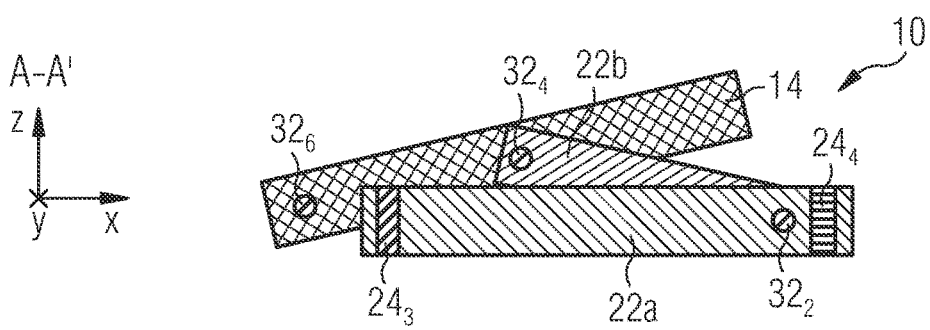

FIG. 1c shows a schematic lateral sectional view of the MMS 10 in a deflected state. The circular representation of the spring profiles or cross sections indicates that the torsion spring elements $32_2$, $32_4$ and $32_6$ are deflected, i.e. twisted, although, when viewed locally, a polygonal cross section of the torsion springs $32_2$, $32_4$ and $32_6$ may remain substantially polygonal. Irrespective of this, other geometries may also be realized, such as a rectangular or circular cross-section. This can be obtained, for example, by etching processes so that embodiments are not limited to round cross sections.

Torsion springs $32_1$ and $32_2$ may be disposed between the first transmission side $22a$ and the second transmission side $22b$, allowing power to be transmitted between the transmission sides $22a$ and $22b$. Torsion springs $32_3$ and $32_4$ may be disposed between the second transmission side $22b$ and the movable element 14, allowing power to be transmitted from the second transmission side $22b$ to the movable element 14. The torsion springs $32_1$ to $32_4$ may allow torsion or rotation of the respective coupled elements with respect to one another. According to an embodiment, the torsion springs $32_1$ and $32_2$ are arranged along a common torsion axis $34_1$. According to an embodiment, the torsion springs $32_3$ and $32_4$ are arranged along a common torsion axis $34_2$. Tilting of the second transmission side $22b$ relative to the first transmission side $22a$ about the torsional axis $34_1$ may occur based on the force F. Torsion of the movable element 14 relative to the second transmission side $22b$ about the torsional axis $34_2$ may occur based on the force F.

For example, the MMS 10 includes torsion springs $32_5$ and $32_6$ which couple the movable element 14 directly to the substrate 12 such that a torsion axis $34_3$ defined by the torsion springs $32_5$ and $32_6$ describes a torsion axis about which the movable element 14 is rotationally supported with respect to the substrate 12. The torsion springs $32_5$ and $32_6$ allow out-of-plane movement.

The torsion springs $32_5$ and $32_6$ may also be omitted such as when the structure is symmetrical with respect to the axis $34_3$, resulting in the movable element 14 to be rotatable about the torsion axis $34_3$ and/or translationally movable out of the reference plane 16, for example along the positive and/or negative z direction, depending on the control.

Making use of the force F as a compressive force can be obtained in this case by the fact that the torsion axis $34_1$ is arranged closer to an edge side $36_2$ of the movable element 14 than the torsion axis $34_2$, wherein for this comparison that edge side 36 can be used to which both torsion axes $34_1$ and $34_2$ have the smallest distance, and that this is not fulfilled for an edge side $36_1$ of the movable element. At the same time, the edge side $36_2$, as well as the edge side $36_1$, is arranged parallel to the torsion axes $34_1$ and $34_2$. It is noted that the movable element 14 may have any geometry, for example polygonal, round, elliptical or according to a free-form surface. In this case, the edge side $36_1$ and/or $36_2$ can be considered to be a virtual edge side and form a tangent to an outer course of the movable element 14 arranged parallel to the torsion axes $34_1$ and $34_2$ and in or parallel to the x/y plane.

According to alternative embodiments, a position of the torsion axes $34_1$ and $34_2$ relative to each other can be interchanged so that, with respect to the edge side $36_2$, the torsion axis $34_2$ has a smaller distance than the torsion axis $34_1$. In this case, the force F can be applied as a tensile force, which means that the first transmission side $22a$ is pulled in the direction towards the substrate 12 along the positive x direction. Whether the torsion axis $34_1$ is arranged on this side or on the other side of the edge side $36_2$, starting from the torsion axis $34_2$, has no major influence on the operating principle of converting a compressive force or a tensile force of the actuator 26 and can be varied based on other parameters, for example a structural stability or force peaks.

Figure 2A:
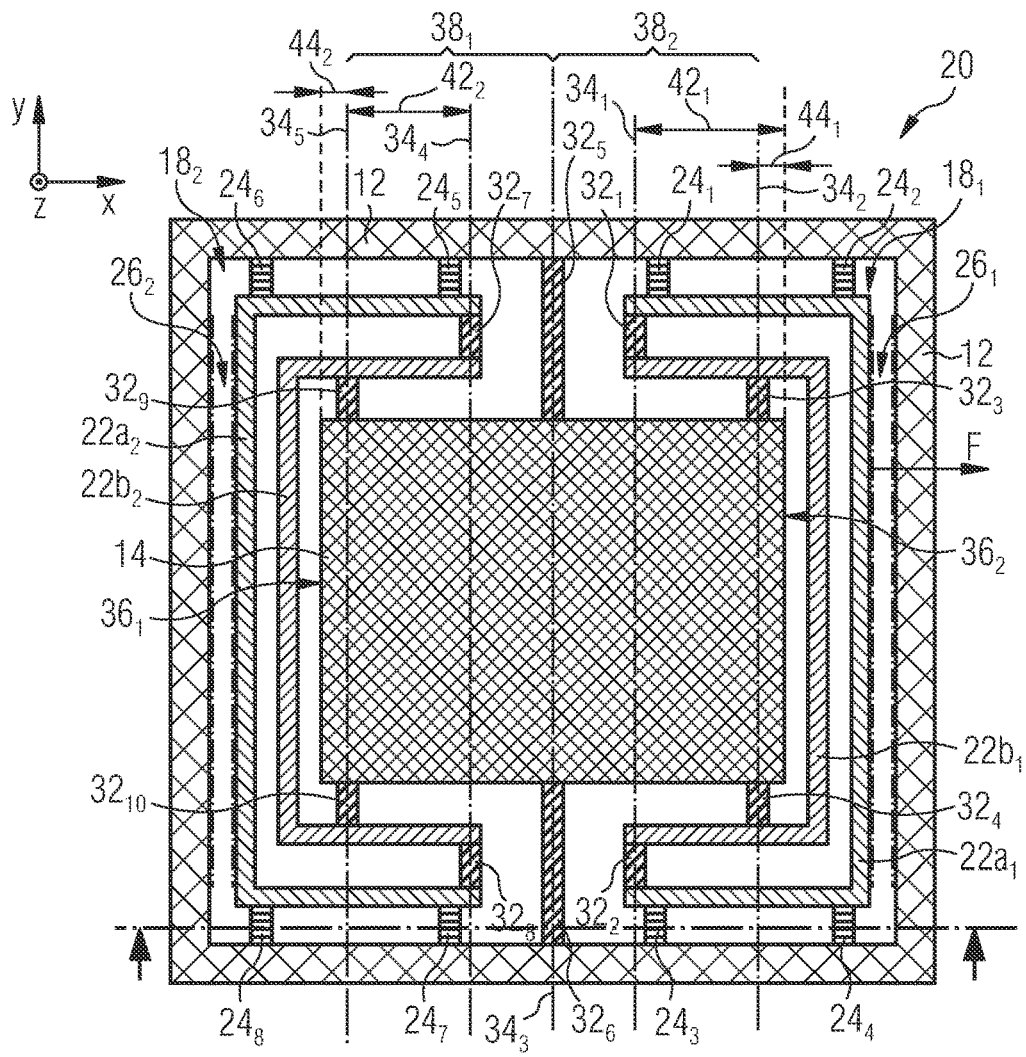
FIGS. 2*a-c* show schematic views of an MMS according to an embodiment in which the movable element is driven on both sides.

FIG. 2a shows a schematic top view of an MMS 20 according to an embodiment in which the movable element 14 is driven on both sides. The MMS 20 may have two or more transmission structures $18_1$ and $18_2$, each of which is driven via an actuator $26_1$ and $26_2$, respectively, as described for the MMS 10. The structure of the transmission structure 18 may be mirrored at an axis of symmetry, which may be arranged along the torsion axis $34_3$, for example, to allow symmetrical actuation of the movable element 14. The torsional axes $34_1$ and $34_2$ defined by torsion springs $32_1$ and $32_2$ and $32_3$ and $32_4$, respectively, may be arranged in a mirrored manner as torsional axes $34_4$ and $34_5$, which torsional axes may be defined by torsion springs $32_7$ and $32_8$ and $32_9$ and $32_{10}$, respectively.

In contrast to the MMS 10, the torsion axes $34_1$ and $34_2$ and $34_4$ and $34_5$ may be arranged such that the torsion axes $34_2$ and $34_5$ defined by the torsion elements connecting the second transmission side to the movable element 14, are arranged closer to the outer sides or edges $36_1$ and $36_2$ than the torsion axes $34_1$ and $34_4$ connecting the first transmission side to the second transmission side. That means that a distance $42_1$ between the torsional axis $34_1$ and the edge $36_2$ may be greater than a distance $44_1$ between the torsional axis $34_2$ and the edge $36_2$, and the same may be apply for a distance $42_2$ between the torsional axis $34_4$ and the edge $36_1$ and a distance $44{2}$ between the torsional axis $34_5$ and the edge $36_1$.

Figure 2B:
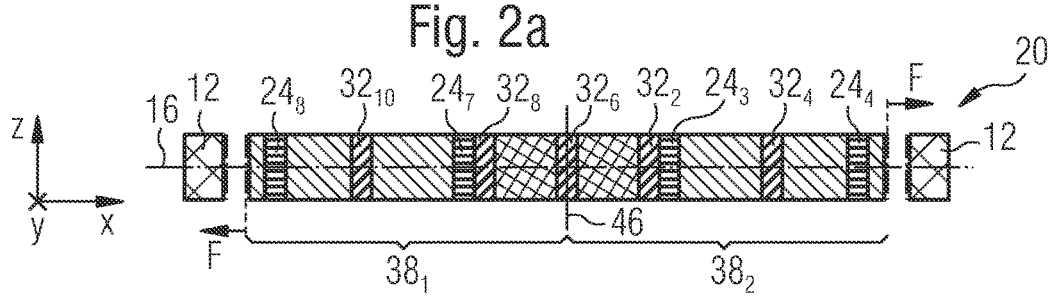

FIG. 2b shows a schematic lateral sectional view of the MMS 20 in an undeflected reference state in which all elements may be arranged within a common plane, for example.

Figure 2C:
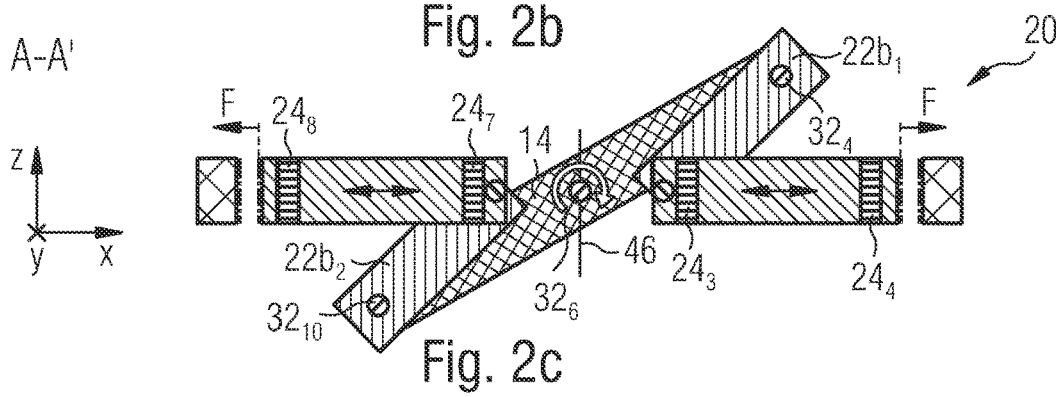

FIG. 2c shows the MMS 20 in a deflected state in which the movable element 14 is at least partially moved out of the reference plane 16, that is arranged to be inclined thereto.

The suspension and actuation of the movable element 14 may be the same or symmetrical in regions $38_1$ and $38_2$. The regions $38_1$ and $38_2$ may be separated from each other by a symmetry plane 46, wherein the torsion axis $34_3$ about which the movable element 14 is rotatably supported may be arranged within the symmetry plane 46. The symmetry plane 46 may be arranged parallel to a y/z plane, whereas the torsion axis $34_3$ may be arranged parallel to the y direction.

Based on the MMS/MEMS manufacturing technology, the first transmission side $22a_1$ and/or $22a_2$ and/or the second transmission side $22b_1$ and/or $22b_2$ may be formed as a plate or beam structure. The torsion spring elements $32_1$ and $32_2$ and/or $32_7$ and $32_8$ may be formed as narrow beam elements designed for torsion and may have, for example, a rectangular cross-section. A rectangular cross-section may, for example, result from an etching process along or opposite to the z direction. The first transmission side 22a and the second transmission side 22b may each be formed as partially open frame structures. The frame structures may be formed as a U-shaped structure and have mutually different sizes, for example with respect to the legs along the y direction and/or the x direction. Here, the U-shaped structures can be oriented the same way, for example, so that openings of the U shape can point in the same direction and/or can be arranged such that bulges of the U shape (center portions) are adjacent to each other and point in the same direction. A U shape may have a straight shape or a bent shape at least in sections, but may also have a continuous transition between straight and bent sections. The frame structures may alternatively or additionally be formed to be entirely or partially round, for example as semicircular structures. The arrangement allows the first transmission side 22a to at least partially surround the second transmission side 22b. In other words, the second transmission side 22b may be disposed within an area enclosed by the first transmission side 22a, allowing for high area efficiency. Alternatively or additionally, the transmission side 22b may be formed to partially enclose the movable element 14.

In other words, embodiments may allow lateral (in-plane) forces to transmit a generated motion of first structures lying in a plane and moving parallel thereto to a second structure (moving element) via transmission elements such that the motion of the second structure is out of the plane. This movement of the second structure may be a rotation about an axis lying in the plane and/or a translation orthogonal to the plane or, especially in the case of nested systems, combinations thereof, i.e. rotation plus translation, translation plus translation, rotation plus rotation, or multiple times. The rotation and/or translation can be static or resonant, and both designs can also be combined one after the other in time, i.e.

implemented alternatingly. All structures may be arranged in one plane. Here, an exemplary micro-mechanical-optical element is connected to the surrounding frame, the substrate 12, via two centrally arranged torsion axes of the springs $32_5$ and $32_6$, for example. The exemplary micro-mechanical-optical element, i.e. the movable element, may comprise a mirror and/or an optical grating. The torsional axes of the springs $32_5$ and $32_6$ may jointly span the torsional axis $34_3$. The optical element 14 is connected to two annular or U-shaped transmission elements $22b_1$ and $22b_2$ laterally encompassing the optical element, via four further torsion axes $32_3$, $32_4$, $32_9$ and $32_{10}$ attached to the outer edge of the optical element 14. The transmission elements $22b_1$ and $22b_2$ are connected externally at the end of the U via four further torsion axes $32_1$, $32_2$, $32_7$ and $32_8$ with two thrust frames, i.e. first transmission sides, $22a_1$ and $22a_2$, which also include the transmission elements $22b_1$ and $22b_2$ and the optical element 14 framed by them in a ring- or U-shaped manner. These thrust frames $22a_1$ and $22a_2$ are connected to the frame 12 at their respective outer corner points via four parallel flexure springs $24_1$, $24_2$, $24_3$ and $24_4$ and $24_5$, $24_6$, $24_7$ and $24_8$, respectively.

The torsion springs $32_i$ as well as the flexure springs $24_i$ may be arranged to be axis-parallel to the torsion axis $34_3$. The three torsion axes or the torsion springs $32_i$ are located at a distance from one another or along an axial collinear alignment, whereby the distance, for example the distance $42_i$ and/or $44_i$ enables the mechanical deflectability of the optical element 14 and enables forces used for the deflection and their optimization. The choice of spacing, in particular whether the distances 42 are larger or smaller than the distances 44, can also define whether the actuator has to provide a tensile force or a compressive force, and the other way around, meaning that with a predetermined actuator, its tensile or compressive force can be taken into account accordingly.

According to embodiments, all the elements are located in one plane. The optical element 14, the first transmission sides 22a and the second transmission sides 22b form a coupled oscillator, wherein the total of four transmission sides and the movable element 14 can be modeled as a five-mass oscillator. The optical element 14 and the second transmission sides $22b_1$ and $22b_2$ as well as the torsion springs $32_3$, $32_4$, $32_9$ and $32_{10}$ can be moved out of the plane, for example the reference plane 16. The actuator(s) can be arranged both in the pull configuration explained in FIG. 2a, i.e., generating a tensile force, and in a frontal push-pull variation, as well as in a corresponding lateral variation.

In other words, FIG. 2a shows a top view of a rotatably linearizable resonant-oscillating micro-mechanical optical element, FIG. 2b a lateral view of the movable elements at rest, and FIG. 2c a lateral view of the movable elements in the deflected state. The "linearizability" of the resonant moved optical element refers to the influenceability of the oscillation by external forces acting on the optical element by means of the transmission. This influence is only possible outside the rest position.

Figure 3A:
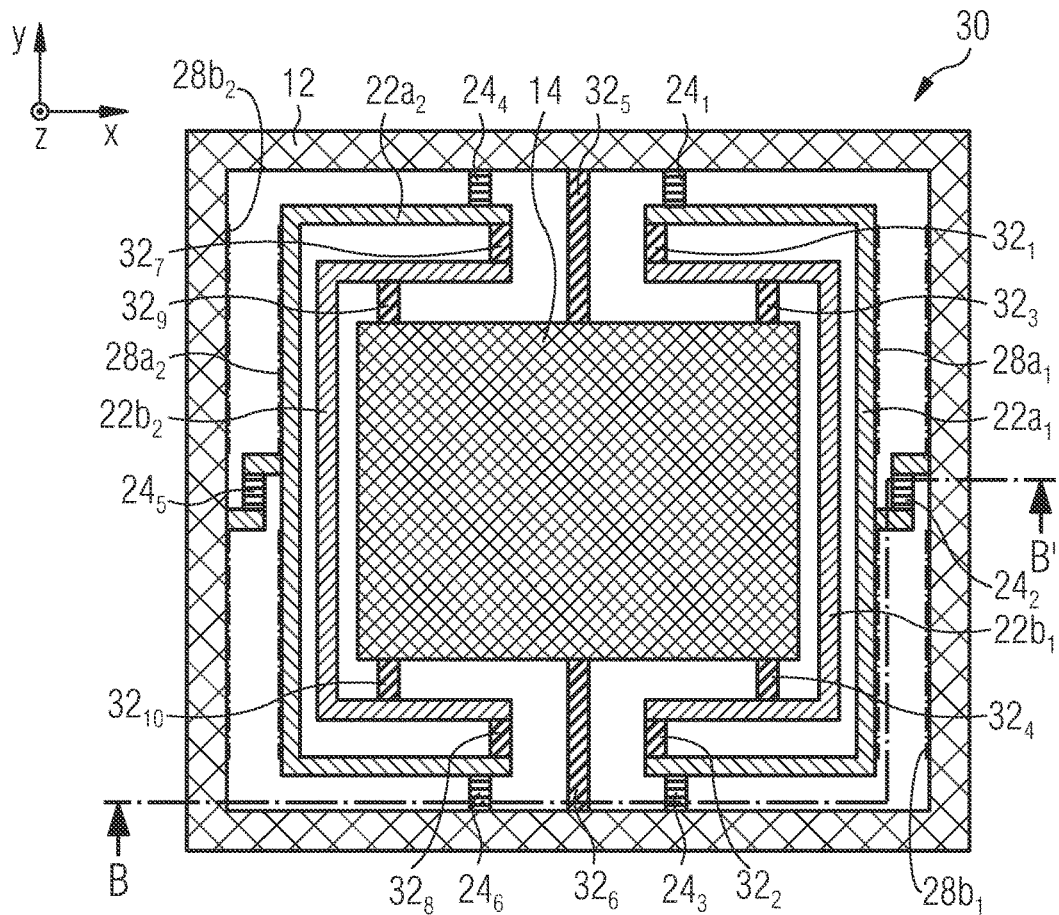
FIGS. 3*a-c* show schematic views of an MMS with only six instead of eight flexure springs for guiding a push frame according to an embodiment.

FIG. 3a shows a schematic top view of an MMS 30 according to an embodiment in which the first transmission side $22a_1$ and $22a_2$ is connected to the substrate 12 via a three-point connection, that is a number of three elements, for example spring elements $24_i$, are used to suspend the first transmission side $22a_1$ and $22a_2$ from the substrate 12.

Figure 3B:
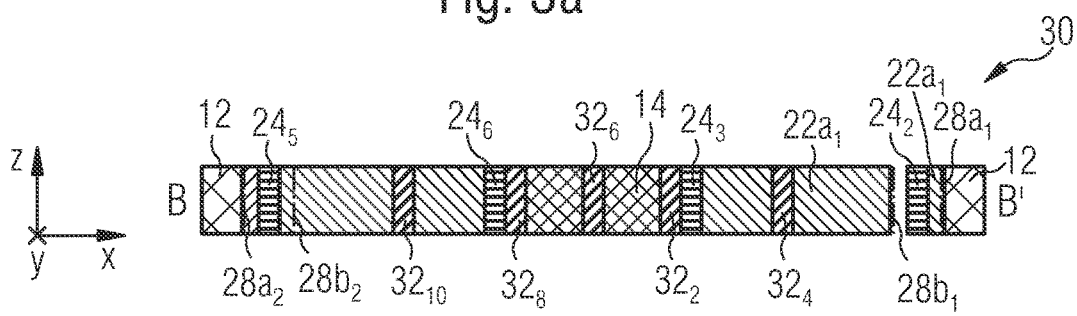

FIG. 3b shows a schematic lateral sectional view of the MMS 30 in an undeflected reference state along a section line B-B' of FIG. 3a.

Figure 3C:
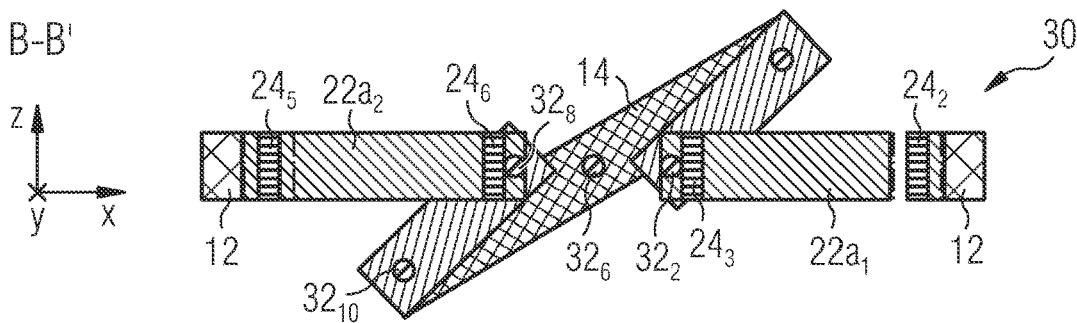

FIG. 3c shows a schematic lateral sectional view of the MMS 30 along section line B-B' in a deflected state.

In other words, FIGS. 3a-3c show a variation with only six instead of eight flexure springs 24 for guiding the thrust frame, the first transmission side 22a. In this way, it can be achieved that less force is used for deflection and the position of the third, central spring $24_2$ or $24_5$ can increase the stability of the thrust frame against rotation about the z axis. To maintain symmetry, two central springs associated with the respective upper and lower halves can be used instead of one central spring. FIG. 3a shows a schematic top view of a rotatably linearizably resonant-oscillating micromechanical optical element, FIG. 3b a lateral view of the movable elements at rest and FIG. 3c a lateral view of the movable elements in a deflected state.

Figure 3D:
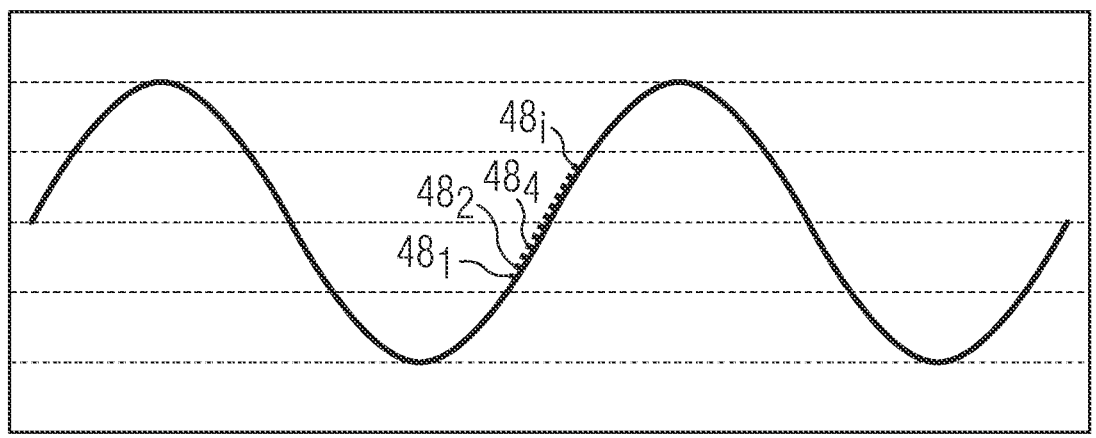
FIG. 3*d* shows a schematic representation of a quasi-harmonic oscillation according to an embodiment.
Figure 31:
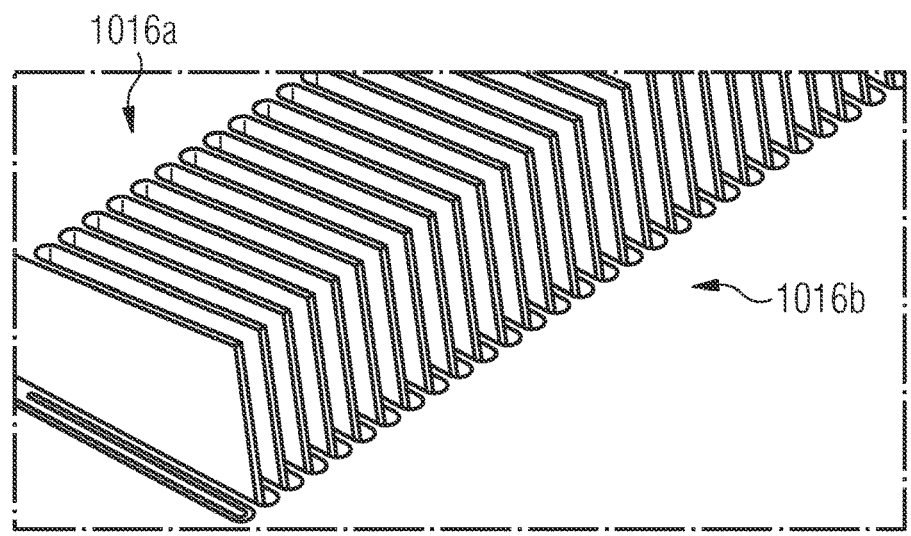
FIG. 31 shows a scanning electron micrograph of laterally arranged interdigitated electrode combs according to the known technology.

The MMS 10, 20 and/or the MMS 30 can be operated in different modes. For example, the MMS 10, 20 and/or 30 can be operated in a resonant mode. FIG. 3d shows a graph of a harmonic oscillation with a quasi-linear region, in the region of points $48_i$. An oscillation described as harmonic in this context is in fact not a harmonic oscillation as shown in FIG. 3d, but an oscillation form deviating from the ideal sinusoidal form (quasi-harmonic). The deviations are caused by various nonlinear effects, e.g. the nonlinear spring characteristic, air damping and the pulsed drive by the actuator. One of the nonlinear effects here results, in particular in the case of large deflections of the movable element, from the gradually or abruptly changing damping by the surrounding medium, as can occur during the "dipping into" (immersion) or "fetching from" of electrode combs in the course of the oscillation, as can occur, for example, in the devices according to FIG. 31 and/or FIG. 33. According to embodiments, the electrode combs used for the drive remain permanently interleaved, in particular in the case of large deflections, so that the damping at the electrode combs, which has dominated to some extent up to now, does not change abruptly. Thus, these nonlinear influences are reduced and the deviations from the harmonic oscillation form are smaller at this point. That is, the actuator may be formed as an electrostatic drive. According to an embodiment, the electrostatic drive may have interdigital electrodes between which electric fields are generated. The interdigital electrodes here may be formed such that the electrodes move along an interleaving direction along which the interdigital electrodes are interleaved, so that immersion into or fetching from of the interdigital electrodes relative to one another can be prevented, especially when the movement of the actuator is arranged to be in-plane.

Figure 3E:
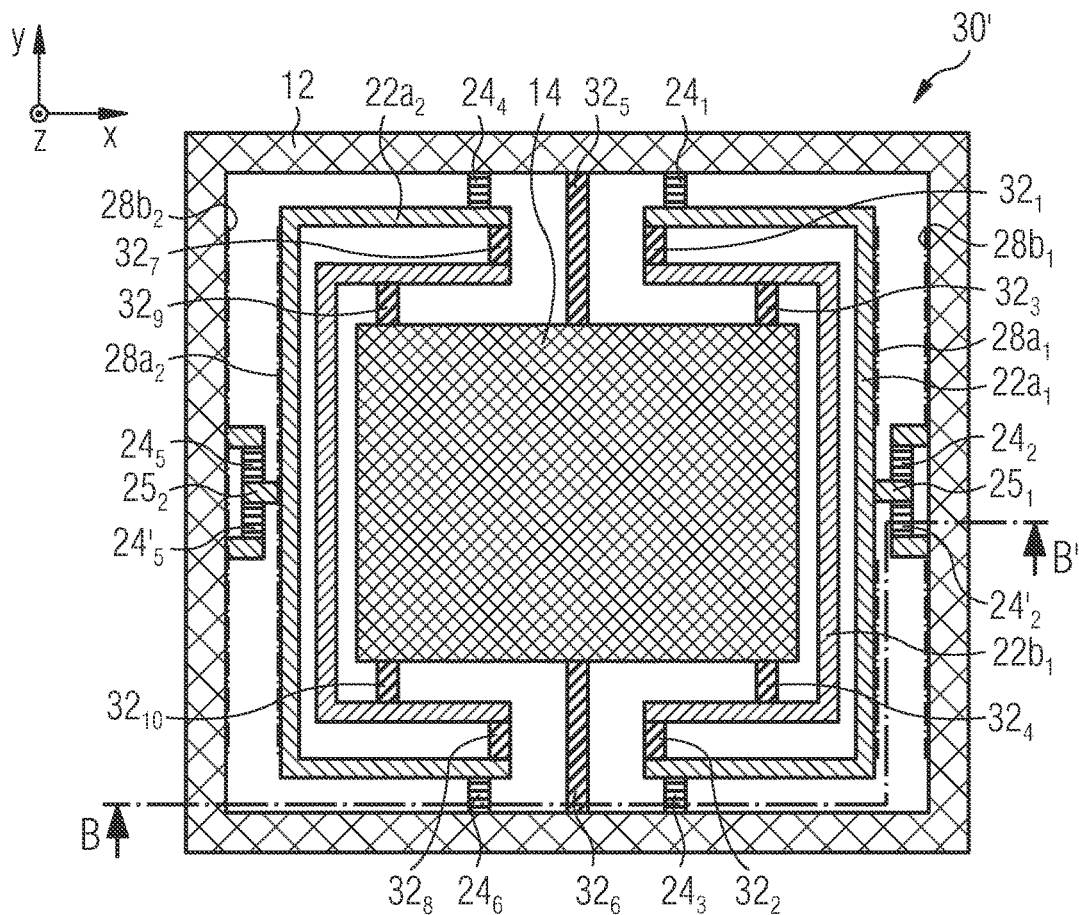
FIGS. 3*e-g* show schematic views of an MMS which compared to the MMS of FIGS. 3*a-c* is suspended symmetrically at the substrate with a first transmission side.

FIG. 3e shows a schematic top view of an MMS 30' according to an embodiment, in which the first transmission side $22a_1$ and $22a_2$ is connected to the substrate 12 via a three-point connection, as described in connection with FIG. 3a. A lateral suspension in the region of the actuator side $28a_2$ of the actuator side $28a_1$ may be arranged symmetrically about mounting axes or mounting armatures or anchors $25_1$ and/or $25_2$, which enables high stability. The mounting armatures $25_1$ and $25_2$ may be attached to or arranged on the first transmission side $22a_1$ and $22a_2$ such that there is a dual symmetrical attachment to the substrate 12, or the other way around. The additional connection for adjusting the symmetry when the MMS 30 is comparatively referenced may be obtained using a flexure spring $24'_2$ and $24'_5$, respectively, advantageously formed equal to the flexure spring $24_2$ and $24_5$ with respect to deformation and forces.

Figure 3F:
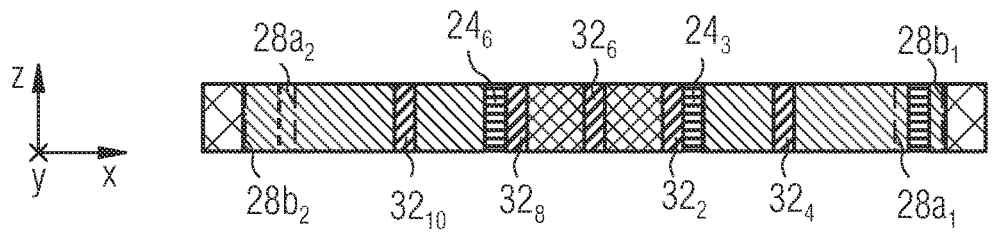

FIG. 3f shows a schematic lateral sectional view of the MMS 30' in an undeflected reference state along a section line B-B' of FIG. 3e.

Figure 3G:
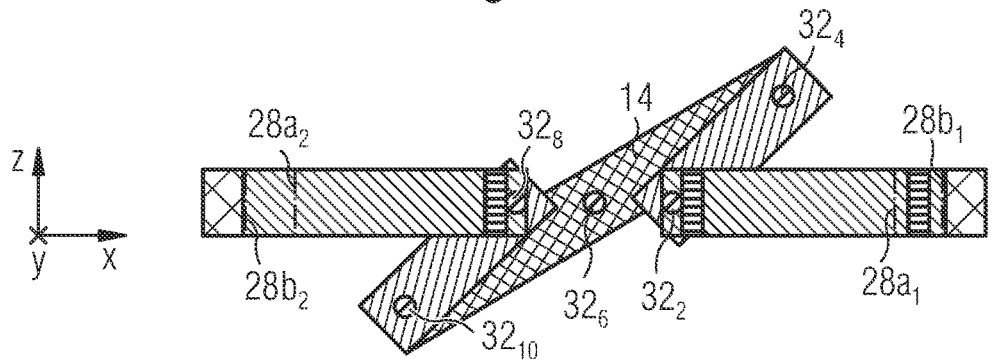

FIG. 3g shows a schematic lateral sectional view of the MMS 30' along the section line B-B' in a deflected state.

Figure 4A:
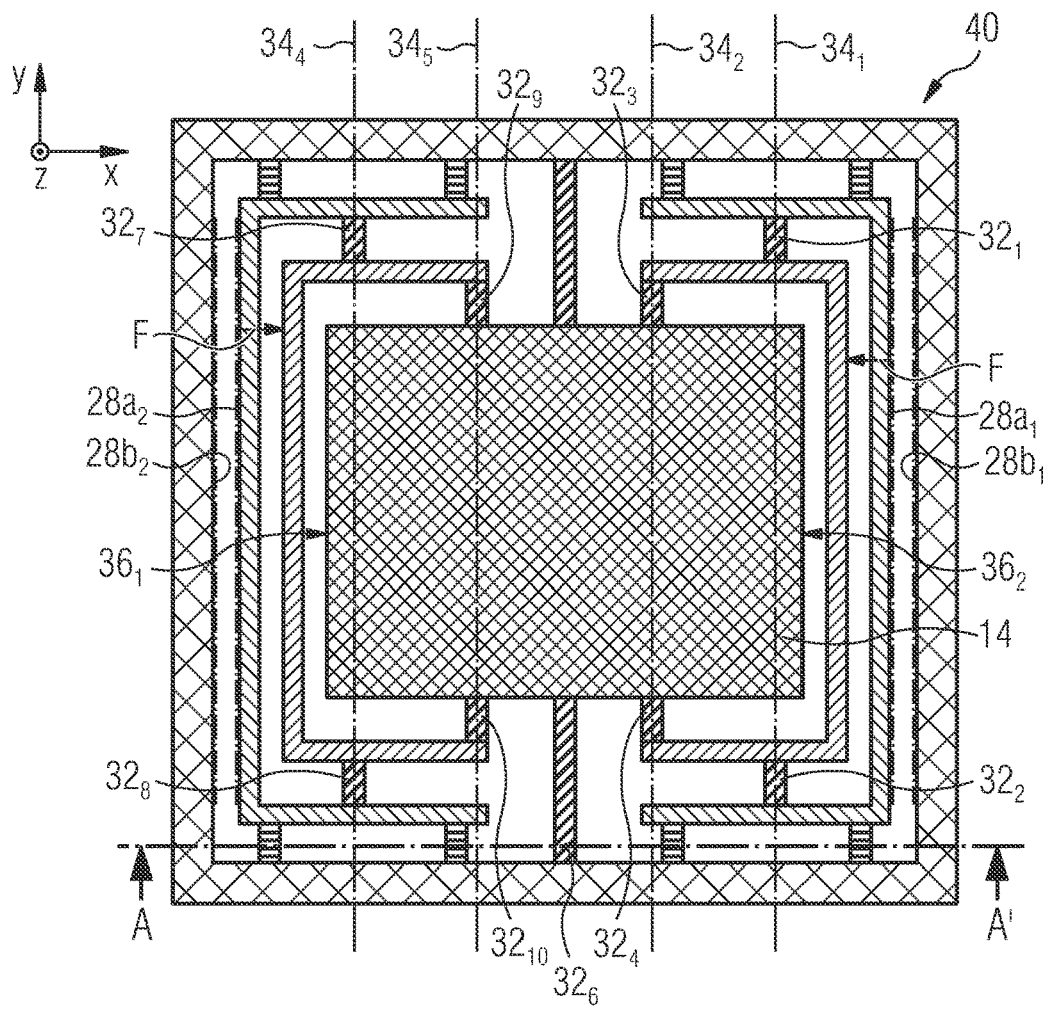
FIGS. 4*a-c* show schematic views of an MMS according to an embodiment which is modified compared to the MMS of FIGS. 2*a-c* with regard to a distance of torsion axes to the edge of the movable element.

FIG. 4a shows a schematic top view of an MMS 40 that is modified compared to the MMS 20 in that the distance of the torsion axis $34_4$ to the edge $36_1$ and the torsion axis $34_1$ to the edge $36_2$ is less than the distance of the torsion axes $34_5$ and $34_2$, respectively, so that the actuator can be operated as a compressive-forces-generating actuator.

Figure 4B:
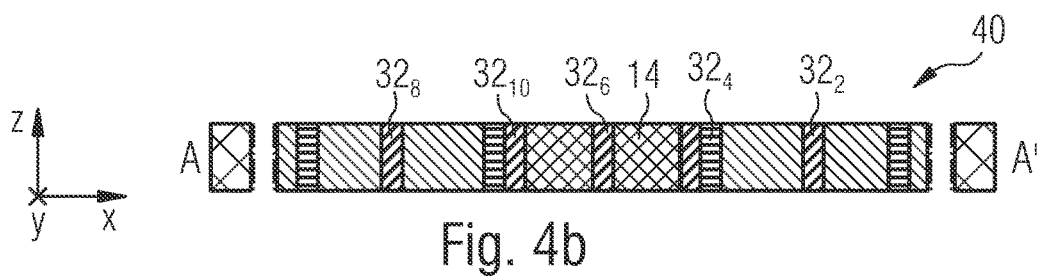

FIG. 4b shows a schematic lateral sectional view of the MMS 40 in the section line A-A' in a rest state.

Figure 4C:
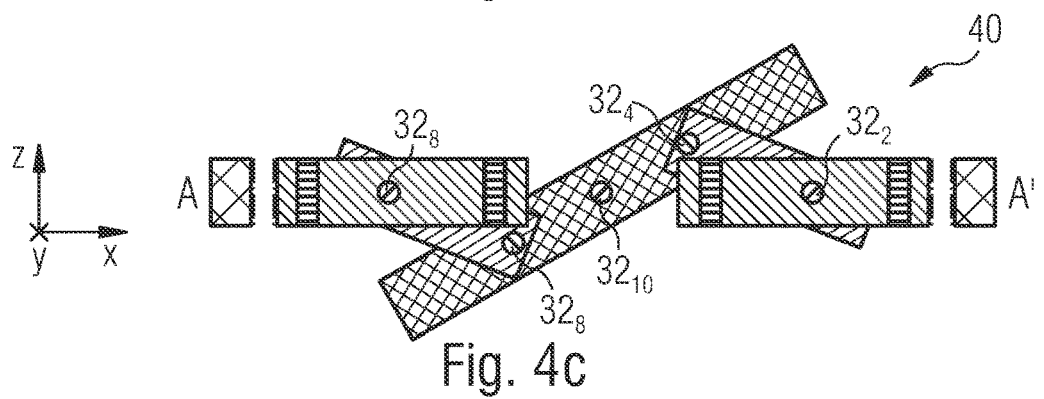

FIG. 4c shows a schematic lateral sectional view of the MMS 40 in a deflected state.

In other words, FIGS. 4a to 4c show a rotatably linearizably resonant-oscillating micro-mechanical-optical element (1D) in a top view (FIG. 4a), a lateral view of the movable elements at rest (FIG. 4b), a lateral view of the movable elements in a deflected state (FIG. 4c). The MMS 40 can be understood to be a symmetrical, two-sided variation of the MMS 10. In the MMS 10, which in contrast can be referred to as a one-sided, asymmetrical variation of the MMS 40, the torsion springs can also be interchanged to increase the parameter space for optimizing the oscillation behavior, that is to use compressive forces instead of tensile forces and vice versa. Some variations shown can also be operated using the classically resonantly operated elements described at the beginning.

FIG. 5a shows a schematic top view of an MMS 50 in which, compared with the MMS 20, the second transmission sides 22b are formed in two parts so that in each case one part $22b_1$-1, $22b_1$-2, $22b_2$-1 and $22b_2$-2 is arranged between torsion springs $32_1$ and $32_3$, $32_2$ and $32_4$, $32_7$ and $32_9$ or $32_8$ and $32_{10}$. In other words, the second transmission sides can also be realized in multiple parts without a direct connection between the individual parts $22b_1$-1 to $22b_2$-2, but only the movable element 14 is given.

FIG. 5b shows a schematic lateral sectional view of the MMS 50 in an undeflected state, whereas FIG. 5c shows a schematic lateral sectional view of the MMS 50 in a deflected state.

Figure 6A:
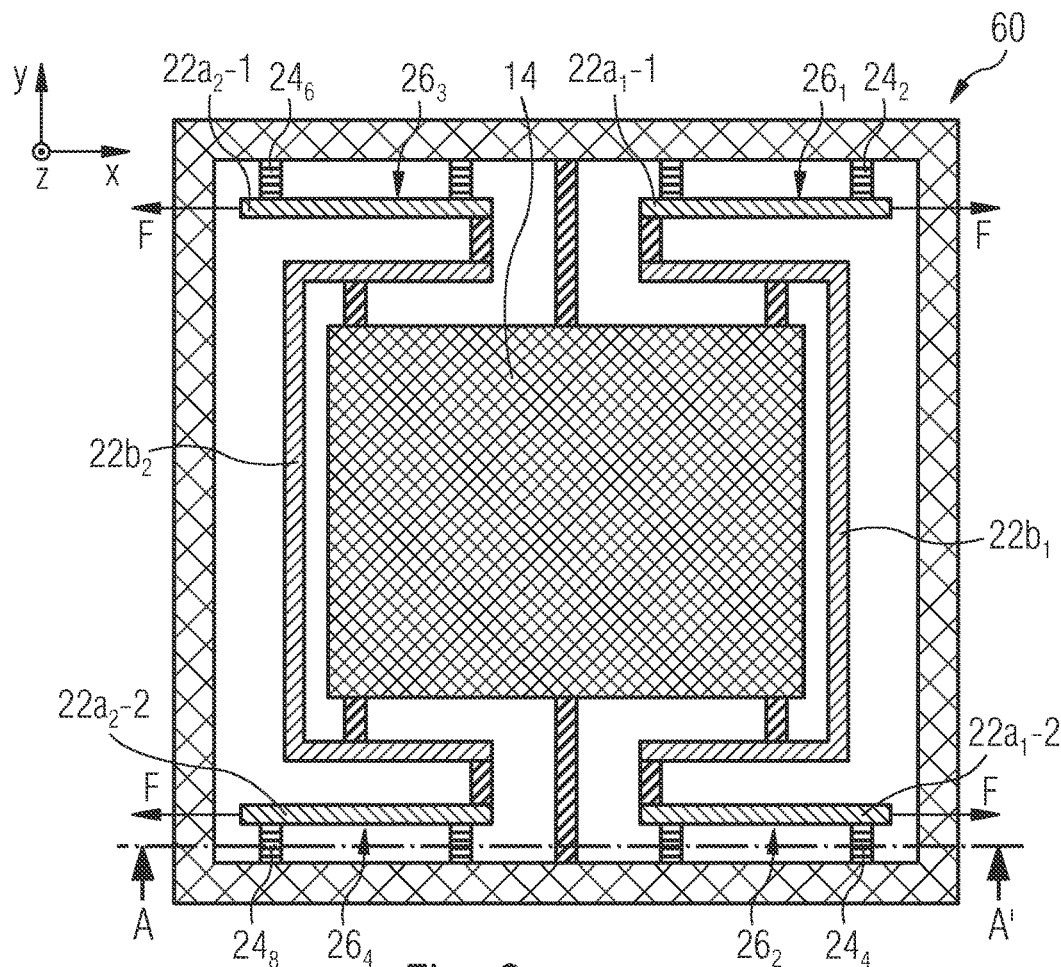
FIGS. 6*a-c* show schematic views of an MMS according to an embodiment in which a first transmission side is implemented in two parts.

FIG. 6a shows a schematic top view of an MMS 60 in which the first transmission side $22a_1$ or $22a_2$ is implemented in two parts compared to the MMS 20, that is between the flexure springs $24_2$, and $24_4$ as well as between the flexure springs $24_6$, and $24_8$, the frame structure of the first transmission side may be at least partially removed so that segments $22a_1$-1, $22a_1$-2, $22a_2$-1, and $22a_2$-2 are still arranged to generate movement of the movable element 14. This may result in actuators being arranged in other locations compared to the MMS 20, for example adjacent to the remaining segments $22a_1$-1 to $22a_2$-2.

Actuators $26_1$ to $26_4$ can be configured to excite the segments $22a_1$-1 to $22a_2$-2 perpendicular to an arrangement direction of the actuators or to apply forces F in the x direction. Possible embodiments of such actuators will be described in more detail later.

Figure 6B:
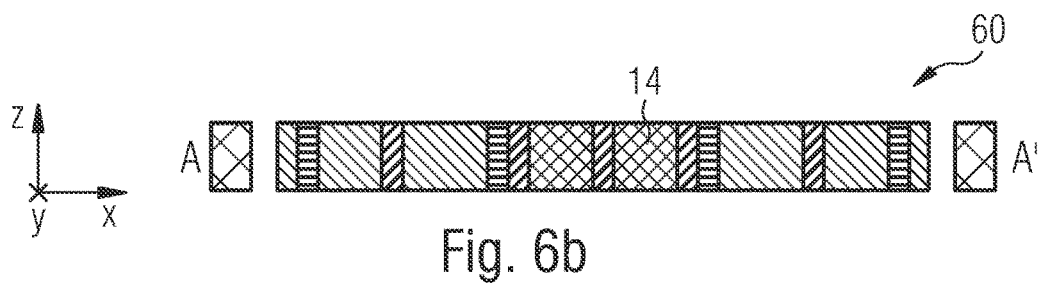

FIG. 6b shows a schematic lateral sectional view of the MMS 60 in the section line A-A' in a rest state.

Figure 6C:
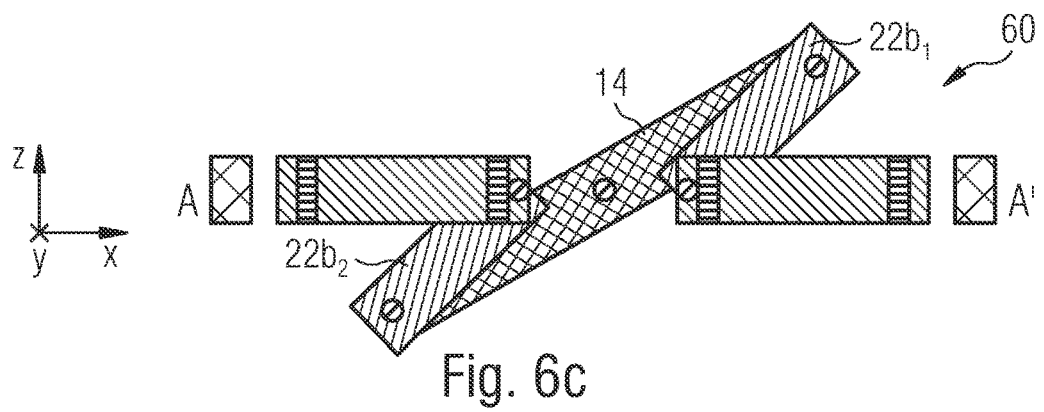

FIG. 6c shows a schematic lateral sectional view of the MMS 60 in a deflected state.

In other words, FIGS. 5a to 6c show variations in which the transmission frame (second transmission side) and the thrust frame (first transmission side) are not closed. A combination of the two variations with two open frames is also possible.

Figure 7A:
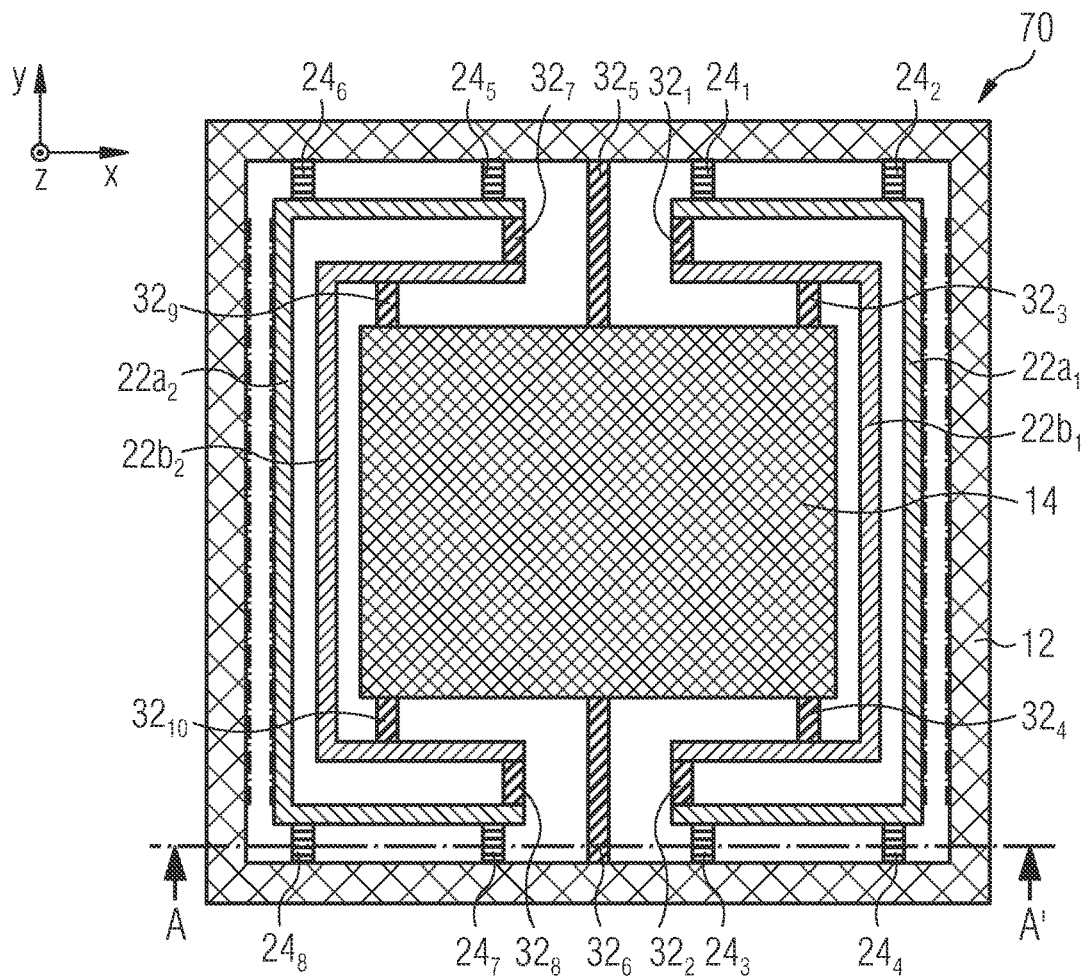
FIGS. 7*a-c* show schematic views of an MMS according to an embodiment in which flexure springs are thinned compared to a substrate.

FIG. 7a shows a schematic top view of an MMS 70, which may correspond to the MMS 20 in the top view shown. Compared to the MMS 20, the flexure springs $24_1$ to $24_8$ may be made thinner along the z direction compared to the substrate 12, the torsion springs $32_1$ to $32_{10}$, the transmission sides $22a_1$, $22a_2$, $22b_1$ and/or $22b_2$ and/or the movable element 14, that is a dimension $h_2$ of the flexure springs $24_i$ may be smaller than a dimension $h_1$ of the other elements.

Figure 7B:
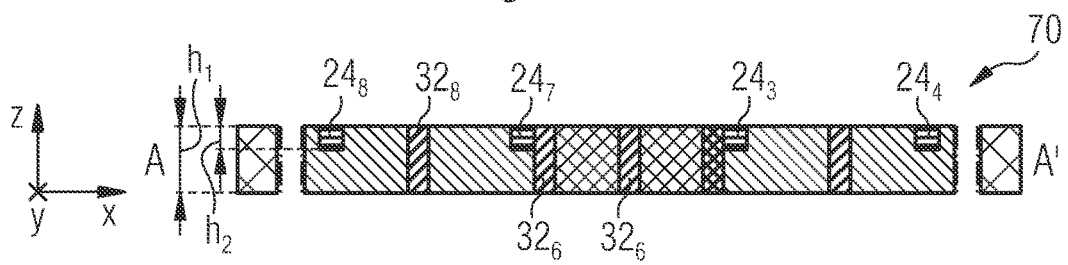

FIG. 7b shows a schematic lateral sectional view of the MMS 70 along the section line A-A' in an undeflected state.

Figure 7C:
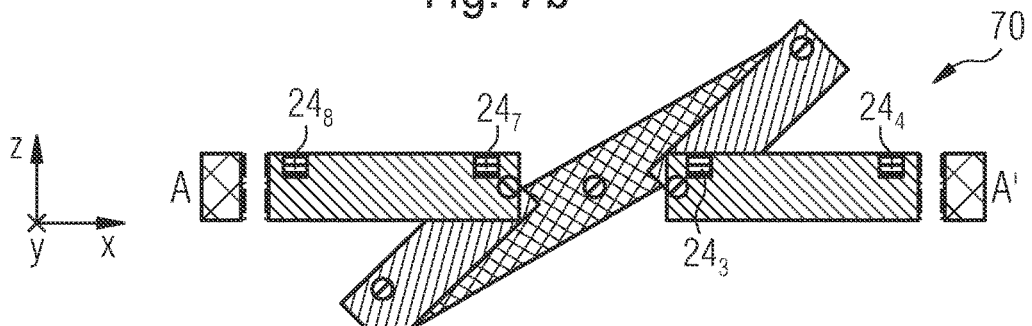

FIG. 7c shows a schematic lateral sectional view of the MMS 70 in a deflected state.

In other words, FIGS. 7a-7c show a variation in which only the flexure springs $24_i$ are locally thinned relative to the remaining structures, i.e. have a smaller layer thickness along the z direction, although alternative embodiments also provide for thicker structures, i.e. a larger dimension along the z direction.

Figure 8A:
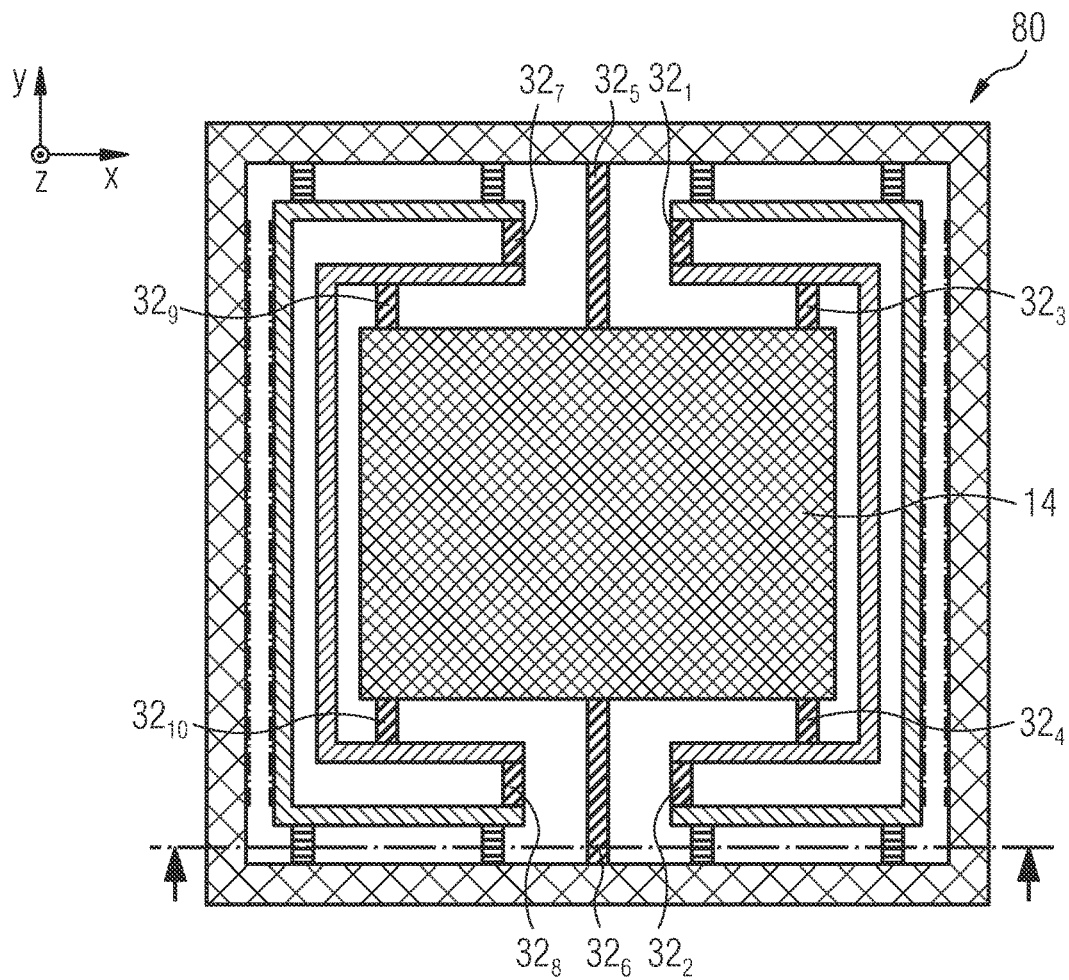
FIGS. 8*a-c* show schematic views of an MMS according to an embodiment in which torsion springs are thinned.

FIG. 8a shows a schematic top view of an MMS 80 in which, as an alternative to the MMS 70, the MMS 20 is modified such that the torsion springs $32_1$ to $32_{10}$ are thinned to a height $h_3$ which may possibly, but not necessarily, correspond to the height $h_2$. For example, while the height $h_1$ may be in a range of at least 1 μm and at most 500 μm, at least 20 μm and at most 300 μm, and at least 50 μm and at most 100 μm, for example 75 μm, the heights $h_2$ and/or $h_3$ may be, for example, 50%, 40%, 30% or even less thereof. It should be noted that the thinning of the flexure springs 24 and/or torsion springs 32 may cause a change in the reference plane with respect to their arrangement along the z direction, since a position of the neutral fiber of the respective elements may also be changed. For example, the torsion springs $32_5$ and $32_6$ may remain at the height $h_1$, but alternatively may also be thinned.

Figure 8B:
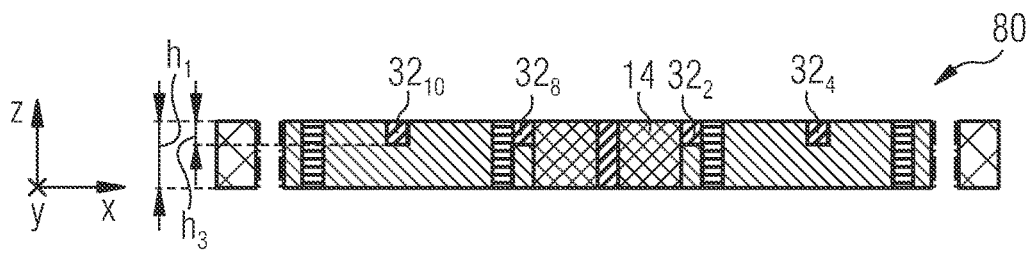
Figure 8C:
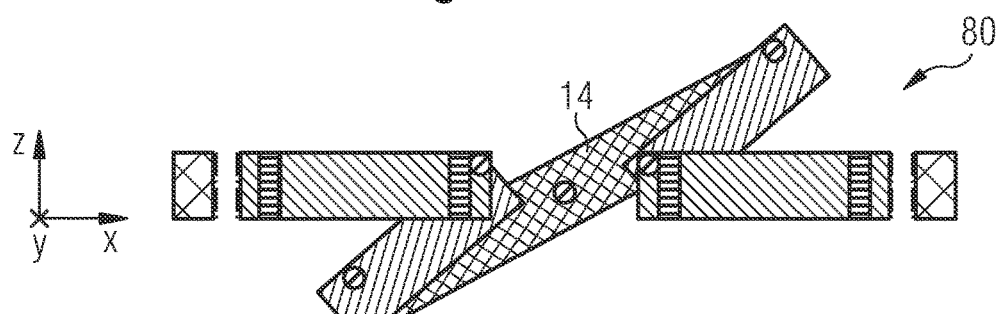

In other words, FIGS. 8a to 8c show a variation in which only the torsion springs $32_1$ to $32_4$ and $32_7$ to $32_{10}$ are locally thinned compared to the remaining structures.

Figure 9A:
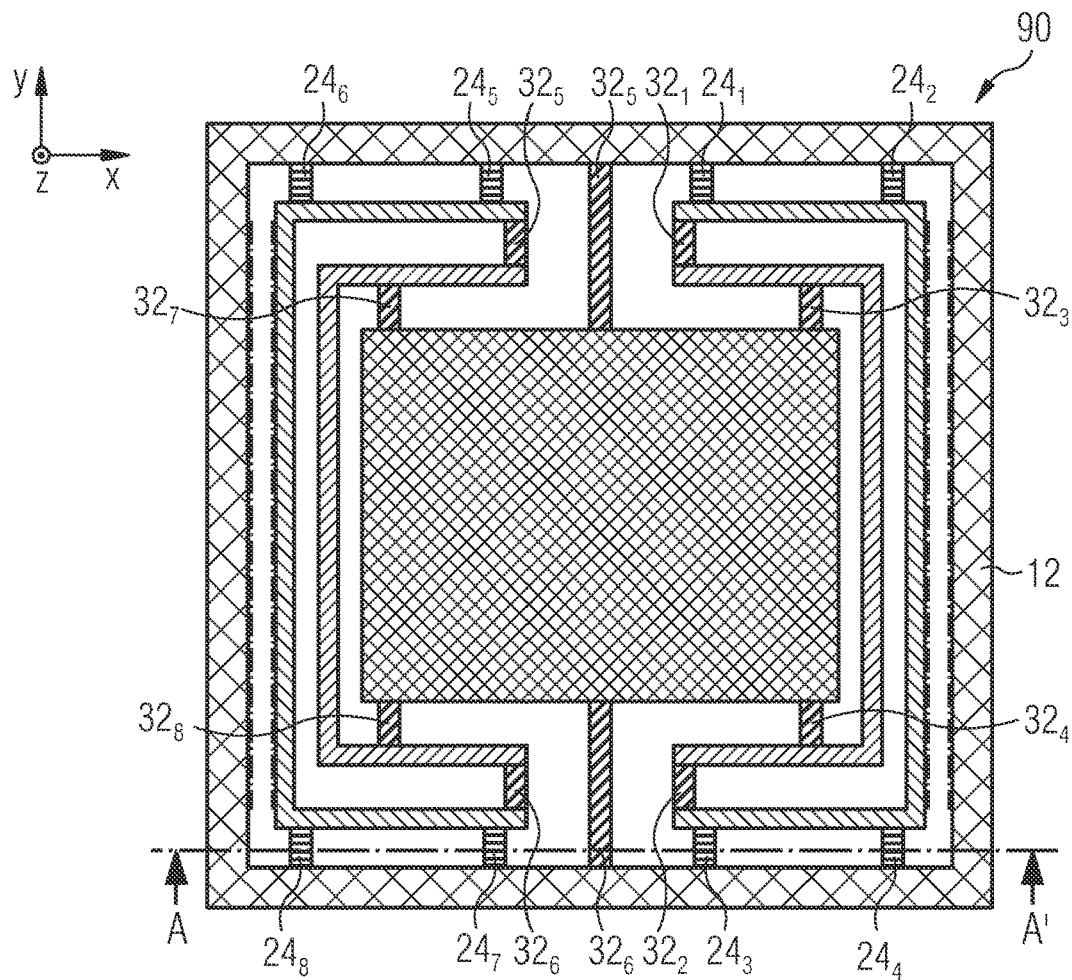
FIGS. 9*a-c* show schematic views of an MMS according to an embodiment in which leaf springs and torsion springs are thinned.

FIG. 9a shows a schematic top view of an MMS 90 according to an embodiment which corresponds to the MMS 20 in the top view shown. As it becomes clear in the schematic lateral sectional views of FIGS. 9b and 9c, which show the MMS 90 in a rest position and in a deflected position, respectively, the leaf springs $24_i$ and the torsion springs $32_1$ to $32_{10}$, for example, are thinned to the height $h_2$.

Figure 9B:
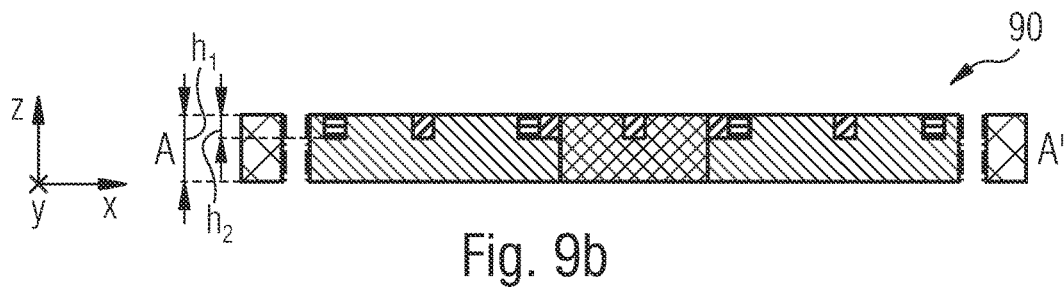
Figure 9C:
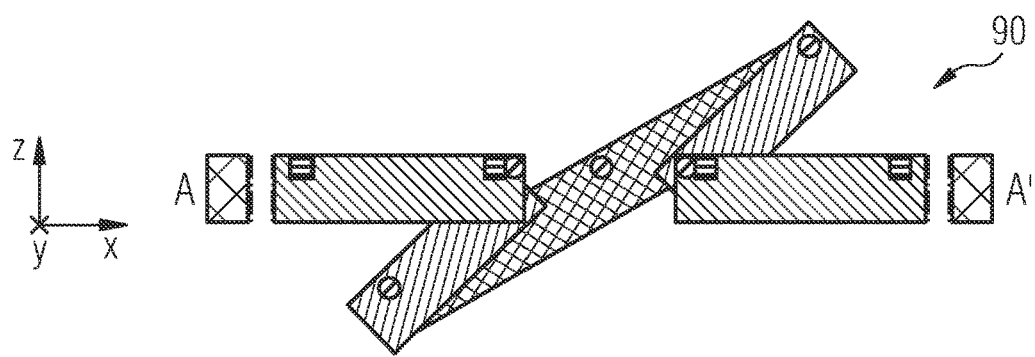

In other words, FIGS. 9a to 9c show a variation in which all springs, the leaf springs and the torsion springs, are locally thinned compared to the remaining structures. This means that the torsion spring elements can have a smaller dimension along the thickness direction z than the transmission sides 22a and 22b.

Figure 10A:
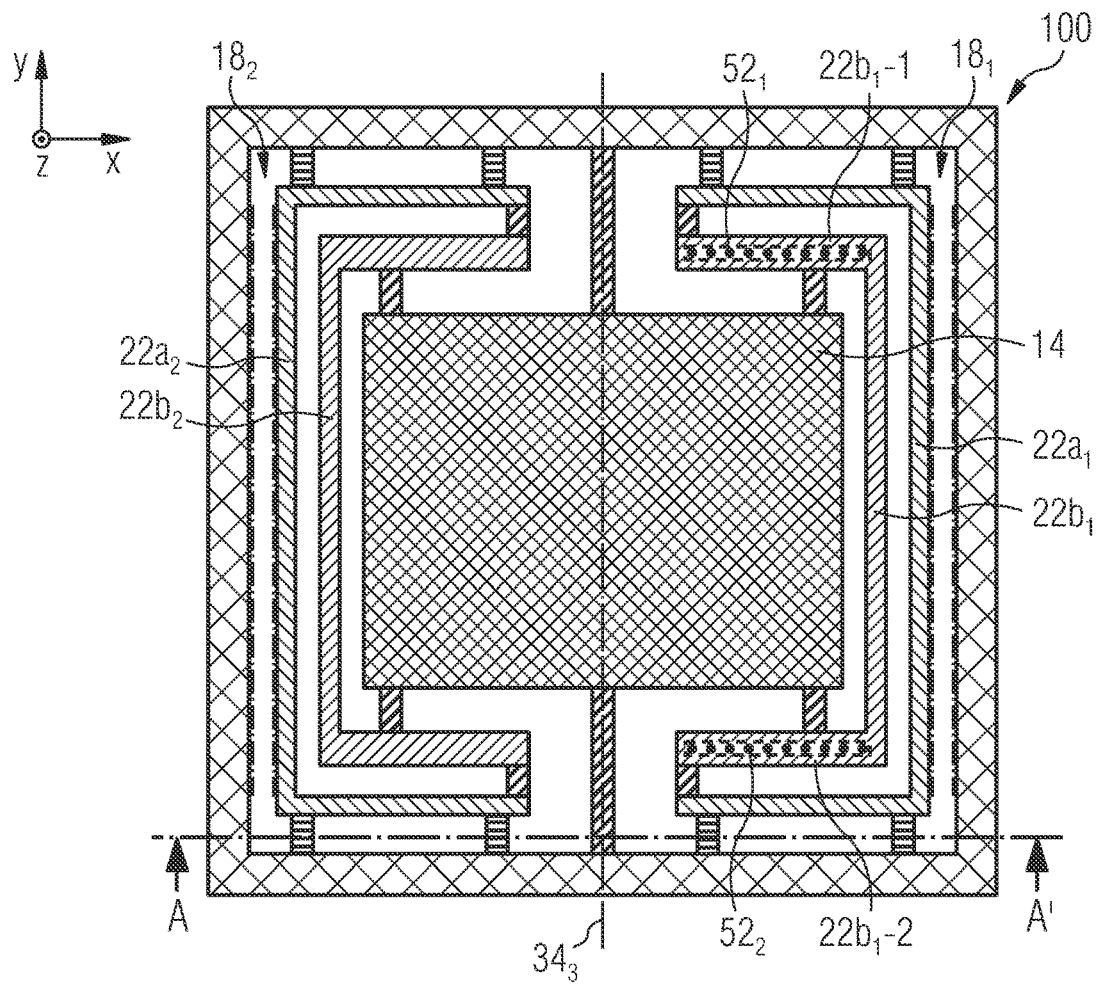
FIGS. 10*a-c* show schematic views of an MMS according to an embodiment in which at least one transmission side has a mechanical bias.

FIG. 10a shows a schematic top view of an MMS 100 according to an embodiment which is modified compared to the MMS 20. At least one transmission side $22a_1$, $22b_1$, $22a_2$ or $22b_2$ of a transmission may have a mechanical bias such that the movable element 14 is at least partially moved out of the reference plane 16 even in a rest position of the MMS 100 shown in a schematic lateral sectional view in FIG. 10b. This may mean that the movable element 14 is arranged in an inclined reference plane 16', which is inclined with respect to the reference plane 16. Although the mechanical bias can also be arranged asymmetrically in both transmission s, an asymmetric bias can be advantageous for tilting the movable element, especially if torsion of the movable element 14 is envisaged during subsequent operation of the movable element 14, for example about the torsion axis $34_3$. The reason for this is that when a vibration or oscillation is generated in the movable element when it is at rest, and the rest position has little or no difference from the theoretical rest position parallel to the reference plane 16, the phase of the vibration obtained may be affected by external influences such as a rest vibration or the like. In simplified terms, when the movable element is excited, there may be a high degree of inaccuracy as to whether the movable element deflects first to the left or first to the right, or whether one side or the other side of the movable element is deflected first along the positive z direction. This inaccuracy can be reduced by mechanical bias or by pre-deflecting the moving element.

To maintain the mechanical bias, bias elements $52_1$ and/or $52_2$ can be provided, for example, which are arranged at least regionally on a part of the transmission structure, for example the second transmission side 22b, for example in the segments $22b_1$-1 and/or $22b_1$-2. Alternatively or additionally, further mechanical bias elements can be arranged on a side of the transmission $18_2$ facing away from the viewer in FIG. 10a.

The biasing elements $52_1$ and/or $52_2$ may be mechanically fixed to the second transmission side 22b and configured to provide the mechanical bias based on a second thermal expansion coefficient of a material of the biasing element $52_1$ and/or $52_2$ being different from a first thermal expansion coefficient of the material of the second transmission side 22b. For this purpose, for example, a silicon oxide material or a silicon nitride material may be deposited on the transmission side 22b comprising, for example, a silicon material, at a processing temperature. Cooling of the entire structure may cause the materials of the mechanical bias element 52 and the transmission side 22b to deform or contract differently, thereby inducing mechanical bias. Layer stress can be induced, for example, by silicon oxide ($SiO_2$) or silicon nitride (S3N4) but also by metals, for example, copper or aluminum. Advantageously, materials that have CMOS compatibility are used to create the bias elements, which can also be referred to as stressors.

Figure 10B:
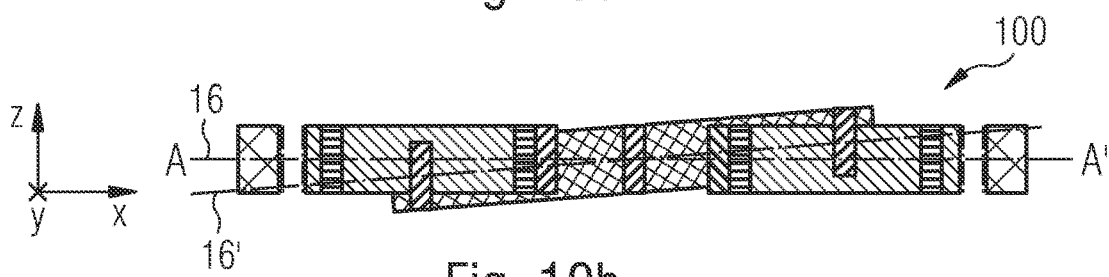
Figure 10C:
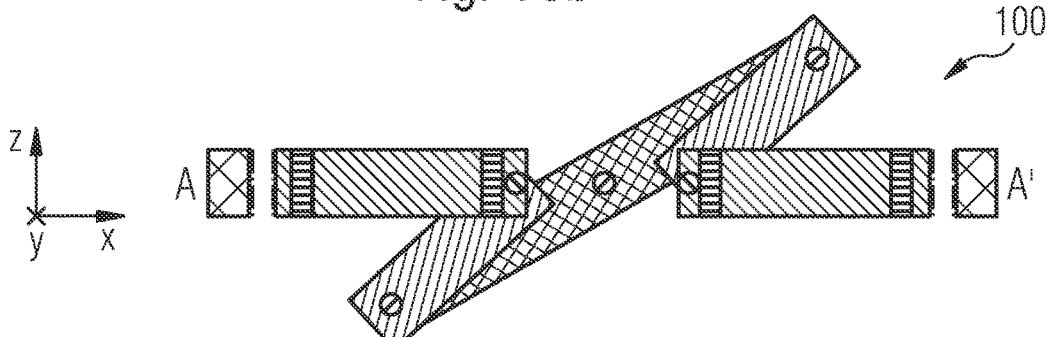

FIG. 10c shows a schematic lateral sectional view of the MMS 100 in a deflected state and along the section line A-A'.

In other words, FIGS. 10a to 10c show a variation with mechanical biasing elements that cause a slight asymmetric pre-deflection in the rest position to allow deflection without prior resonant oscillation build-up.

Figure 11A:
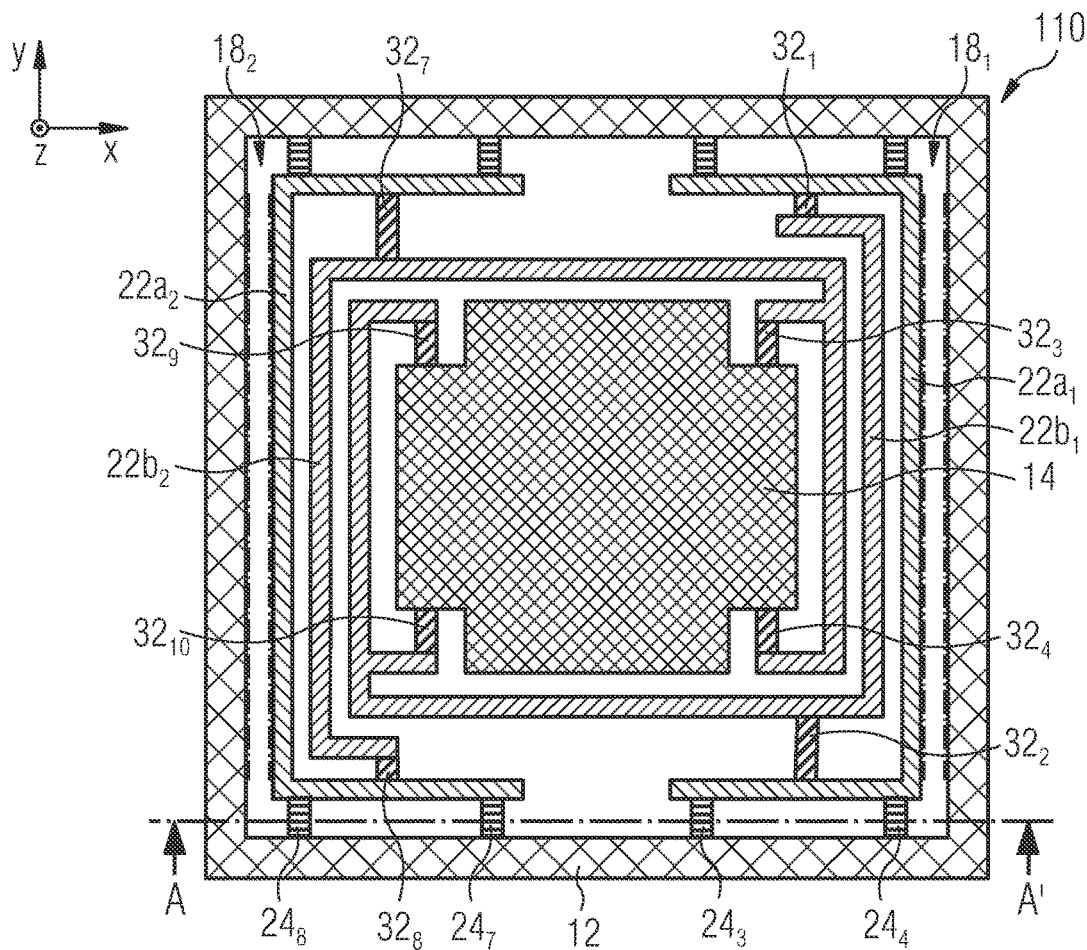
FIGS. 11*a-c* show schematic views of an MMS according to an embodiment without central torsion springs.

FIG. 11a shows a schematic top view of an MMS 110 according to an embodiment, which may be formed, for example, in the absence of the torsion springs $34_5$ and $34_6$. Regardless of this, tilting of the movable element 14 may be obtained by controlling the actuators $18_1$ and/or $18_2$ at a frequency corresponding to a tilting mode. Alternatively or additionally, a translational deflection of the movable element 14 in the positive or negative z direction may be obtained by controlling the movable element 14 at a frequency corresponding to the resonant frequency of a translational mode.

Similar to the MMS 10 and/or the MMS 40, the actuators $18_1$ and $18_2$ may be configured to generate a compressive force on the respective first transmission side $22a_1$ and $22a_2$. However, compared to the embodiments described so far, the second transmission sides $22b_1$, $22b_2$ may be configured to be formed as beam structures which enclose the movable element by at least 270°. This allows the respective transmission excitation to be introduced at the opposite side of the movable element compared to the side at which the actuator $18_1$ or $18_2$ is arranged.

Figure 11B:
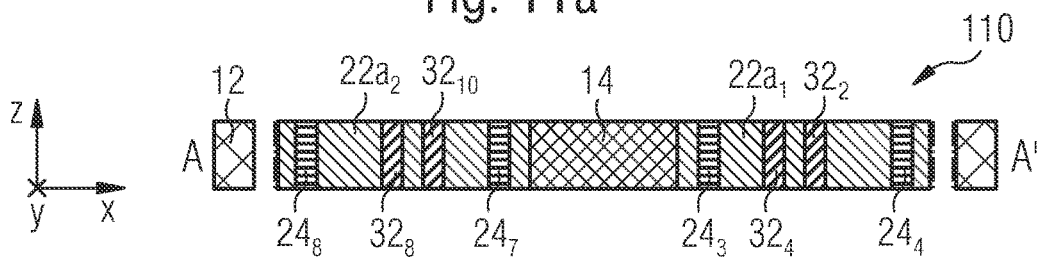

FIG. 11b shows a schematic lateral sectional view of the MMS 110 in a rest position thereof.

Figure 11C:
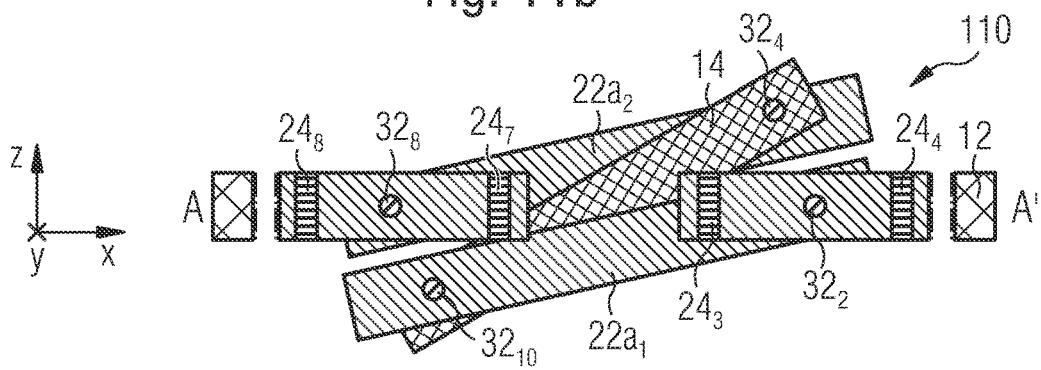

FIG. 11c shows a schematic lateral sectional view of the MMS 110 in a deflected state thereof.

In other words, FIGS. 11a to 11c show a variation without torsion springs 32₅ and 32₆, in which the forces act on the opposite side of the element 14.

Figure 12A:
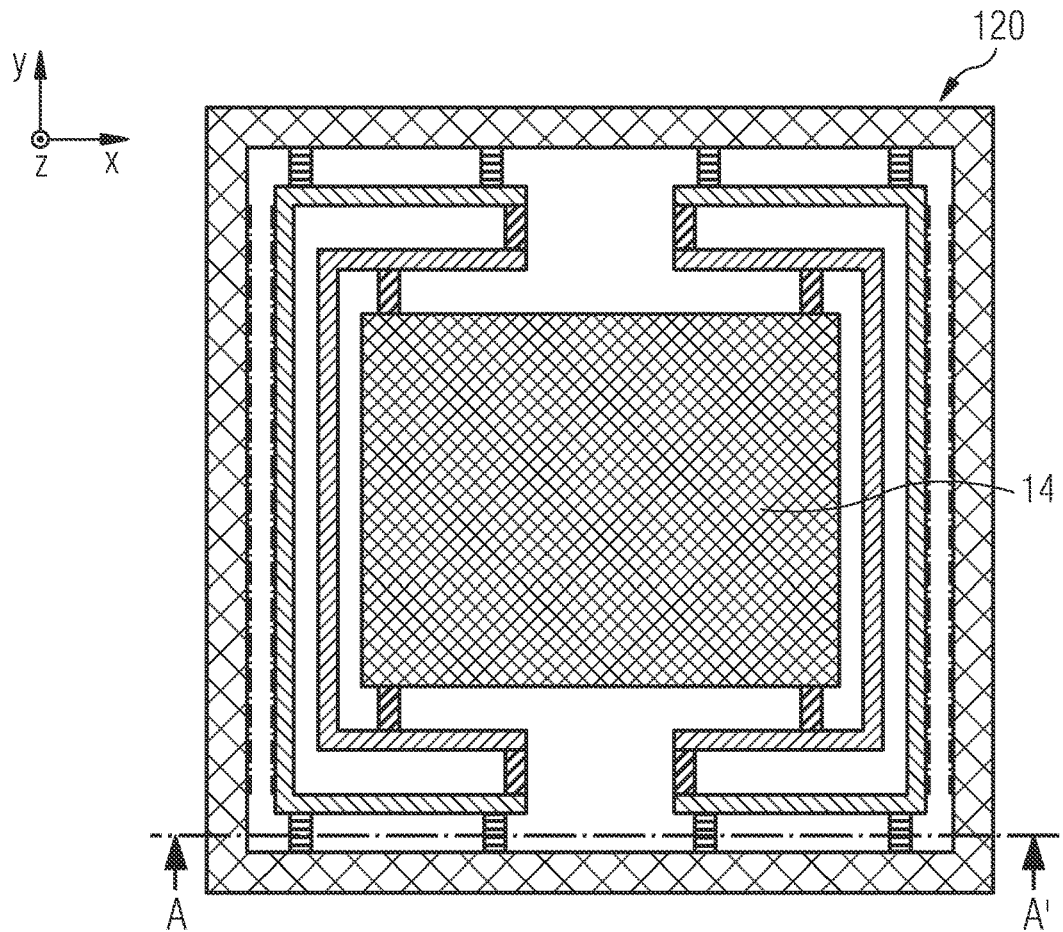
FIGS. 12*a-c* show schematic views of an MMS according to an embodiment which may correspond to a modified variation of the MMS of FIGS. 2*a-c* where the central torsion springs are missing, for example.

FIG. 12a shows a schematic top view of an MMS 120 according to an embodiment, which may correspond to that of a modified version of the MMS 20, for example by removing the torsion springs 32₅ and 32₆.

Apart from this, the MMS 120 may correspond to the MMS 20. An implementation of the MMS 120 without torsion springs makes it possible both to excite a mode for rotational deflection of the movable element 14 from the rest position shown in FIG. 12b, as is illustrated in FIG. 12c, and also makes it possible to obtain translational deflection of the movable element 14 by excitation of a mode different therefrom. At the same time, however, this is accompanied by the requirement to precisely separate the corresponding control frequencies from each other in order to excite only one of the two movements, if desired. By arranging the torsion springs 32₅ and 32₆, the translational deflection can be suppressed so that simple control can be obtained.

Figure 13A:
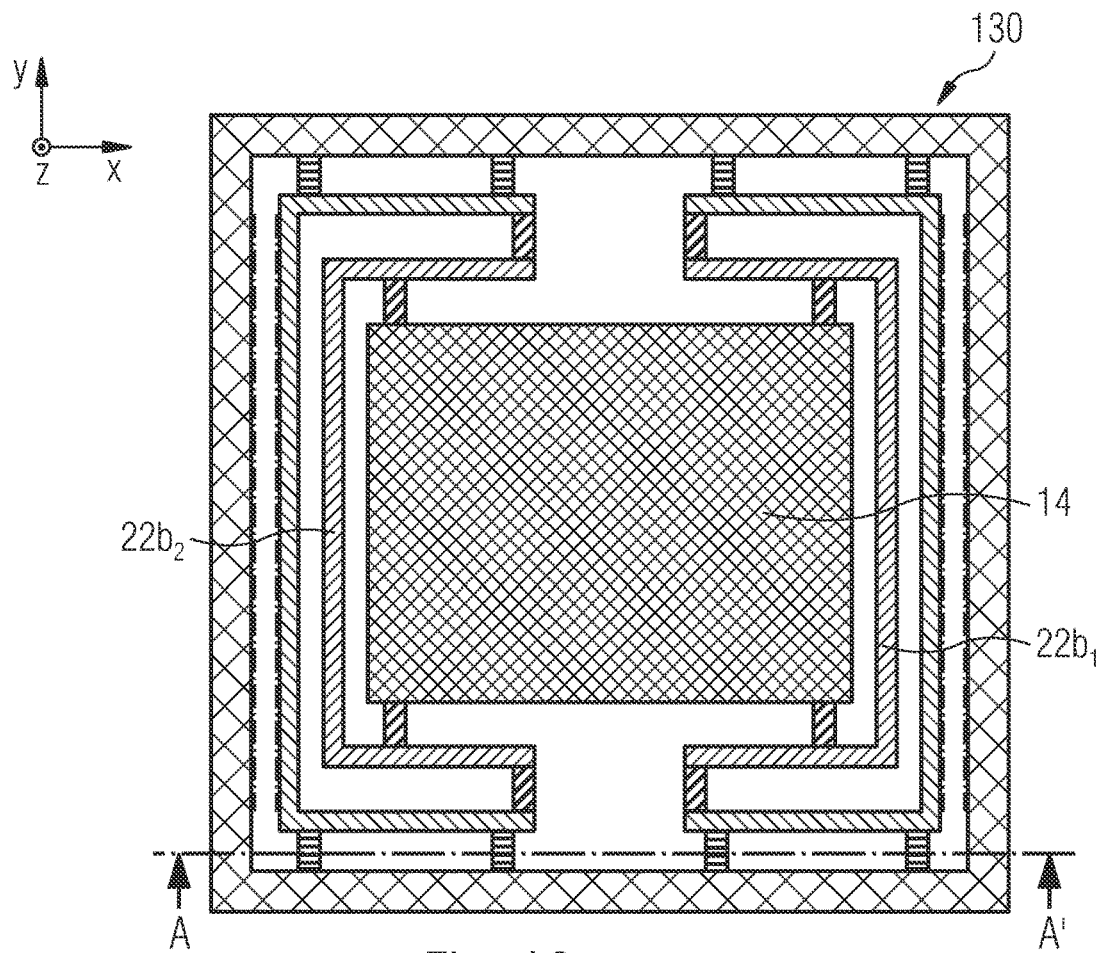
FIGS. 13*a-c* show schematic views of the MMS in FIGS. 12*a-c* when exciting the same at a frequency which allows translational deflection of the movable element along the positive and/or negative z direction, according to an embodiment.

FIG. 13a shows a schematic top view of the MMS 120 of FIG. 12a such that FIGS. 13a and 12a are similar.

Figure 12B:
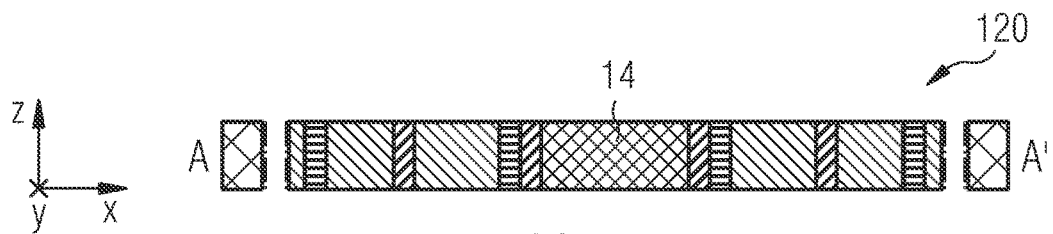
Figure 12C:
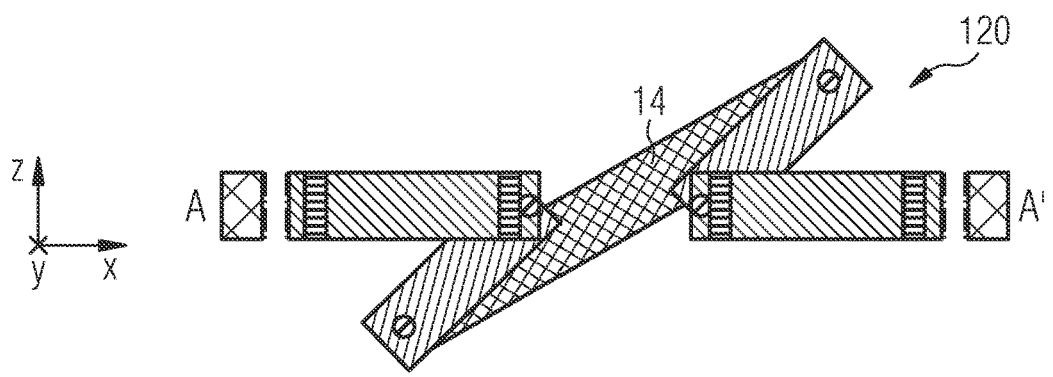
Figure 13B:
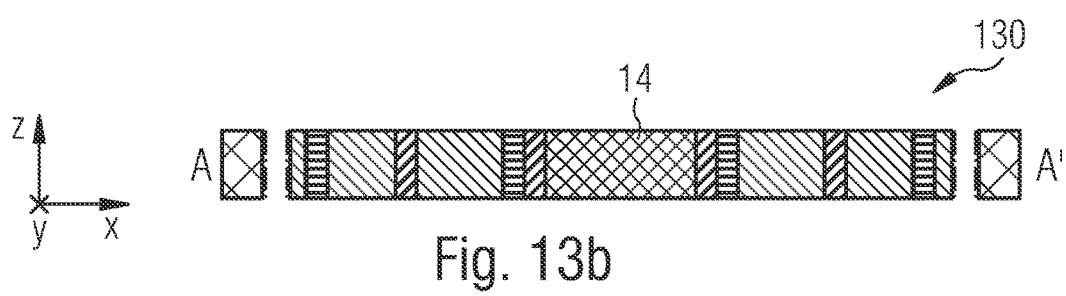

FIG. 13b shows a schematic lateral sectional view of the MMS 120, as also shown in FIG. 12b.

Figure 13C:
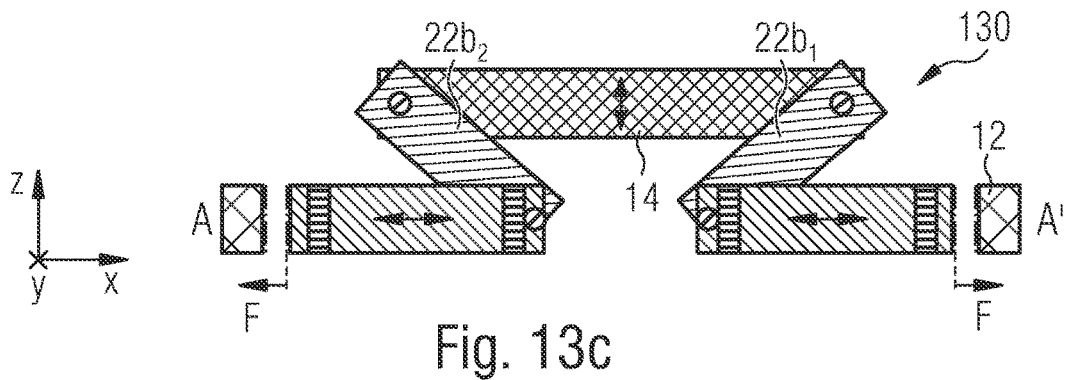

FIG. 13c shows a schematic lateral sectional view of the MMS 120 when the same is excited at a frequency that allows translational deflection of the movable element along the positive and/or negative z direction. Compared with FIG. 12c, the second transmission sides 22b₁ and 22b₂ can be deflected in phase, whereas in FIG. 12c an opposite-phase deflection results in tilting of the movable element 14.

In other words, the structure of FIGS. 12a-12c can also be operated in translation mode, which is shown in FIGS. 13a-c, using a different vibration mode.

Figure 14A:
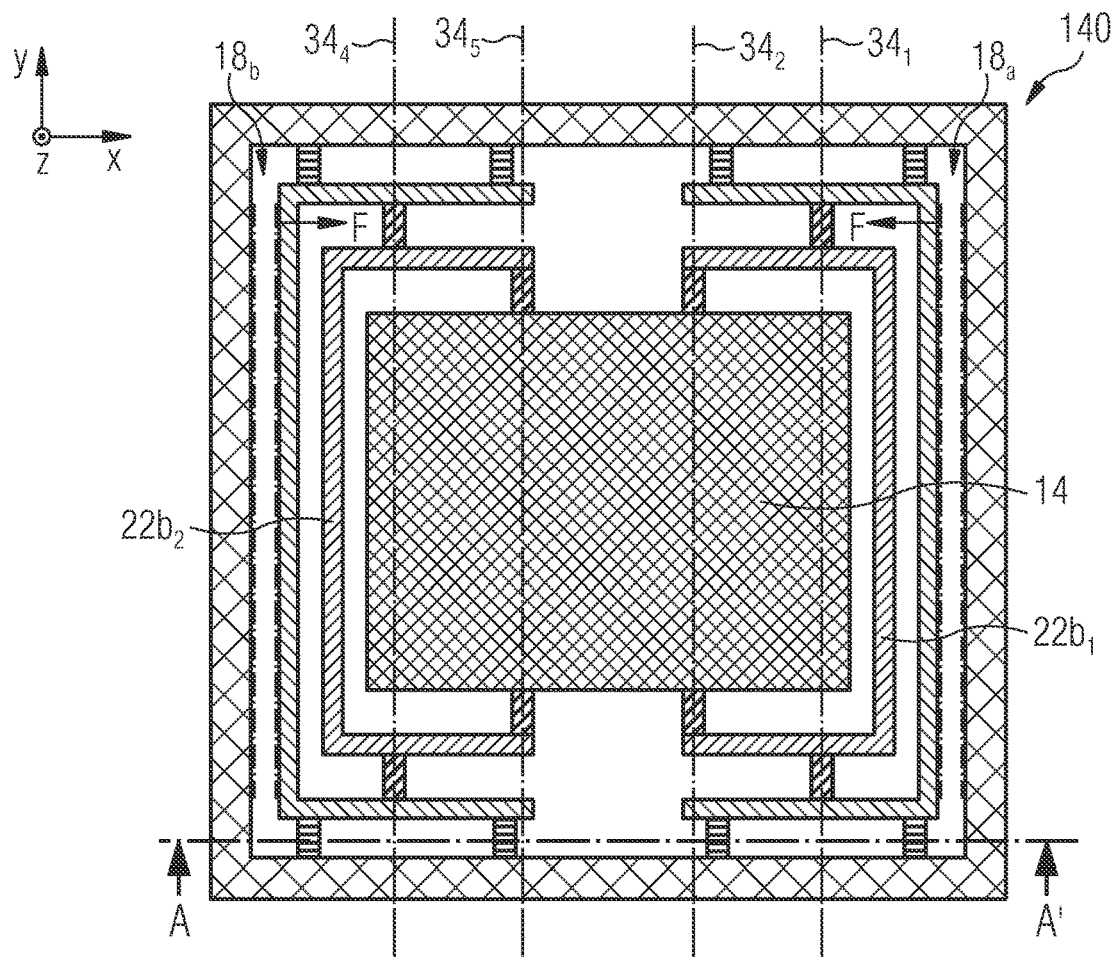
FIGS. 14*a-c* show schematic views of an MMS according to an embodiment which, compared to the MMS of FIGS. 12*a-c*, has an interchanged arrangement of the torsion axes.

FIG. 14a shows a schematic top view of an MMS 140 which has an interchanged arrangement of torsional axes 34₁ and 34₂ and 34₄ and 34₅ compared to the MMS 120 so that compression force-based actuators 18a and 18b can be used.

Figure 14B:
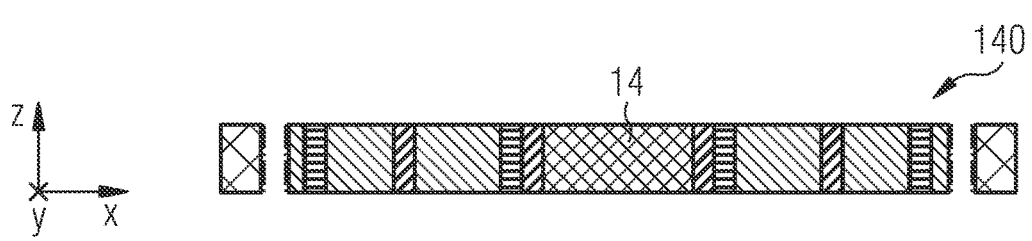

FIG. 14b shows a schematic lateral sectional view of the MMS 140 in a rest position thereof.

Figure 14C:
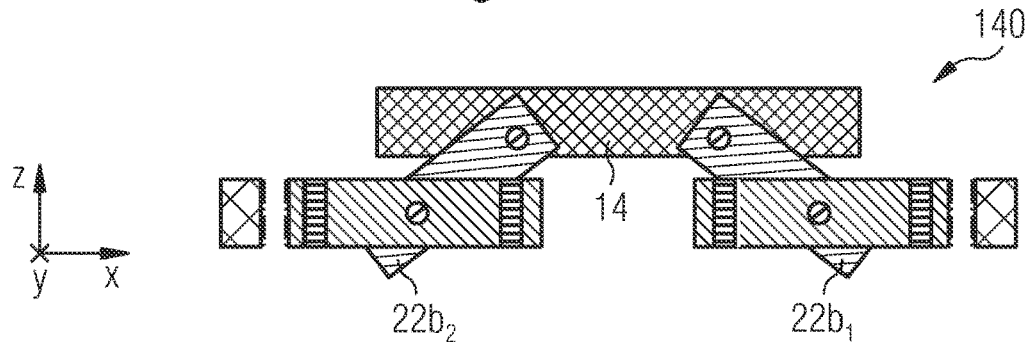

FIG. 14c shows a schematic lateral sectional view of the MMS 140 in a deflected state, where the movable element 14 is moved translationally along the positive z axis.

In other words, FIGS. 14a-14c show the structure of FIGS. 13a-13c with interchanged torsion axes 34.

Figure 15:
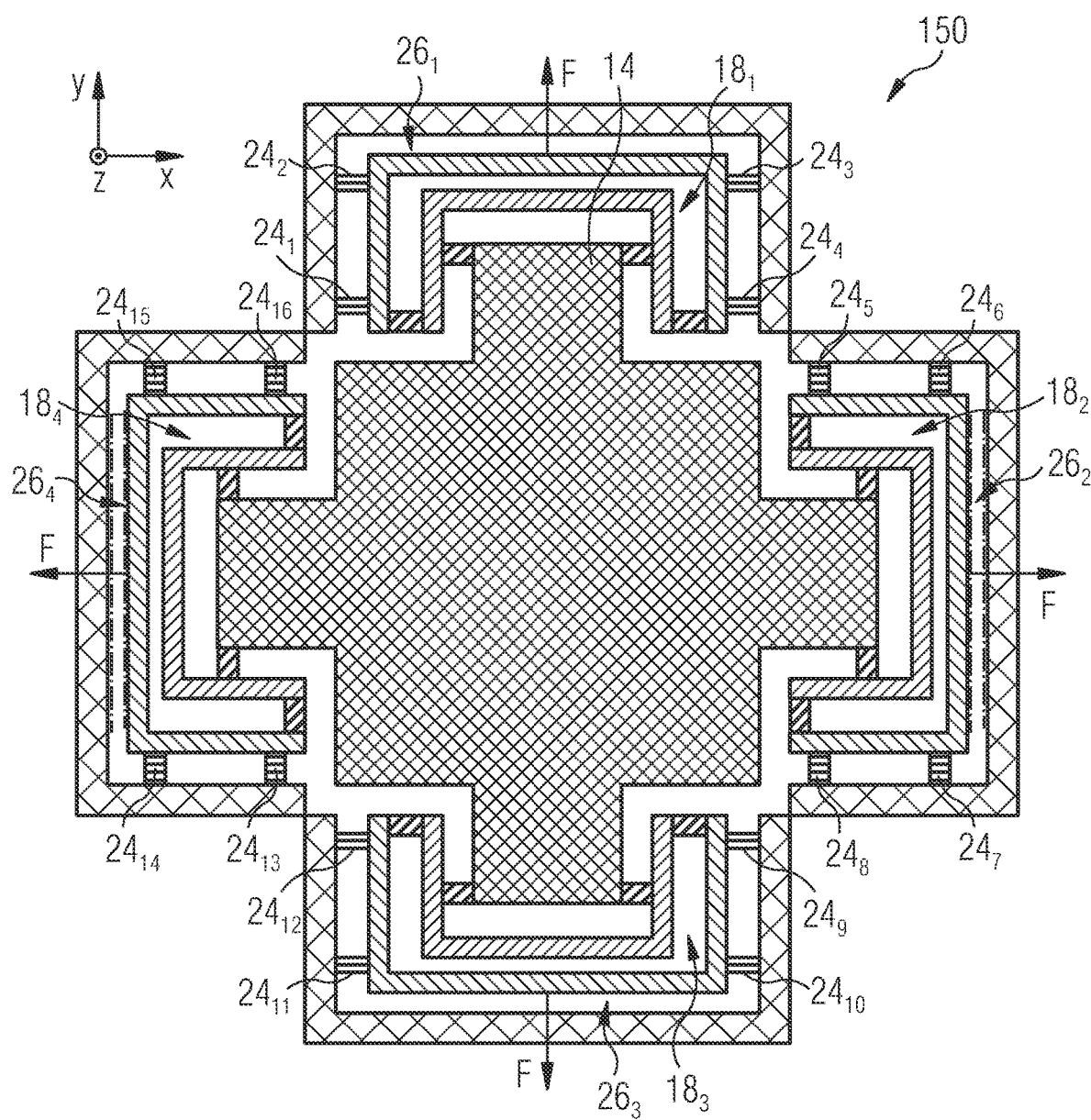
FIG. 15 shows the structure of FIGS. 13*a*-14*c* with fourfold suspension according to an embodiment.

FIG. 15 shows a schematic top view of an MMS 150 according to an embodiment in which a transmission structure 18 and an actuator 26 are arranged on four sides, wherein two respective transmission structures and actuators 18₁/26₁ and 18₃/26₃ or 18₂/26₂ and 18₄/26₄ can be arranged opposite each other. That means that an opposing arrangement, as shown for example in FIGS. 14a to 14c, can be re-implemented to be mirrored by 90°. The advantage of a triple, quadruple or higher-value arrangement is good mode separation, i.e. the resonant frequencies of different modes have a high spacing from one another.

The quadruple suspension allows at least partially avoiding rotational motion of the movable element 14 and translational motion well separated from rotations. If the movable element were controlled to provide translation thereof along the positive or negative z direction, a higher number of transmission structures 18 and/or actuators 26 could provide motion with a large force, stroke or travel, and/or high uniformity of motion.

In other words, FIG. 15 shows the structure of FIGS. 13a-14c with quadruple suspension. It is noted that a different number of suspensions (transmission s) and/or actuators may be used, for example 1, 2, 3, 5 or more.

Figure 16:
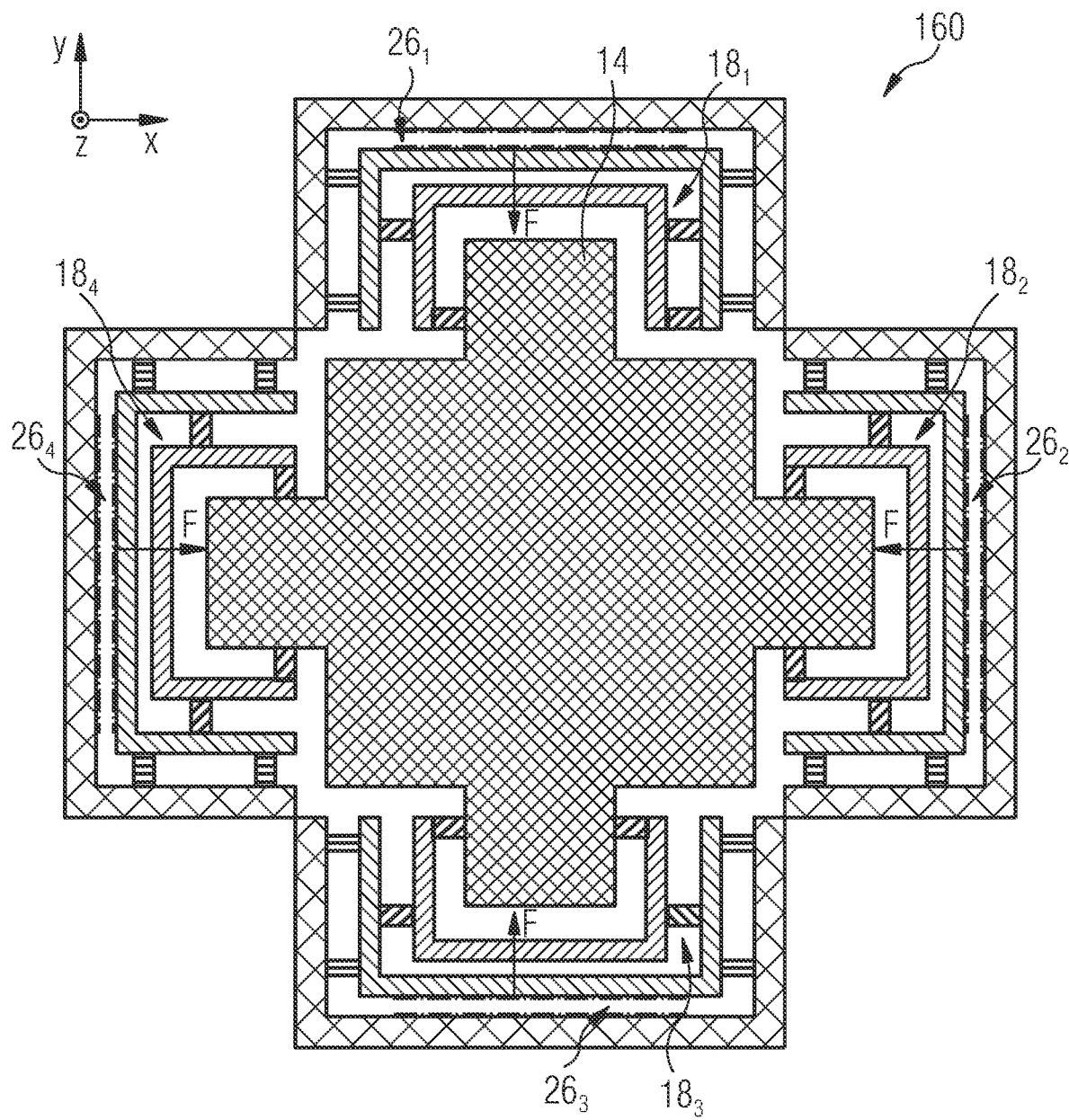
FIG. 16 shows the structure of FIGS. 14*a*-14*c* with fourfold suspension according to an embodiment.

FIG. 16 shows a schematic top view of an MMS 160, which may be based on the MMS 140 and also has an exemplary quadruple suspension. Unlike the MMS 150, the actuators 26₁ to 26₄ may be configured to generate a compressive force. Although the MMS 150 is described as having the four actuators configured to generate a tensile force and the MMS 160 is described as having the four actuators configured to generate a compressive force, it is noted that hybrid forms may also exist.

In other words, FIG. 16 shows the structure of FIGS. 14a-14c with quadruple suspension, although triple or multiple suspension is also possible.

Figure 17A:
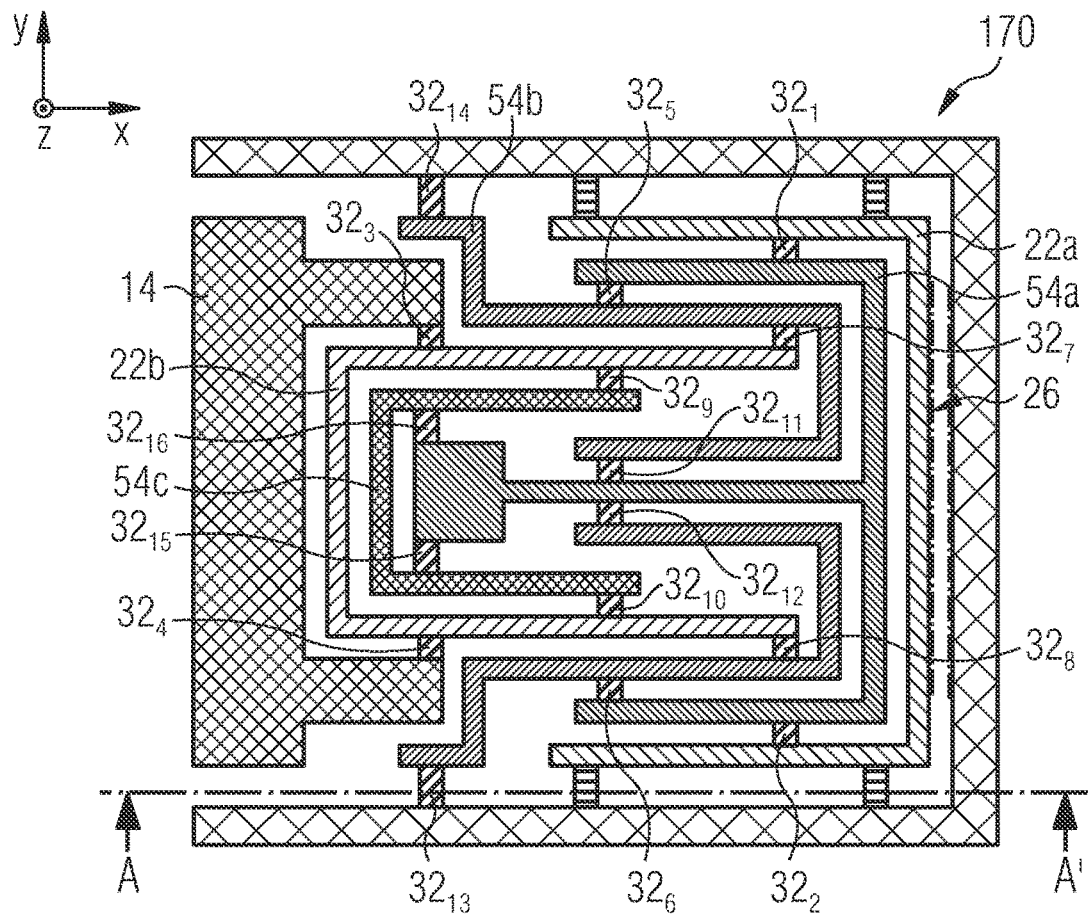
FIGS. 17*a-b* show schematic views of an MMS according to an embodiment in which further beam elements are coupled between the first transmission side and a second transmission side so that, all in all, a pantograph structure is coupled.

FIG. 17a shows a schematic top view of a section of an MMS 170 in which additional beam elements 54a-54c are coupled between the first transmission side 22a and a second transmission side 22b such that, all in all, a pantograph structure is coupled, i.e. a lever structure or mechanism configured to increase a stroke of the transmission.

Figure 17B:
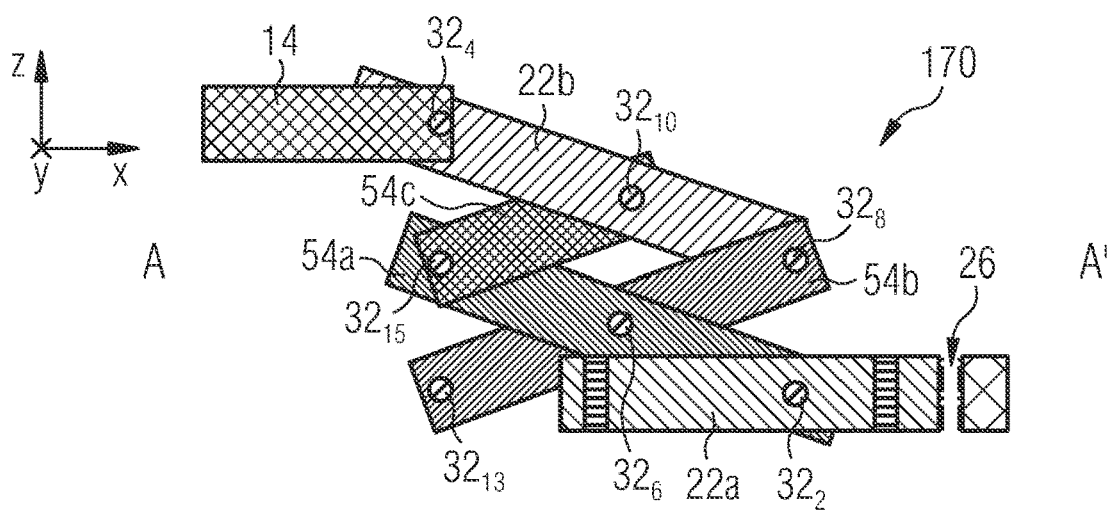

FIG. 17b shows a schematic lateral sectional view of the MMS 170 in a deflected state, wherein the deflected state is characterized by a translational displacement of the movable element 14 along the positive z direction. It is understood that, compared to a second suspension, an advantageous quadruple or multiple suspension increases the stability of the system. The overall structure comprising the first transmission side 22a, the second transmission side 22b and the beam structures 54a, 54b and 54c arranged therebetween may be formed as a multi-stage scissor gear mechanism.

Although the lever mechanism in FIG. 17a includes three beam structures 54a, 54b, and 54c, any other lever structures can be implemented that have an equal or different number of beam structures supported at appropriate locations on the substrate, the first transmission side 22a, the second transmission side 22b, or against each other.

Figure 18A:
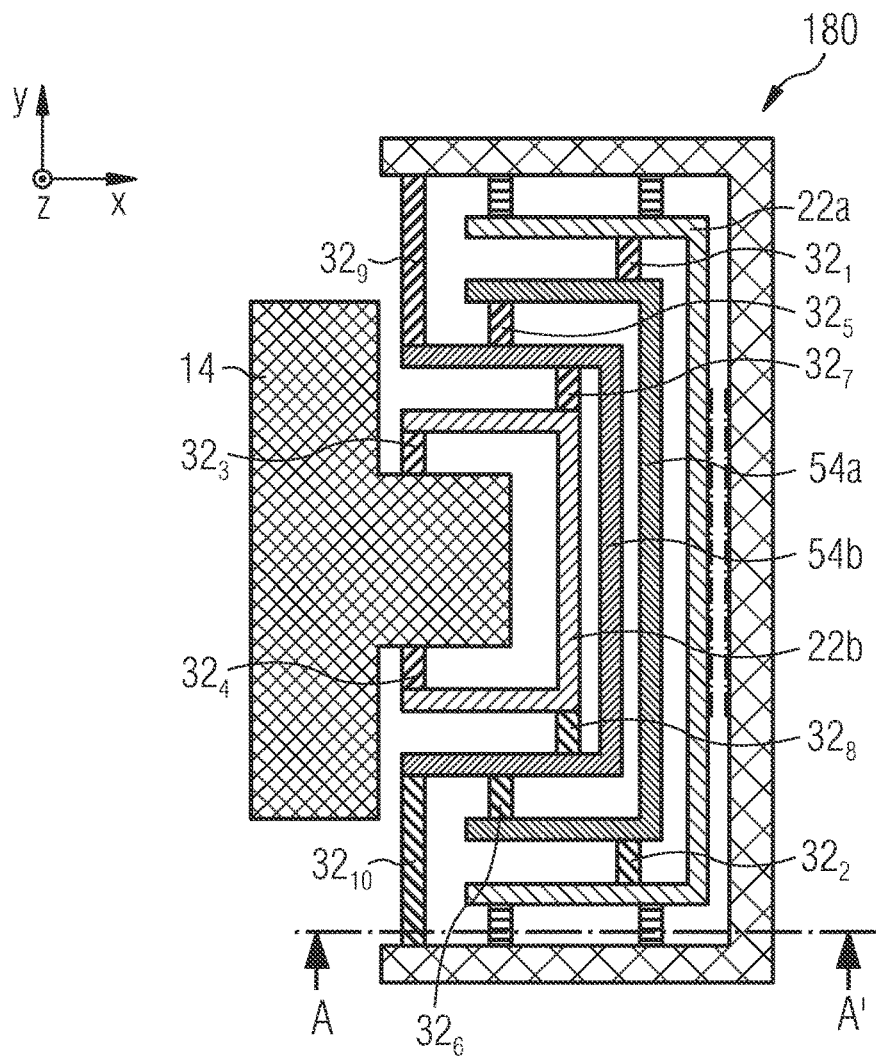
FIGS. 18a-b show schematic views of an MMS according to an embodiment in which beam structures are arranged between the first transmission side and the second transmission side, which act as pantograph springs.

FIG. 18a shows a schematic top view of an MMS 180 in which beam structures 54a and 54b are arranged between the first transmission side 22a and the second transmission side 22b to act as pantograph springs, which also allows the stroke of the transmission to be increased.

Figure 18B:
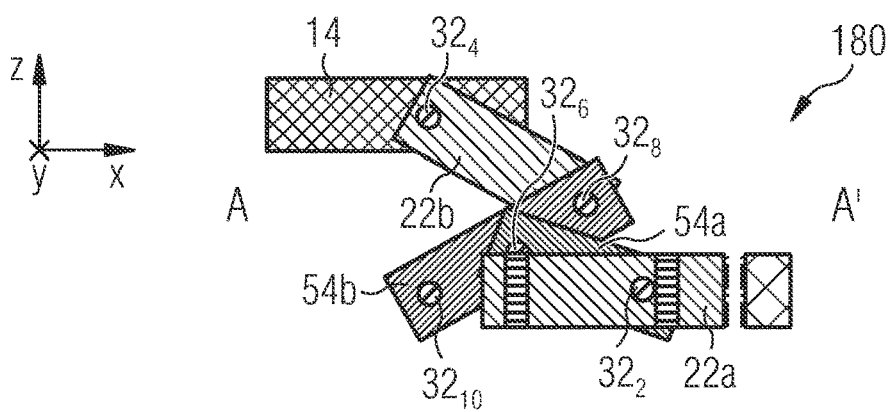

FIG. 18b shows a schematic lateral sectional view of the MMS 180 in a deflected state of the movable element 14, although again the exemplary representation selected to be a translational displacement of the movable element 14 may be influenced by deflection or actuation of other suspensions.

In other words, FIGS. 17a-b and 18a-b show two further variations of the suspensions of a translationally operated structure shown in FIGS. 13a-c and 14a-c.

Figure 19A:
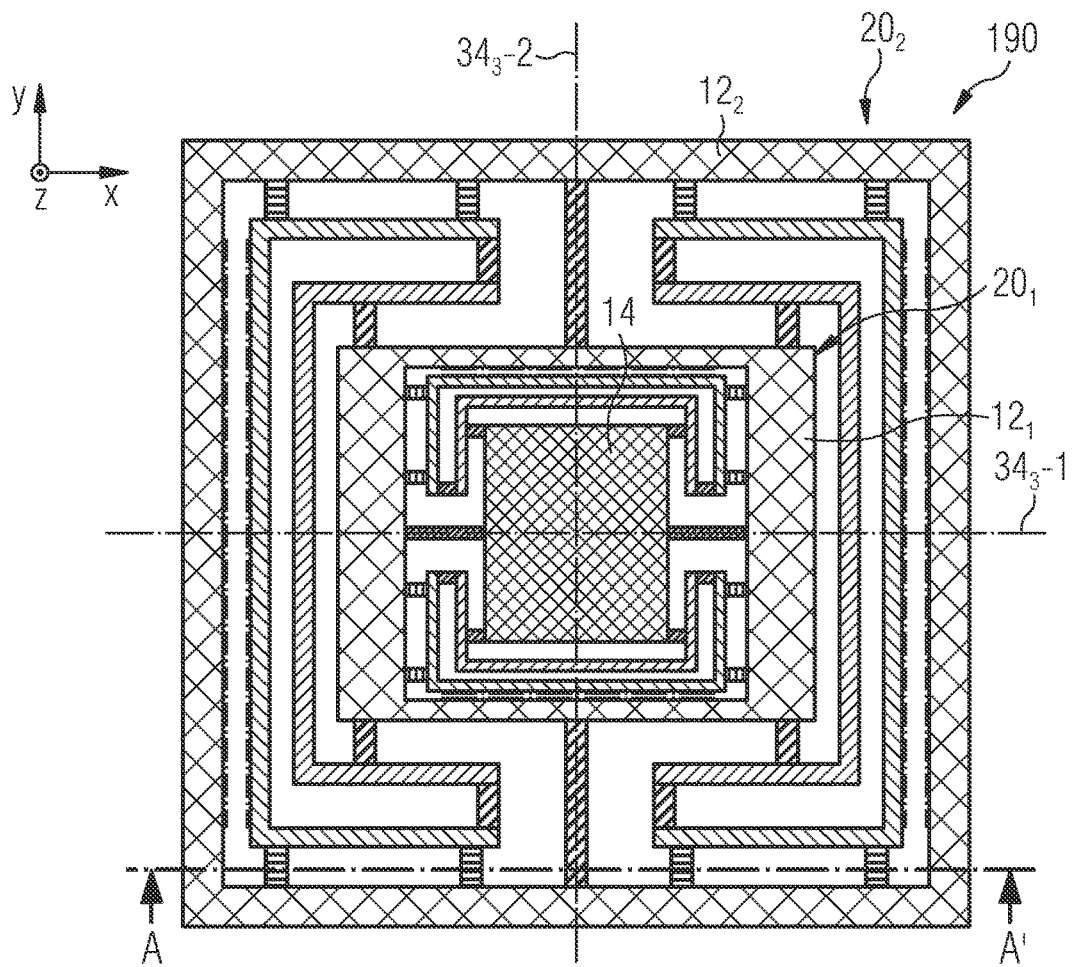
FIGS. 19a-c show schematic views of a micromechanical system according to an embodiment in which the MMS of FIGS. 2a-c is arranged orthogonally as a movable element of the MMS of FIGS. 2a-c.

FIG. 19a shows a schematic top view of a micromechanical system 190 according to an embodiment in which a micromechanical structure according to embodiments described herein, for example an MMS 20₁ that may correspond to the MMS 20, is arranged as a movable element of another MMS 20₂ that may also correspond to the MMS 20₂, for example. An arrangement of the torsion axes 34₃-1 and 34₃-2 of the inner MMS 20₁ suspended as a movable element and of the outer MMS 20₂ can be the same in this case, but can also, as shown, be offset from one another by an angle of, for example, 90° so that, via tilting of the movable element 14 of the MMS 20₁, tilting thereof along a first dimension, for example about the x axis can be obtained and, via tilting of the MMS 20₁ about a second axis, for example the y axis, a second dimension of the tilting of the movable element 14 can be obtained.

Figure 19B:
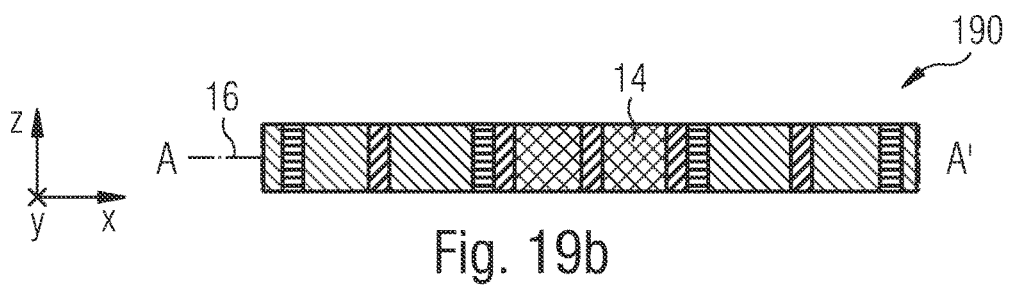

FIG. 19b shows a schematic lateral sectional view of the micromechanical system 190 in a rest position thereof, where all elements are disposed within the plane 16.

Figure 19C:
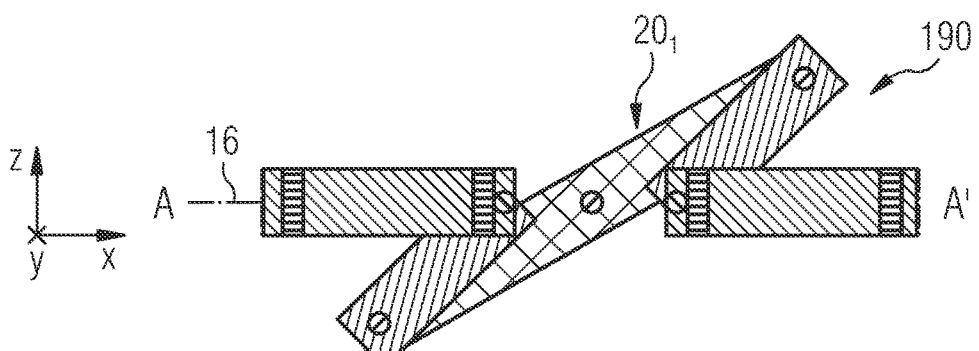

FIG. 19c shows a schematic lateral sectional view of the micromechanical system 190 in a deflected state of the MMS $20_1$ relative to the MMS $20_2$.

In other words, FIGS. 19a-c show the structure of FIGS. 2a-2c in a 2D variation in which the deflection can be orthogonal to each other.

Figure 20A:
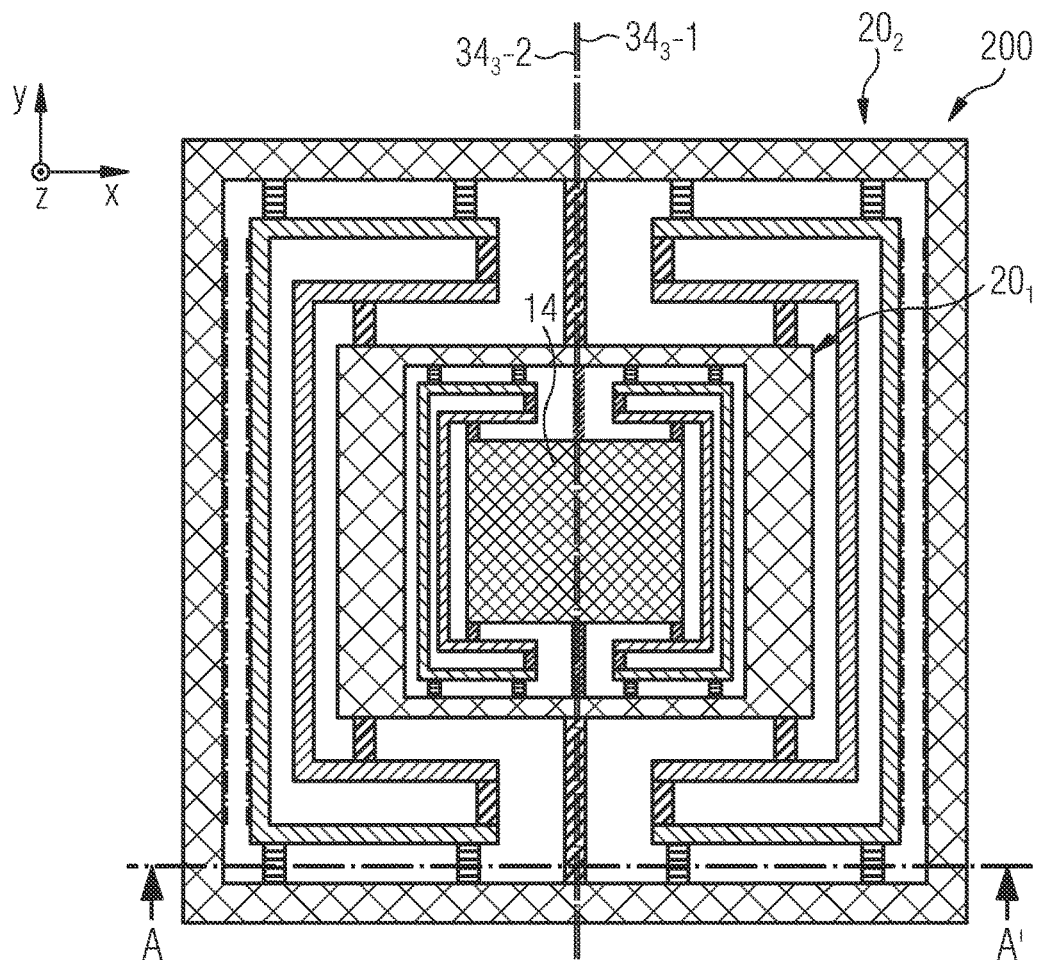
FIGS. 20a-c show schematic views of a micromechanical system according to a further embodiment in which the MMS of FIGS. 2a-c is arranged coaxially as a movable element of the MMS of FIGS. 2a-c.

FIG. 20a shows a schematic top view of a micromechanical system 200 according to an embodiment which also comprises the MMS $20_1$ suspended as a movable element of the MMS $20_2$. However, the torsional axes $34_3$-1 and $34_3$-2 may be parallel and even congruent, allowing an increase in the deflection angles of the movable element 14 of the MMS $20_1$, since the movable element 1 may be deflected as part of the MMS $20_1$ in the MMS $20_2$ and may additionally be deflected within the MMS $20_1$. Further, the different MMSs may have different resonant frequencies such that they can be operated at different frequencies and may have different operating points.

Figure 20B:
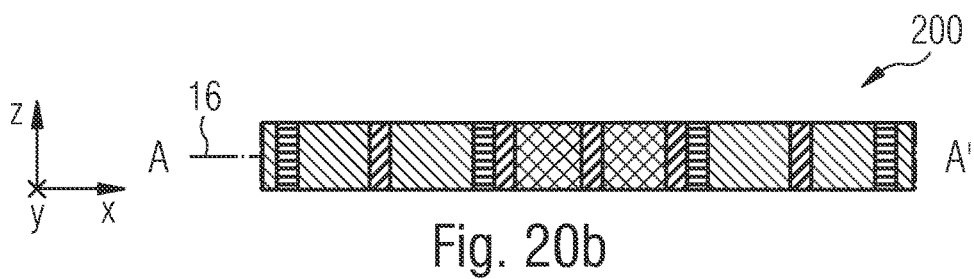

FIG. 20b shows a schematic lateral sectional view of the micromechanical system 200 in a rest position thereof, where all elements are disposed within the plane 16.

Figure 20C:
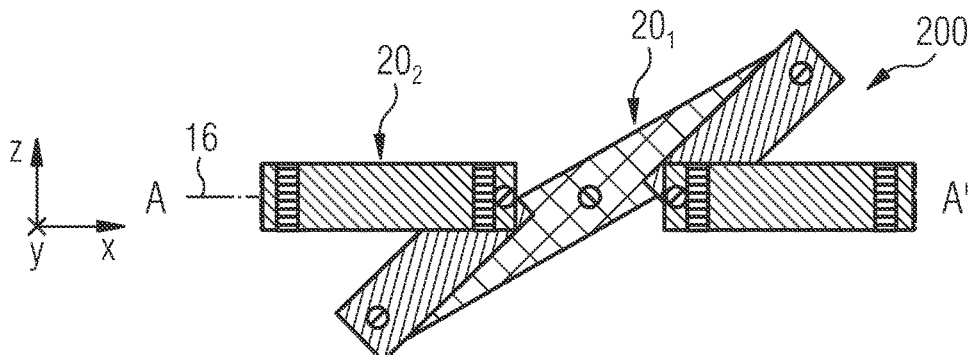

FIG. 20c shows a schematic lateral sectional view of the micromechanical system 200 in a deflected state of the MMS $20_1$ relative to the MMS $20_2$.

In other words, FIGS. 20a-20c show the structure of FIGS. 2a-2c in a 2D variation in which the deflection is coaxial.

Although the micromechanical systems 190 and 200 are described as having the MMS $20_1$ arranged as both an inner MMS and on an outer MMS, any combination of MMSs according to embodiments described herein are possible, wherein each MMS can be used as an inner MMS and each MMS can be used as an outer MMS. Although micromechanical structures 190 and 200 are described such that two MMSs are arranged and form a mutual interleaving, any other number of MMSs may be arranged in micromechanical systems, such as more than 2, more than 3, more than 4, or more than 5, or even a higher number.

Figure 21A:
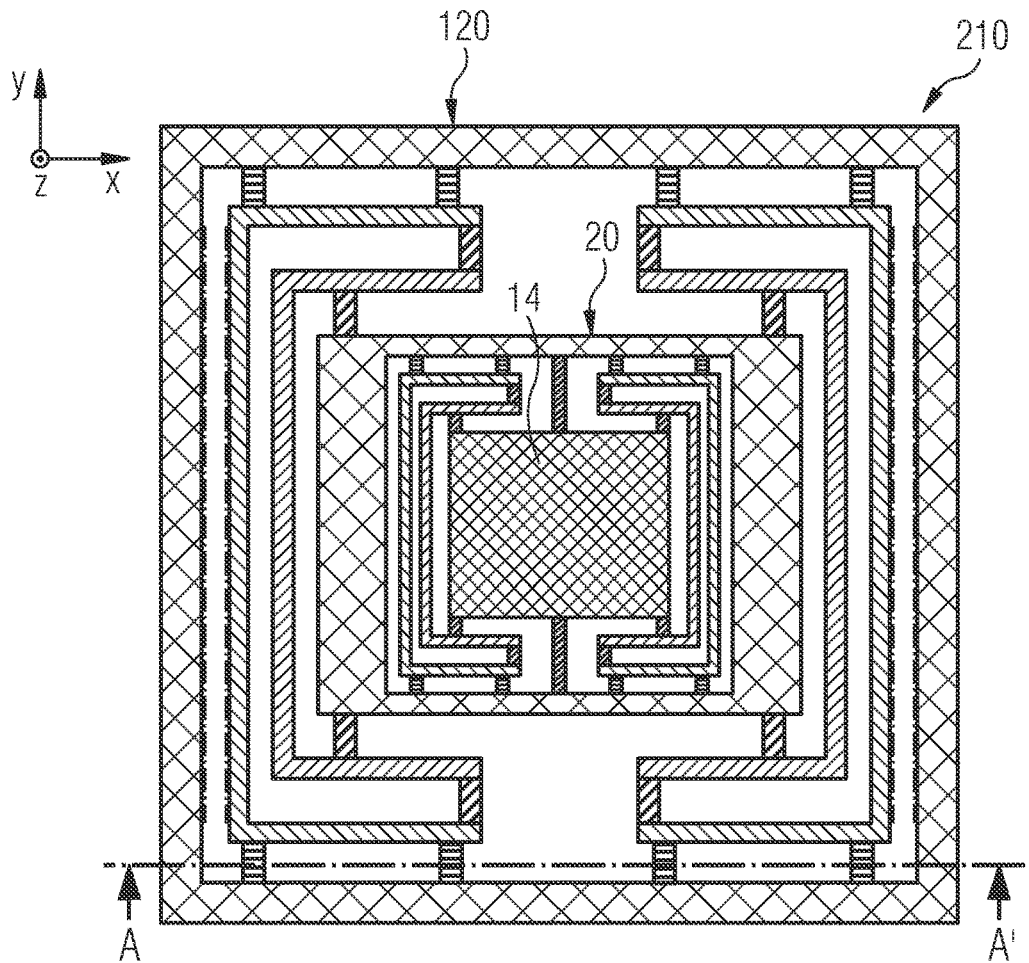
FIGS. 21a-c show schematic views of a micromechanical system according to an embodiment in which the MMS of FIGS. 2a-c is arranged as a movable element of the MMS of FIGS. 12a-c.

FIG. 21a shows a schematic top view of a micromechanical system 210 in which the MMS 20 is arranged as a movable element of an MMS 120.

Figure 21B:
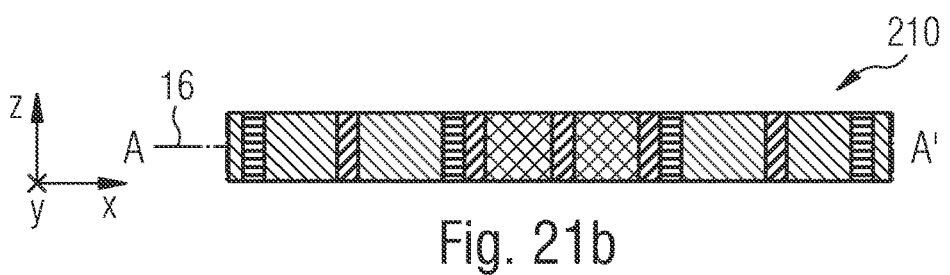

FIG. 21b shows a schematic lateral sectional view of the micromechanical system 210 in an undeflected state thereof, where all elements are disposed in the reference plane 16.

Figure 21C:
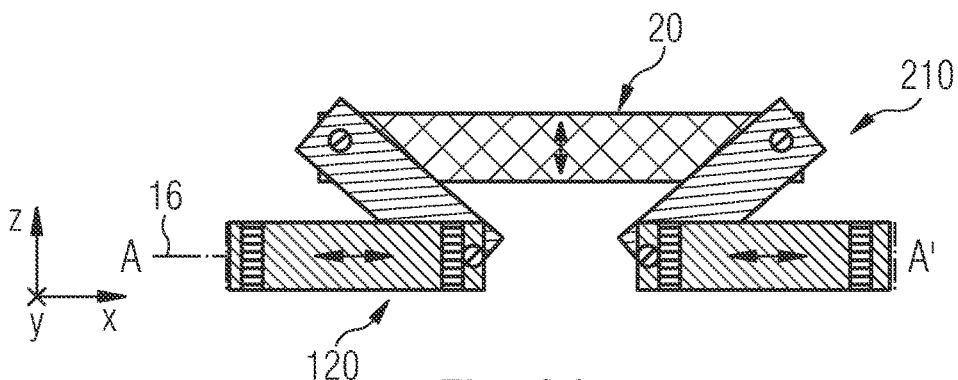

FIG. 21c shows a schematic lateral sectional view of the micromechanical system 210 in a deflected state of the micromechanical structure 20 relative to the MMS 120. The MMS 120 is configured, for example, to translationally displace the MMS 20 along the z direction, which can be used, for example, to adjust a path length of the rotation axis of the movable element 14. A comparatively wide structure of the substrate of the inner MMS to accommodate large forces enables support of the inner transmission s.

In other words, FIGS. 21a-21c show the structure from FIGS. 13a-13c and FIGS. 2a-2c combined as a 2d variation, wherein a 90° rotation is also possible.

Figure 22A:
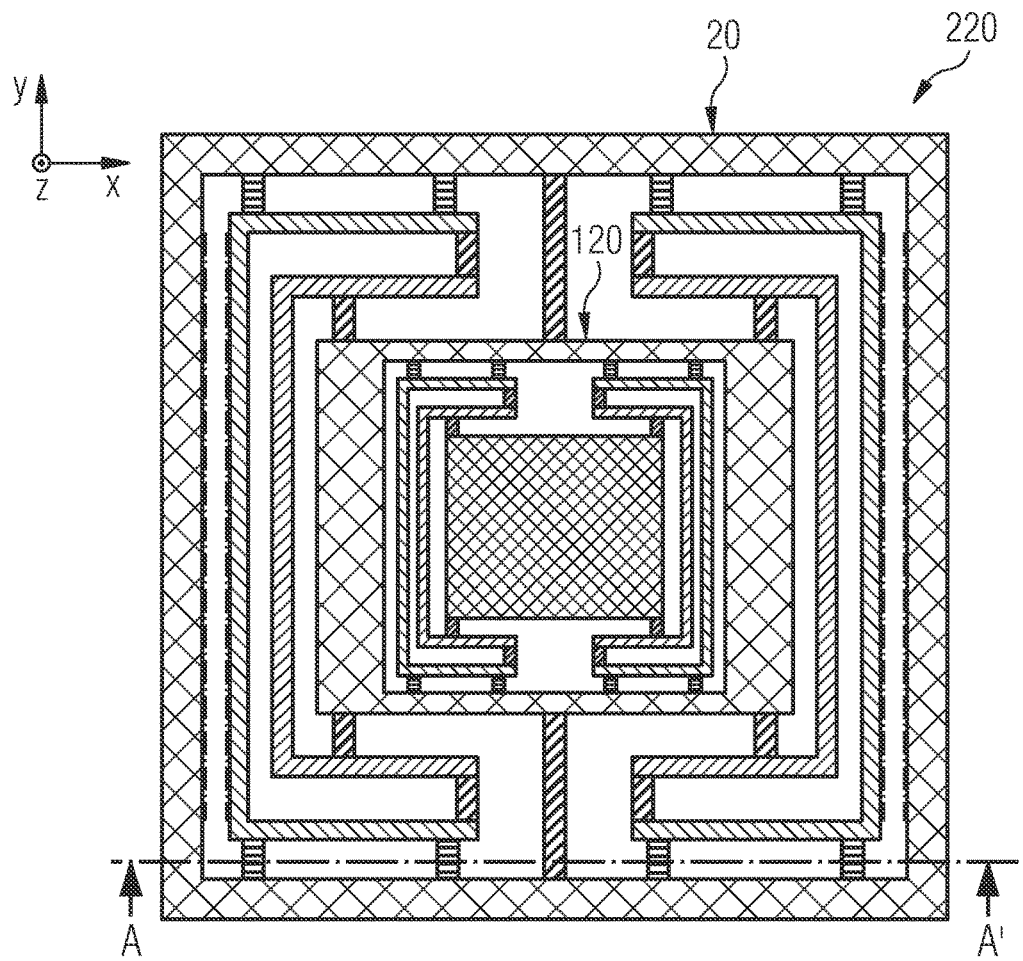
FIGS. 22a-c show schematic views of a micromechanical system according to an embodiment, formed inversely to the micromechanical system of FIGS. 21a-c.

FIG. 22a shows a schematic top view of a micromechanical system 220 formed inversely to the micromechanical system 210, where the MMS 120 is arranged as a movable element of the MMS 20.

Figure 22B:
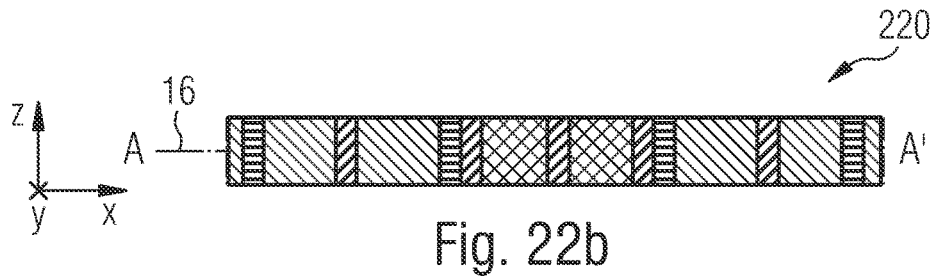

FIG. 22b shows a schematic lateral sectional view of micromechanical system 220 in a rest position.

Figure 22C:
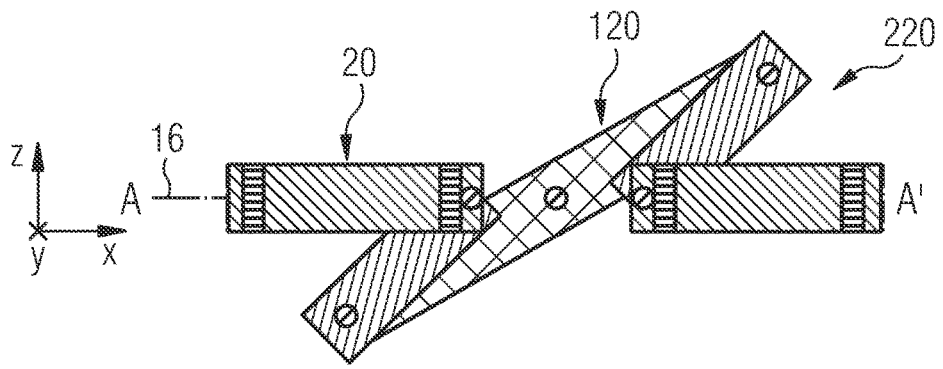

FIG. 22c shows a schematic lateral sectional view of micromechanical system 220 in which the MMS 120 is deflected relative to the MMS 20.

In other words, FIGS. 22a-22c show the structures from FIGS. 2a-2c and FIGS. 13a-13c combined as a 2D variation, wherein it is also possible to rotate the two elements by 90° relative to each other.

Referring now to FIGS. 23a-23c, exemplary embodiments of actuators 26a, 26b, and 26c which can be used as actuators in the previously described MMS and micromechanical systems will be discussed.

FIG. 23a shows a schematic top view of the actuator 26a, in which insulators 561 to 564 are arranged to electrically insulate individual portions of the substrate 12 from others so that electrodes $58_1$ to $58_6$ arranged there are electrically insulated from other electrodes $58_1$ to $58_6$. Between any two opposing electrodes $58_1$ to $58_2$, $58_3$ and $58_4$, $58_5$ and $58_6$, electric fields can be generated in electric power sources 62, for example, which can result in motion 64 which can be transmitted to the first transmission side 22a, for example. As it is shown in FIG. 23a, a direction of the power sources 62 and a direction of the movement 64 may be parallel to each other.

In other words, FIG. 23a shows a frontal capacitive actuator in a push-pull arrangement.

FIG. 23b shows a schematic top view of the actuator 26b, the electrodes 58 of which are arranged parallel to the direction of movement 64, that is the force is generated parallel thereto. The actuator may have a number of sections 66, for example four, the structure of the actuator 26b being explained in more detail with reference to sections $66_1$ and $66_2$. Sections $66_3$ and $66_4$ may be formed in a similar manner. The electrodes $58_1$ to $58_{24}$ may be formed, for example, as interdigital electrodes which move in-plane with respect to one another along the direction of movement 64 when an electric field is applied to the electrodes $58_1$ to $58_{24}$. For example, the interdigital electrodes may be arranged side by side along a direction perpendicular to a direction of force which is parallel to the movement 64. Advantageously, in this embodiment, the occurrence of a mechanical stop (pull-in effect) can be reduced or prevented, since a distance between the electrodes along a surface normal thereof can remain unchanged, whereas a distance between the electrodes $58_1$ to $58_6$ is variable, for example, in the actuator 26a.

In other words, FIG. 23b shows a frontal capacitive drive with electrode comb in push-pull arrangement.

While the MMS 20 is implemented in a frontal "pull" variation, for example, frontal "push-pull" variations such as those shown in FIGS. 23a and 23b may also be implemented, as well as in a corresponding other variation shown in FIG. 23C.

FIG. 23c shows a schematic top view of an actuator 26c in which the electrodes are connected to the first transmission side 22a at any location and are arranged adjacent to electrodes $58_1$ and $58_4$ connected to the substrate 12 to enable movement of the first transmission side 22a along the direction of movement 64.

In principle, any other configurations of electrostatic actuators can be used in embodiments described herein. Alternatively, in addition to this, other actuator principles can also be realized, for example piezoelectric, thermal or the like.

The actuators $26_a$ to $26_c$ have in common that the actuator includes an electrode structure that is supported on the substrate, such as electrodes $58_1$, $58_3$, and $58_6$ of the actuator 26a, electrodes $58_1$, $58_4$, $58_5$, $58_8$, $58_9$, and $58_{12}$ of the actuator 26$_b$, or electrodes 58$_1$ and 58$_4$ of the actuator 26$_c$. One of the other electrode structures is supported on the first transmission side, wherein the actuator is configured to provide the force for generating the movement 64 between the electrode structures.

In other words, FIG. 23c shows a lateral capacitive drive with electrode comb in push-pull arrangement, or a section thereof. It is noted that all the arrangements of FIGS. 23a-23c can also be arranged in series multiple times in succession and/or have any number of electrodes.

Figure 24A:
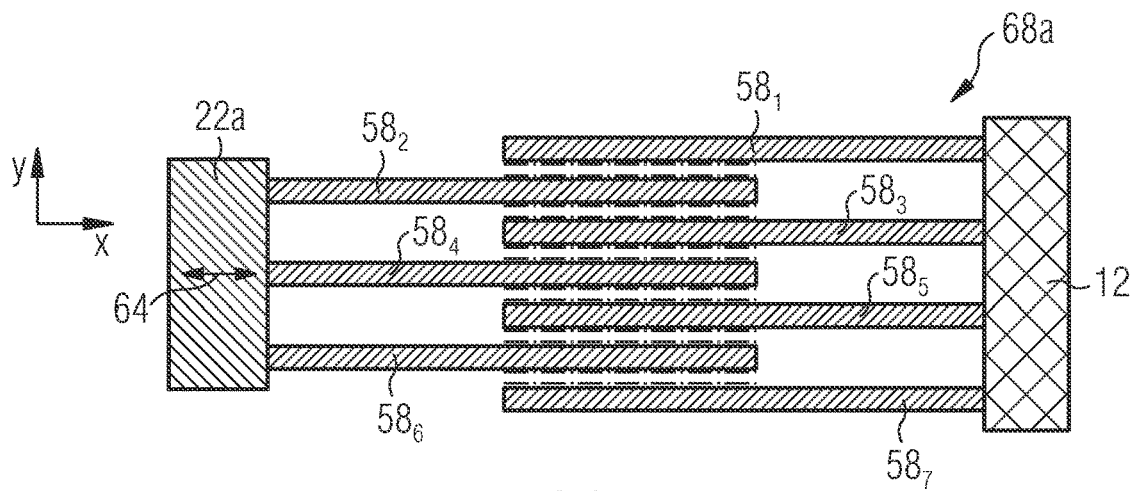
FIGS. 24a-c show schematic views of advantageous embodiments of interdigital electrodes according to embodiments.
Figure 24B:
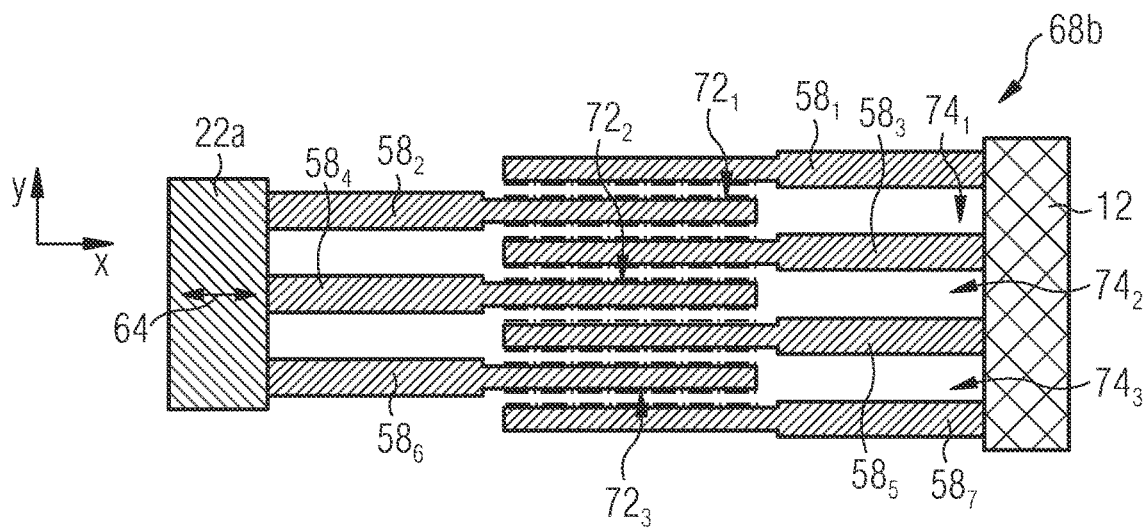
Figure 24C:
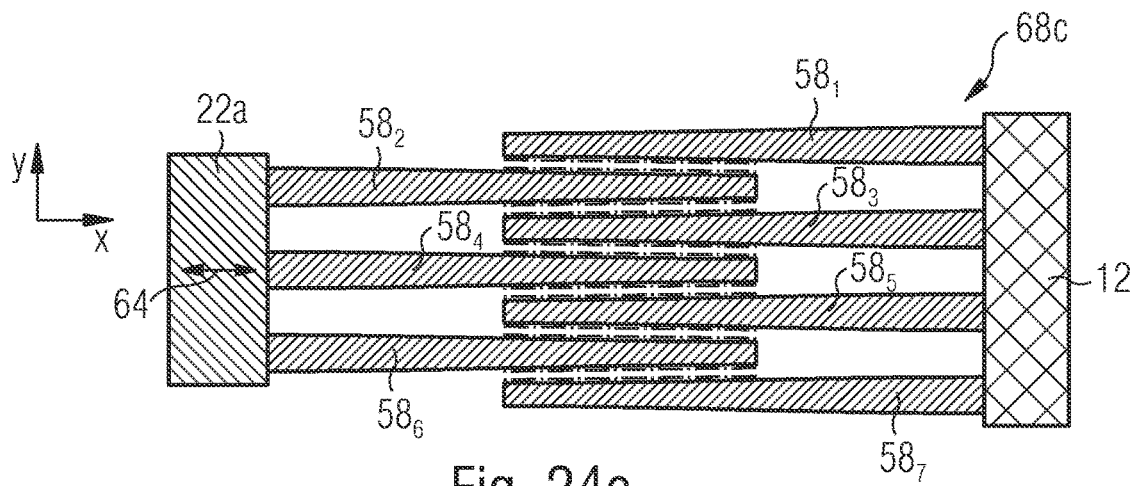

With reference to FIGS. 24a-24c, advantageous embodiments of interdigital electrodes are described. Referring again to FIGS. 23a-23c, it is noted that the arrangement of electrode structures, for example metallic coatings, is not limiting in that the electric fields can only be generated at these locations. Rather, areas of the transmission structure or transmission sides and/or areas of the substrate 12 may be electrically conductive so that the respective area can act as an electrode.

This is illustrated in FIGS. 24a-24c, in which 58$_1$ to 58$_7$ are each implemented as fingers and can be brought together to an electrical potential.

In this regard, FIG. 24a shows a schematic top view of an electrode structure 68a in which electrodes 58$_1$, 58$_3$, 58$_5$ and 58$_7$ connected to the substrate 12 are formed with a constant dimension along the y direction, as are electrodes 58$_2$, 58$_4$ and 58$_6$ connected to the first transmission side 22a. By applying an electric field between the electrode structures, a force between the electrodes and consequently the movement 64 can be obtained.

In other words, FIG. 24a shows an arrangement of frontal standard capacitive electrodes.

FIG. 24b shows a schematic top view of an electrode arrangement 68b in which the electrodes 58$_1$ to 58$_7$ have a stepped profile along the x direction, that is the direction of movement 64, that is a discontinuously changing dimension along the y direction. For example, when actuated, the first transmission side 22a moves along the positive x direction. In this process, sections 72$_1$ to 72$_3$ of electrodes 58$_2$, 58$_4$ and 58$_6$ may dip into areas 74$_1$ to 74$_3$ that are formed to be narrow based on wide electrodes 58$_1$, 58$_3$, 58$_5$ and 58$_7$, that is form narrow trenches. As a result, a distance between electrodes 58$_1$ to 58$_7$ is reduced at these locations, which enables a high force effect as soon as sections 72$_1$ to 72$_3$ dip into the narrow trenches 74$_1$ to 74$_3$.

In contrast to the standard variation of an electrode comb shown in FIG. 24a, the dipping trenches into which the electrodes dip during lateral movement can be narrower to increase the drive capacity, as shown in FIG. 24b, so that the effective capacity is formed by trenches of a width of 3 μm, 2 μm or even only 1 μm instead of, for example, 4 μm. This can lead to a significant increase in usable energy.

In other words, FIG. 24b shows an array of frontal capacitive electrodes with narrow immersion trenches for an increase in capacitance.

In addition, the electrodes can be tapered, as shown in FIG. 24c, so that the trench spacing can be reduced when the combs are moved laterally and thus the usable capacity and thus the energy can be further increased. A combination of the variations is also possible. FIG. 24c shows a schematic top view of an arrangement 68c in which the electrodes 58$_1$ to 58$_7$ are formed conically, that is have a continuously variable dimension along the x direction, so that the distance between the electrodes decreases continuously during movement 64 along the positive x direction, whereas it decreases discontinuously in FIG. 24b.

In other words, FIG. 24c shows an array of frontal capacitive electrodes with a conical shape for an extended increase in capacitance.

The arrangements 68a and 68b and 68c described herein may be combined in any manner with the actuators described herein.

For the static state, this results in the following energy equilibrium: The energy introduced into the system, e.g. by an electrostatic comb drive, is converted into a desired rotation φ in this case and an undesired displacement x of the springs, which can be represented as follows:

$$\frac{1}{2}CU^2 \Rightarrow \frac{1}{2}\tau\varphi^2 + \frac{1}{2}kx^2 \quad (1)$$

In general, a structure can be used for the torsion springs that shows minimum resistance for the desired rotation and, at the same time, maximum resistance for the parasitic translation in the plane orthogonal to the rotation axis.

Figure 25A:
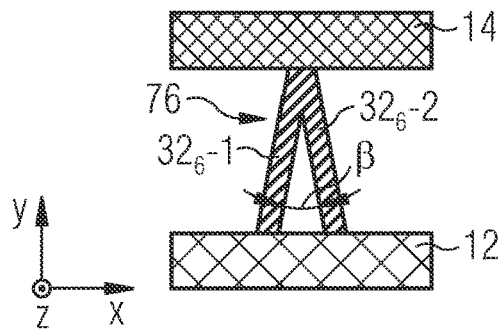
FIGS. 25a-c show schematic views of three V variations of a torsion spring for increasing lateral stiffness according to embodiments.
Figure 25B:
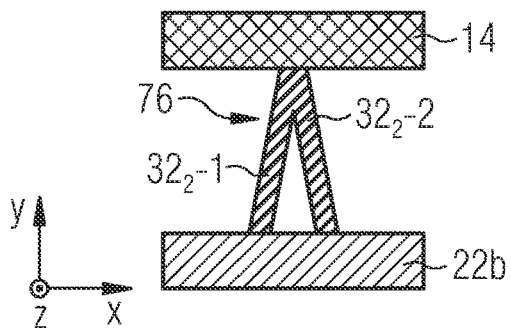
Figure 25C:
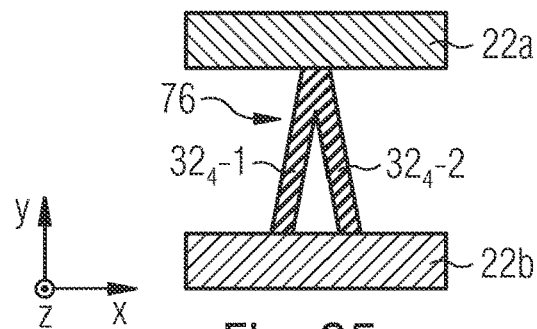

FIGS. 25a to 25c show a schematic top view of a torsion spring arrangement 76 comprising two or more torsion springs 32 which can be arranged in place of simple torsion springs. Thus, FIG. 25a shows an arrangement of the torsion spring arrangement 76 in place of the torsion spring 32$_6$ of the MMS 10. FIG. 25b shows an arrangement of the torsion spring arrangement 76 in place of the torsion spring 32$_2$ of the MMS 10. FIG. 25c shows an arrangement of the torsion spring arrangement 76 in place of the torsion spring 32$_4$ of the MMS10, wherein the torsion spring arrangement 76 may also replace any other torsion springs of MMS or micromechanical structures described herein.

An opening angle β between the respective torsion spring elements arranged at an angle may, for example, have a value of at least 2° and at most 45°, at least 10° and at most 30°, or at least 12° and at most 25°, for example 15°. The torsion spring arrangement 76 comprises at least one first torsion spring element 32$_6$-1, 32$_2$-1 or 32$_4$-1 and a second torsion spring element 32$_6$-2, 32$_2$-2 or 32$_4$-2 arranged in a V shape inclined to each other, advantageously both torsion spring elements being arranged at an angle to a surface normal of both adjacent structural elements.

In other words, FIGS. 25a-25c show three V variations of a torsion spring for increasing lateral stiffness. Lateral in the context of embodiments described herein means along the direction of motion 64.

Figure 26:
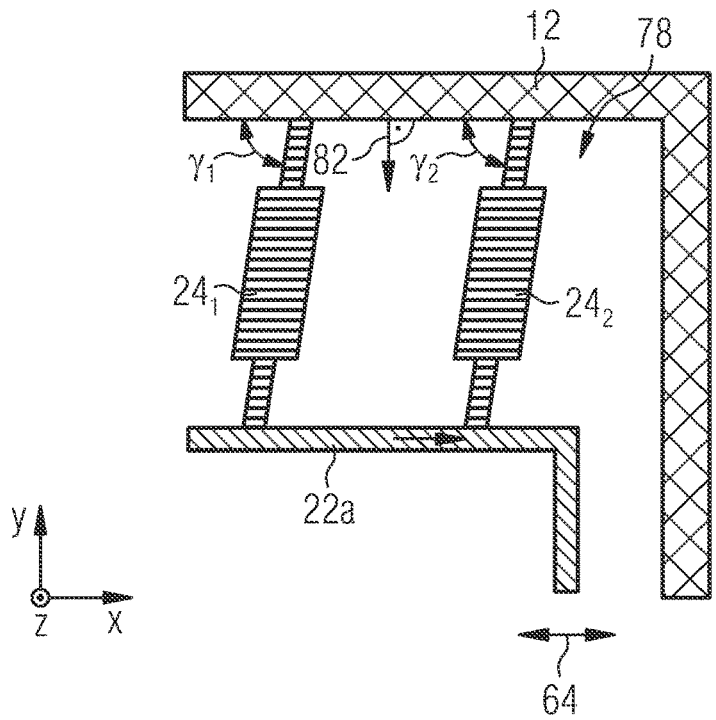
FIG. 26 shows a schematic top view of a flexure spring arrangement according to an embodiment.

FIG. 26 shows a schematic top view of a flexure spring arrangement 78 comprising at least two flexure springs 24$_1$ and 24$_2$ arranged inclined with respect to a surface normal 82 of the substrate 12 and/or the first transmission side 22a. The flexure spring arrangement 78 may be bistable along the direction of movement 64, which may be obtained, for example, by the inclined arrangement with respect to the surface normal 82 of the substrate 12 or alternatively the first transmission side 22a. Advantageously, the flexure springs 24$_1$ and 24$_2$ are arranged parallel to each other so that inclination angles γ$_1$ and γ$_2$ may be the same with respect to the surface normal 82. The inclination angles may have an angle of at least 1° and at most 30°, at least 5° and at most 20°, or at least 10° and at most 15°.

This allows for additional stiffening of the flexure springs from the MEMS described previously along the direction of motion 64.

The flexure spring assembly 78 may be arranged in place of any flexure spring of the MMS described herein.

In other words, FIG. 26 shows a special form of a flexure spring/flexure spring arrangement for bistable positioning of the thrust frame, that is the first transmission side 22a.

Figure 27A:
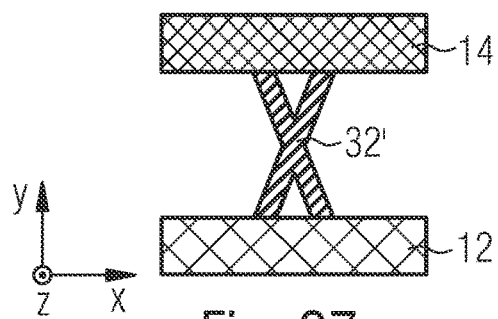
FIGS. 27a-d show schematic views of torsion springs according to embodiments which can be used at any locations of the MMS described herein.
Figure 27B:
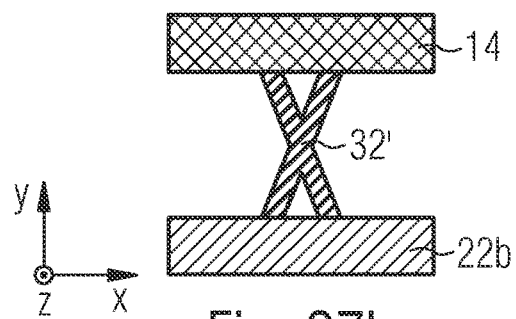
Figure 27C:
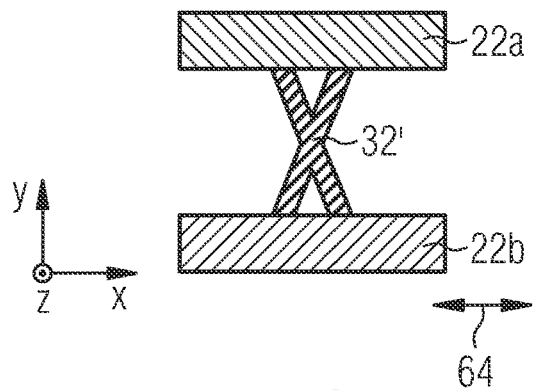

FIGS. 27a-27d show schematic embodiments of torsion springs 32' and 32", which may be used at any locations of the MMS described herein. For example, FIG. 27a shows an arrangement of the torsion spring 32' between the movable element 14 and the substrate 12. FIG. 27b shows the arrangement of the torsion spring 32' between the movable element 12 and the second transmission side 22b. FIG. 27c shows the arrangement of the torsion spring 32' between the first transmission side 22a and the second transmission side 22b.

The torsion spring 32' is formed as an X-shaped spring, meaning that there are two attachment areas on both structures, for example the movable element 14 and the substrate 12, with single spring elements crossing each other to provide the X shape. It should be noted here that the torsion spring elements 32' may be formed integrally. The torsion spring elements 32' enable an increase in lateral stiffness along the direction of movement 64, for example parallel to the x direction.

Figure 27D:
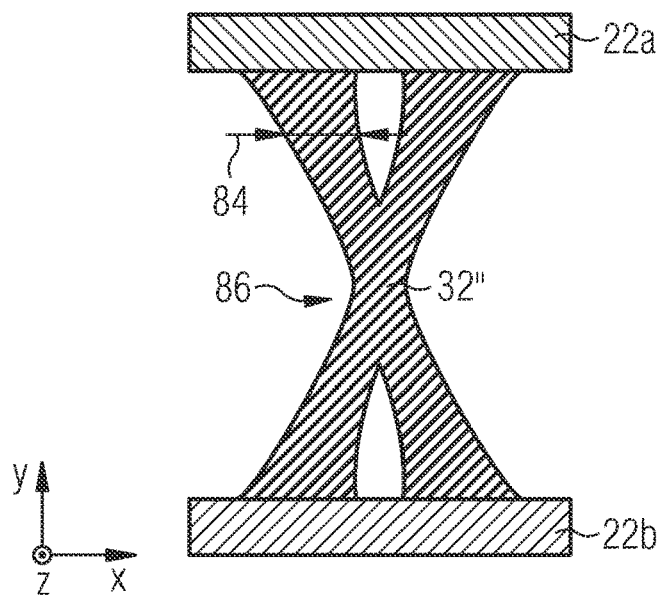

FIG. 27d shows a schematic top view of the torsion spring 32", which is coupled between the first transmission side 22a and the second transmission side 22b by way of example, although it can also be positioned at any other location. Compared to the torsion springs 32', the torsion spring 32" has a variable dimension 84 along an axial path from the first transmission side 22a to the second transmission side 22b, for example diagonally along an x/y direction, which may be referred to as the width by way of example but without any limiting effect. This allows a local reduction of the width of the torsion spring 32", for example in a central region 86, in order to obtain a high elasticity or low torsional stiffness there. At the same time, the high lateral stiffness can be maintained.

In other words, FIG. 25 shows V variations of the torsion springs which can withstand the transverse forces explained in connection with FIGS. 24a-24c to a greater extent. FIG. 26 additionally shows a variation of the flexure springs that enables bistable locking of the thrust frame, similar to a click-frog effect. Instead of a V spring, an X spring can also be used, which is shown for example in FIGS. 27a-d. Such X variations of torsion springs have a high resistance to transverse forces. It is also possible to optimize the profile of the structures, as can be adopted from the field of wind turbines, for example, as shown in FIG. 27d. Another form of torsion springs with a significantly higher resistance element to lateral displacement is shown in FIGS. 28a-28d, where FIG. 28d shows an optimization of the profile form of the structures.

Figure 28A:
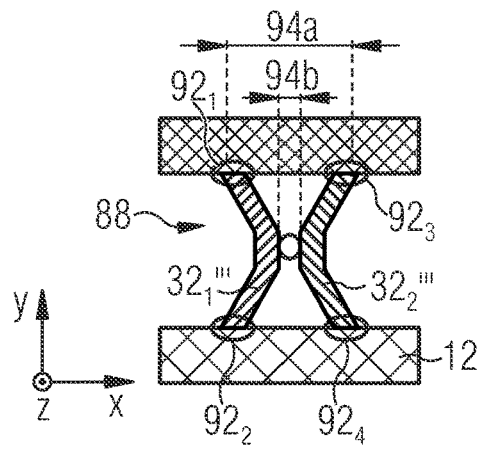
FIGS. 28a-d show schematic views of further advantageous implementations of the torsion springs according to embodiments.
Figure 28B:
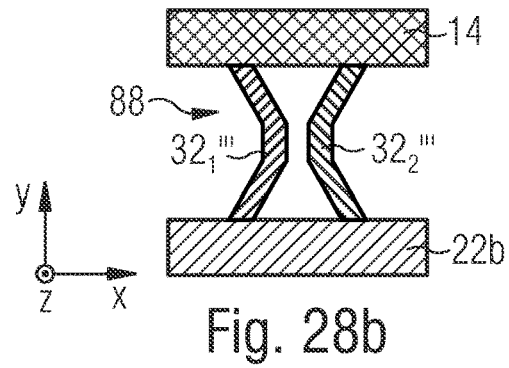
Figure 28C:
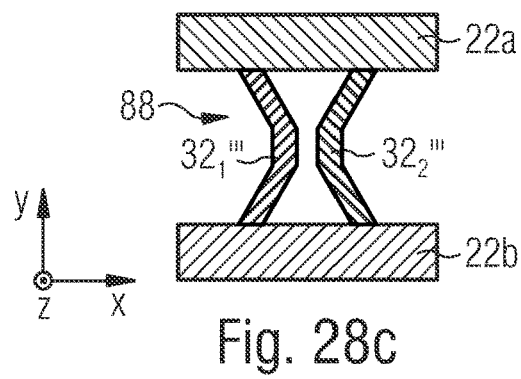

FIGS. 28a to 28d show further advantageous implementations of the torsion springs. Thus, instead of individual torsion springs 32 or 32' or 32", a torsion spring element arrangement 88 can also be arranged, which comprises two, but also a higher number of torsion springs. For example, the torsion springs $32_1$" and $32_2$" each have a bent course along an axial course and a first structure 14 or 22a to a second structure 12 or 22b, that is they run towards the center of the spring at an angle. The torsion spring $32_1$''' may be coupled to the movable element 14 at a first coupling location $92_1$, as shown in FIGS. 28a and 28b, but may also be coupled to the second transmission side 22a, as shown in FIG. 28c. Alternatively or additionally, such a torsion spring, just like the torsion springs 32, 32' or $32_1$" may also be arranged on further beam structures, such as the beam structures 54. The torsion spring $32_2$''' may similarly be disposed between coupling locations $92_3$ and $92_4$, wherein the coupling location $92_3$ may be disposed on the same structure as the coupling location $92_1$ and wherein the coupling location $92_4$ may be disposed on the same structure as the coupling location $92_2$.

A distance 94a may be arranged between the coupling locations or regions $92_1$ and $92_3$, which distance 94a is reduced in the axial course of the torsion spring elements $32_1$''' and $32_2$''' to a distance 94b which is, for example, at least 1 μm, at least 4 μm and at least 8 μm, but is at most half the distance 94a, which may be, for example, a value of 500 μm, 200 μm or 50 μm. That is, the torsion spring element arrangement 88 may include a first and second torsion spring elements 32''' each bent along an axial path and arranged relative to each other such that a first distance 94a between the first coupling locations $92_1$ and $92_3$ and a second distance between the second coupling locations $92_2$ and $92_4$ is greater than a minimum distance between the torsion spring elements along the axial path, that is the distance 94b. It is noted that the distance between the coupling locations $92_2$ and $92_4$ can be the same as the distance 94a, but another value can also be implemented.

Figure 28D:
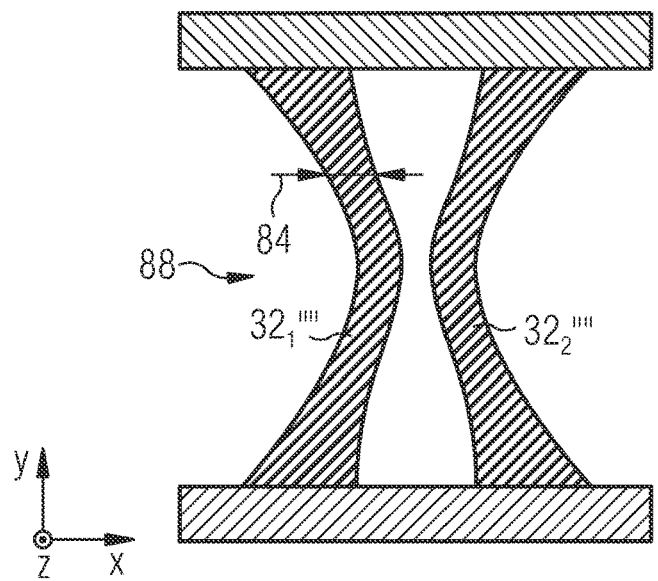

FIG. 28d shows a schematic top view of the torsion spring element assembly 88, in which torsion springs $32_1$'''' and $32_2$'''' may be formed similarly to the spring element assembly 88 of FIGS. 28a to 28c, with torsion springs $32_1$'''' and $32_2$'''' additionally having the variable dimension 84 along the x direction (alternatively the y direction, depending on orientation) described in connection with the torsion spring 32".

Over the entire axial course, the torsion spring elements of FIGS. 28a-d can be arranged without contact, i.e. they are without direct mechanical contact over the entire axial course, advantageously also during the executed torsion.

In other words, FIGS. 28a to 28d show X-gap variations of a torsion spring for increasing lateral stiffness.

In previous embodiments, MMSs have been described so as to comprise different structures or structural elements, for example the substrate 12, the movable element 14, the first transmission side 22a and the second transmission side 22b. It is noted that these element may be fabricated from the same stack of layers, particularly by etching processes of a CMOS process. This allows a few, some, or all of the elements to be at least partially integrally formed, meaning that at least a portion of the substrate 12, at least a portion of the transmission structure 18, and at least a portion of the movable element 14 may be integrally formed.

Figure 29:
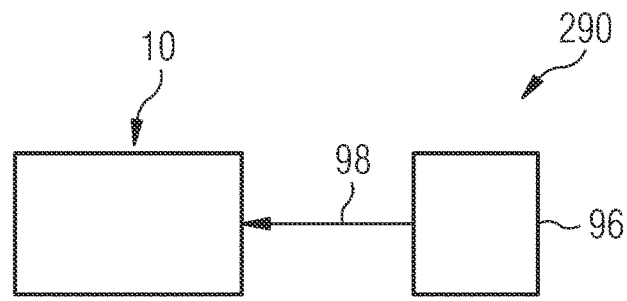
FIG. 29 shows a schematic block diagram of an apparatus according to an embodiment.
Figure 30:
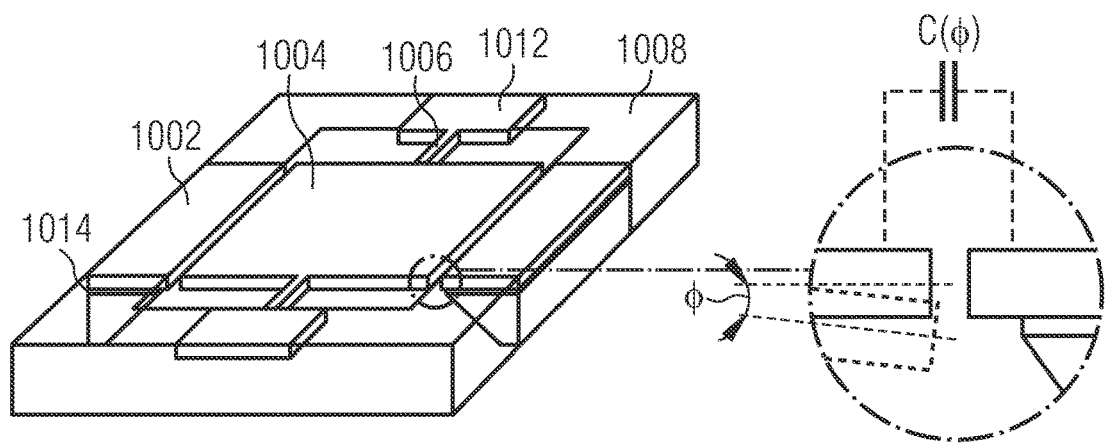
FIG. 30 shows a schematic view of MMS with laterally arranged electrodes according to the known technology.

FIG. 29 shows a schematic block diagram of a device 290 according to an embodiment comprising, for example, the MMS 10 and further comprising control means 96 coupled to the MMS 10. Alternatively or additionally, any other MMS or micromechanical system described herein may be arranged and coupled to the control means 96. The control means 96 is configured to control the actuator of the MMS 10. In this regard, the control means may be configured to apply a decreasing or increasing control frequency to adjust an oscillation (rotation and/or translational movement of the movable element of the MMS 10. For example, if the MMS 10 has a certain resonant frequency for the formed operating mode by means of which the operating mode can be set, the control means 96 may be configured to set and apply a higher frequency to the MMS 10 or the actuator. The control means 96 may be configured to reduce the frequency of a control signal 98 provided to the actuator in a plurality of steps until the target frequency is reached. Alternatively, the control means may apply a smaller or lower frequency than the resonant frequency and then increase the frequency. Both allow the frequency outside the resonant frequency to already excite a fundamental oscillation or vibration, even if it is not yet resonant. This fundamental oscillation can then be drawn into the resonant oscillation step-by-step. The control means 96 may be configured to operate the MMS or micromechanical system. For example, operation of such a system may be as follows.

Figure 33:
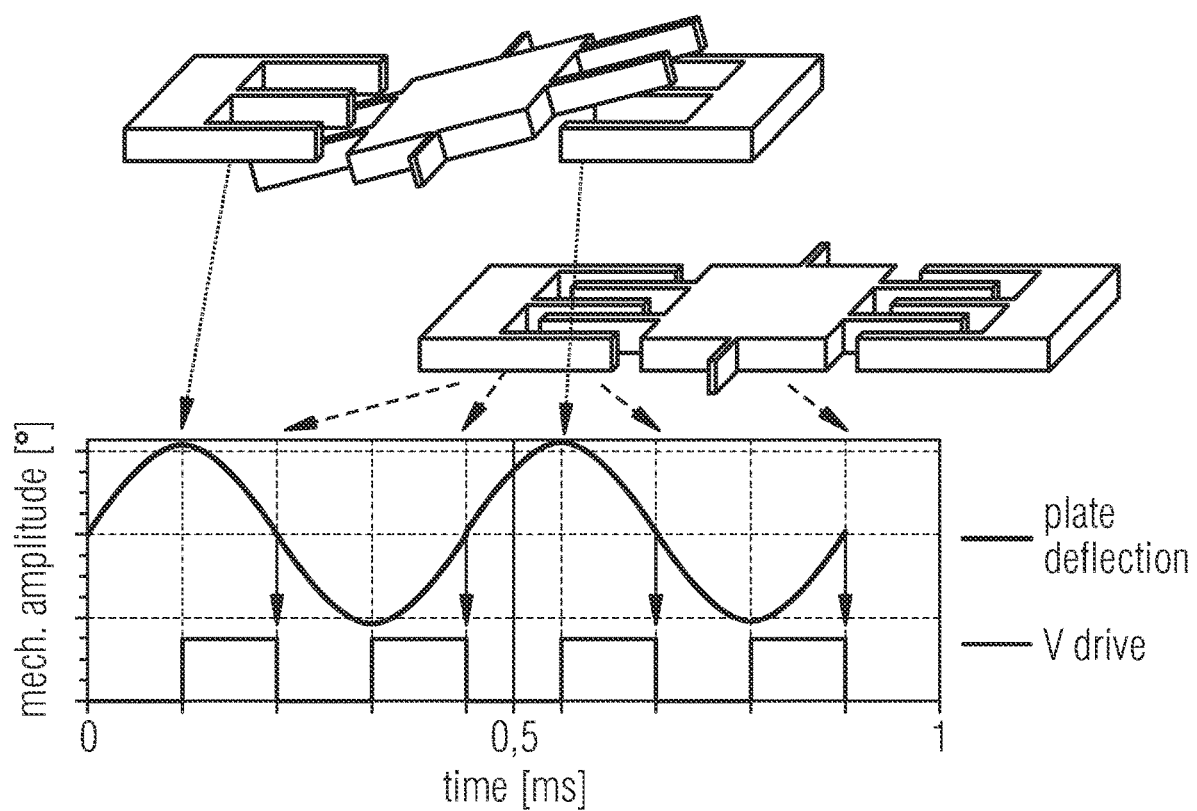
FIG. 33 shows a schematic diagram of the resonant operation of micromechanical components according to the known technology.
Figure 34:
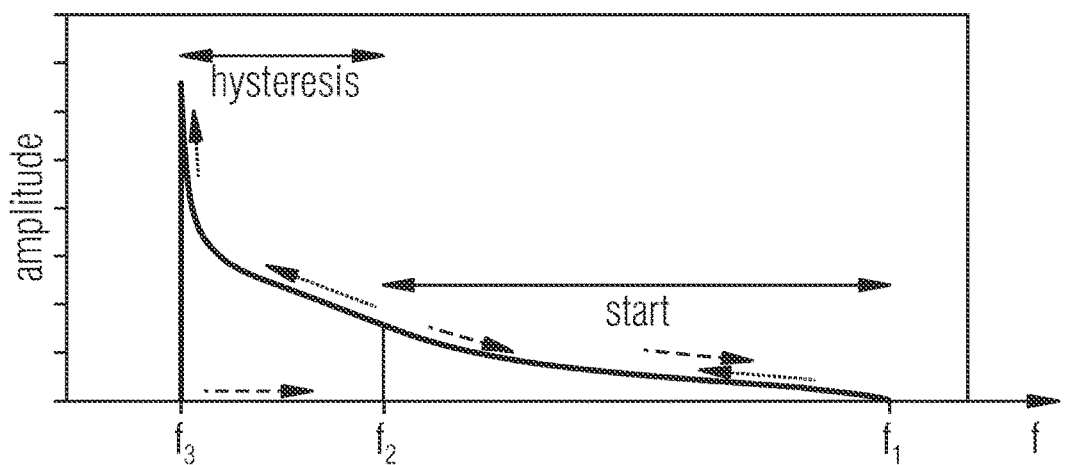
FIG. 34 shows a schematic response curve of a resonantly operated micromirror according to the known technology.

As an example, FIG. 33 and FIG. 34 are referred to again. As an example, a system is shown here whose parametric resonance $f_3$ is approximately twice the natural frequency of the spring-mass system, and which can be excited at higher frequencies, for example. Alternative systems can be excited at lower frequencies, which can qualitatively mirror the curve between $f_3$ and $f_1$ at $f_3$. For the initial excitation from rest, for example, a starting frequency greater than the frequency $f_2$ is chosen so that $f_1$ is a maximum starting frequency and $f_2$ is a minimum frequency at which good energy absorption is possible to start the oscillatory system. In the frequency range arranged above $f_2$ (alternatively below) between $f_1$ and $f_2$, a frequency sweep, i.e., a frequency variation, with the described frequency steps starts the mechanical oscillation and is continued until the system reaches the maximum oscillation amplitude when the frequency $f_3$ is reached, at least within a tolerance range, for which the signal according to FIG. 33 can be selected to accelerate the movable element twice per mechanical oscillation.

The movable structural element can be excited into parametric resonant oscillation from a reference plane by applying the control signal at the start frequency and/or by varying the frequency of the control signal.

In this regard, the embodiments described herein may be such that the frame (substrate), the transmission structure, the movable element and/or the spring elements may be arranged in a common substrate plane and/or formed from the same substrate layers. According to embodiments, a height profile may be provided in the MEMS along a thickness direction, but this may be done by subsequently thinning individual elements previously formed out of the same substrate layers, which in particular allows for an integral implementation of the components.

The embodiments described herein solve the problems of the known technology.

Figure 35:
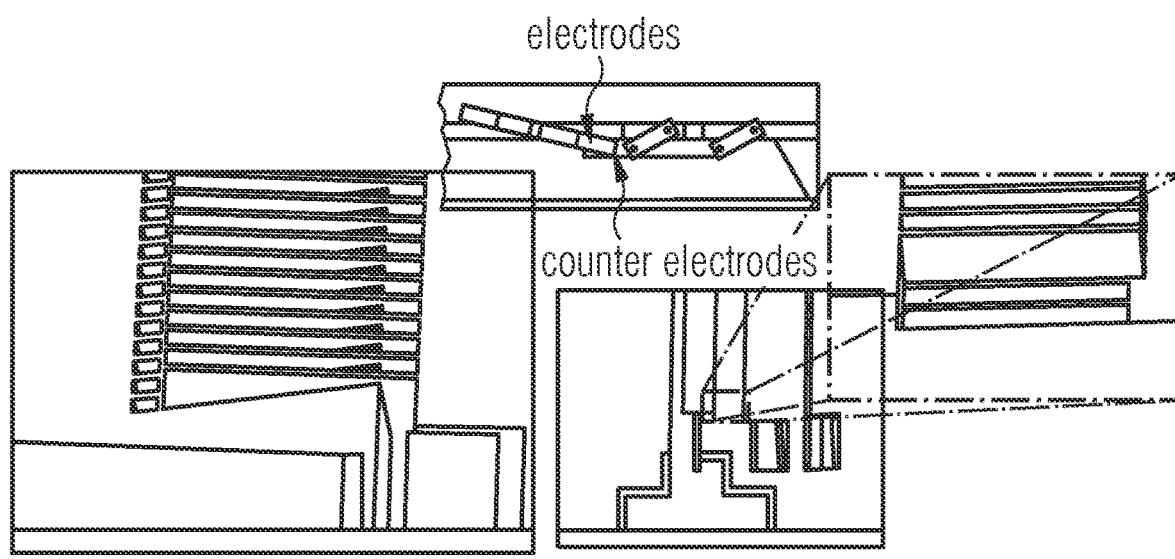
FIG. 35 shows scanning electron micrographs and a schematic view of a drive with electrode combs located in two superimposed or tilted planes, according to the known technology.

In particular, the control means 96 may be configured to set a plurality of operating modes in the MMS 10, alternatively any other MMS and/or micromechanical system described herein. Some of these operating modes are discussed below. Depending on the particular drive mode, appropriate actuation means may be provided, advantageously arranged in-plane and/or generating forces in-plane so that the respective actuator elements remain engaged with one another during actuation and "dipping" of the elements with respect to one another, such as may occur with offset interdigital electrodes, see FIG. 35, is avoided.

1. Resonant Operation
   1.A: The oscillation called harmonic is in reality not a harmonic oscillation (FIG. 3*d*), but an oscillation form deviating from the ideal sinusoidal form (quasi-harmonic). The deviations are caused by various nonlinear effects, e.g. the nonlinear spring characteristic, damping and drive. One of the nonlinear effects here results, especially with large deflections, from the gradually or abruptly changing damping by the surrounding medium during "dipping into" or "fetching from" of electrode combs (FIG. 33, FIG. 31) in the course of the oscillation.
      a—In the invention described here, the electrode combs used for the drive remain permanently interleaved, in particular even with large deflections, so that the (previously partly dominant) damping at the electrode combs does not change abruptly. Thus, these non-linear influences are reduced and the deviations from the harmonic oscillation form are smaller at this point.
   1.B: In resonant operation, energy can usually only be coupled into the system in the period from the reversal point to the passage through the rest position (FIG. 33). This is only possible by acceleration in the direction of the rest position, which in turn leads to nonlinearities due to the sudden change of the drive torque when passing through the rest position.
      a—The invention described here enables energy to be coupled in in all oscillation positions outside the rest position. This applies to both attractive and repulsive electrostatic forces.
      b—With the system described here, it is also possible to accelerate and decelerate the actuators in both directions, out of the rest position as well as towards the rest position, energy can be coupled in in both directions (decay and settle).
      c—The advantages described under a and b therefore allow a (partial) compensation of other nonlinearities of the system due to the permanently possible coupling, with the exception of the rest position, and the optimized variation of the forces in the course of the oscillation.
      d—The electrode combs are permanently interleaved in the variation shown in FIG. 23*b*. The resulting drive characteristic shows significantly smaller deviations from linear behavior than the conventional arrangement (classically resonant).
   1.C: The quasi-harmonic oscillation has only a very small quasi-linear range in the center of the sine function (FIG. 3*d*). In the field of metrology and some other applications, e.g. in the field of image projection, a larger quasi-linear range is desirable or even needed.
      a—Linearization of the middle range of the harmonic oscillation is possible with the invention described, since the system can be influenced in both directions in the deflected state. This applies in particular to oscillation states far from resonance.
   1.D: For parametric resonance, an abrupt termination of the oscillation at the resonance point is typical, also the oscillation can typically only be started with tuning of the frequency in one (negative) direction (FIG. 34).
      a—The abrupt termination of the oscillation, typical for parametric resonance, is probably omitted, the response curve probably exhibits more of a classical resonance exaggeration and could be approachable on both sides.
2. Quasi-Static Operation
   2.A: Cost: In systems deflected by external forces (FIG. 35), for example, currently two wafers are bonded together or two planes are created during wafer production (e.g. epitaxial). This increases material and process costs.
      a—The invention described enables quasi-static operation using only a single BSOI wafer.
   2.B: Precision: The electrode combs arranged in two planes have very high requirements as to the accuracy of the positioning relative to each other. Manufacturing the electrode combs in two planes (with external actuation or integrated manufacturing) is correspondingly complex.
      a—In the invention described, the electrode combs are fabricated in one process step in one plane, and are thus self-adjusting and, like the classically resonant devices described above, can be fabricated without additional effort.

2.C: When combining a classical quasi-static outer axis and a classical resonant inner axis of a 2D scanner, the outer drive is decoupled from the deformations caused by the inner vibrating element, resulting in large space requirements.
- a—In the invention described, the drive is decoupled better from the internal movements by to the parallel guiding.

2.D: In systems used so far, the set-up of a quasi-static deflectable 2D variation is only possible with great difficulty and at great expense and entails large space requirements. This also applies to a hybrid solution (e.g. with magnetic drive) where the advantages of microsystem technology (production of large quantities in wafer composites) are lost.
- a—The invention described allows the use of a 2D variation by an interconnected combination of two of the systems described, these can be arranged parallel or orthogonal. The manufacturing effort again corresponds to that of classical resonant devices.

2.E: In systems used up to now, the electrode combs used for energy generation are tied to a specific position. If the energy provided is increased, inevitably the length of the combs are increased, which in turn automatically leads to an increase in the size of the component.
- a—The invention described allows placing additional combs on previously unused areas within the device, since an optimal energy generation is not limited to a specific position. Thus, the energy provided can potentially be increased without necessarily enlarging the device.

3. Plate Capacitor System

Figure 32:
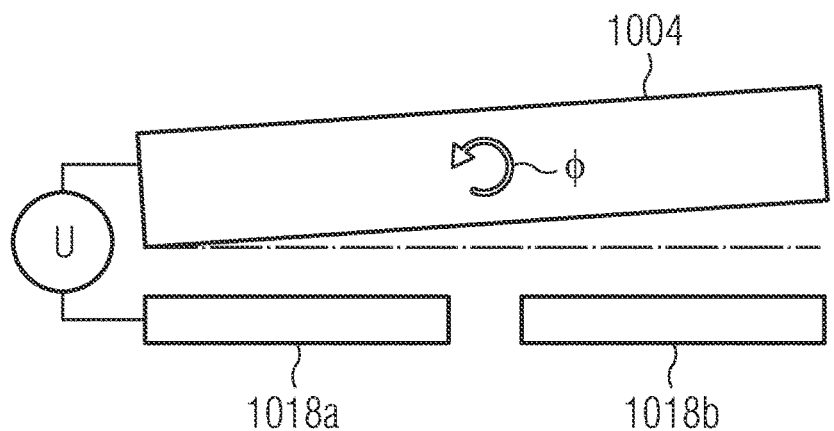
FIG. 32 shoes a schematic lateral sectional view of a plate capacitor drive according to the known technology.

3.A: Previous systems with parallel plate capacitors (FIG. 32) entail comparatively very high drive voltages for large deflection angles (due to the "pull-in" effect from ⅓ of the gap distance).
- a—The invention described herein allows a reduction of the used electric voltage and an avoidance or reduction of the "pull-in" effect (e.g. also by in-plane stops).

4. Classical Lever Systems

4.A: The production of such lever systems is very complex: Either several separate layers are used (e.g. BSOI) (a) or structures of different depths are etched (b). The disadvantage here is the difficult access to buried layers (e.g. through oxide layers) (a) or poor homogeneity and thus yield (b).
- a—In the invention described here, all the structures are located in one plane and are thus very easy to fabricate with high yield.

4.B: Systems manufactured in Poly-Si in "Surface Micro Machining" technology are very fragile, distorted by mechanical stress and the layers need first to be moved out of the rest position to obtain clearance for movement. (e.g. Lucent)
- a—In the invention described herein, the devices remain stable, are not distorted due to the use of single-crystalline silicon (SCS), and do not have to be repositioned prior to use.

5. General

5.A: Embodiments allow additional electrical potentials to be applied compared to suspending vibrating bodies on two simple or parallel beam springs. This enables a facilitated connection or improvement of sensor technology or other electronic components on the oscillating body.

5.B: Embodiments allow mechanical stabilization by additional mechanical suspensions compared to suspending vibrating bodies on two simple or parallel beam springs. This enables improvement and optimization of shock resistance through an extended parameter space.

5.C: Compared to suspending vibrating bodies on simple or parallel beam springs, embodiments allow an optimization of the nonlinearities of the spring system by additional mechanical suspensions (extended parameter space).

5.D: During quasi-static operation, embodiments include a tilted position compared to the rest position. Thus, potential parasitic optical reflections caused by a glass cover parallel to the mirror plate in the rest position can be avoided.

5.E: In systems operated using electrode combs, the effective spring stiffness can be varied by electrostatic attraction and thus used to adjust the frequency, for example. In previous systems, "extending" the electrode combs during operation results in reduced efficiency as the deflection increases. Using the system described here, the electrode combs are permanently interleaved and thus electrostatically fully effective for all deflections.

Figure 36:
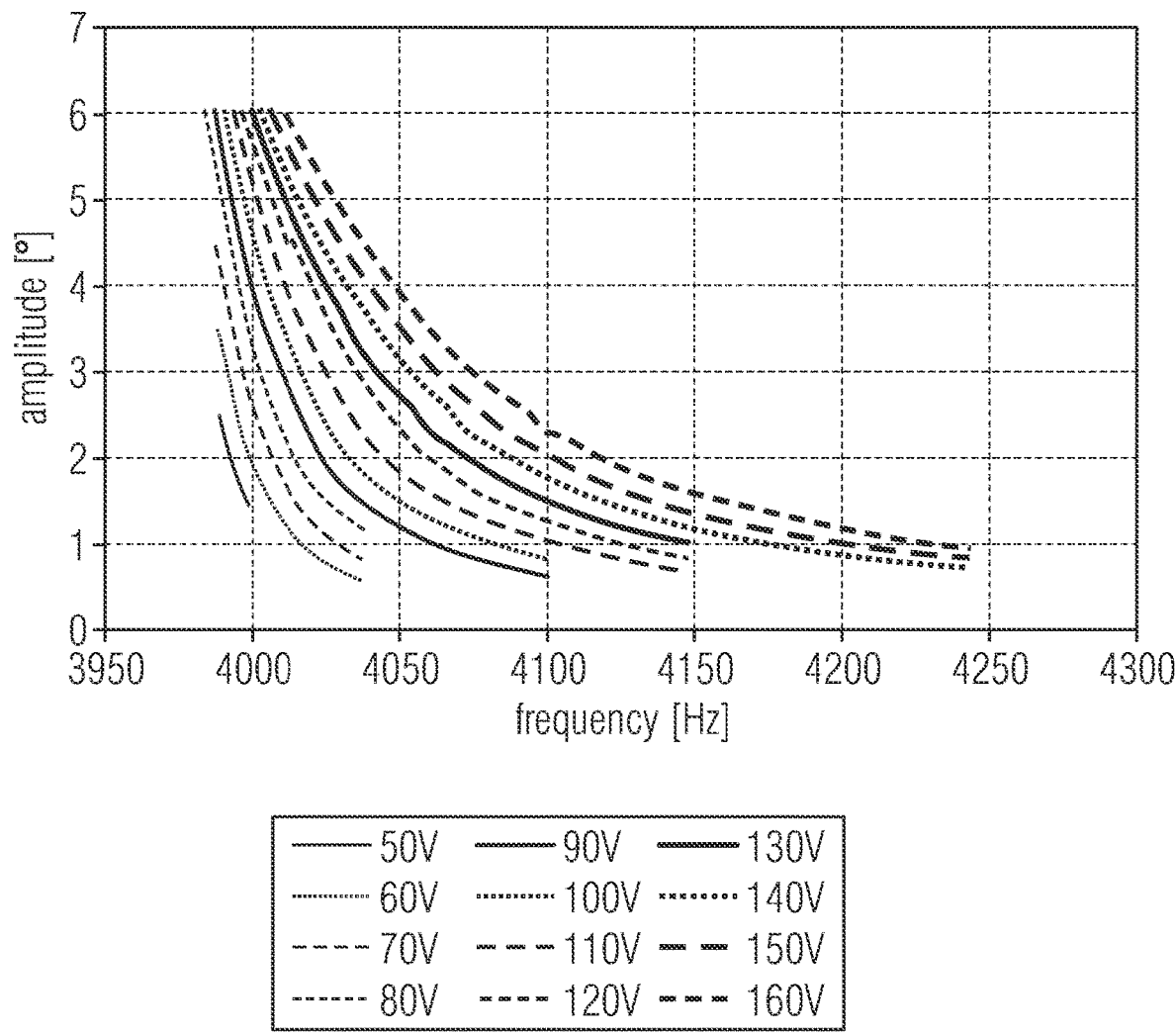
FIG. 36 shows a measurement curve chart for illustrating the drive behavior of electrode combs according to the known technology.

5.F: In conventional systems, "extending" the electrode combs during operation results in reduced efficiency as the deflection increases, and thus in a reduction of the bandwidth (see FIG. 36). Using the system described here, the electrode combs are permanently interleaved, and thus the bandwidth is increased.

5.G: The suspension of optical mirror plates with torsion axes at only two points can lead to large dynamic deformations at high frequencies. The invention described here enables a reduction of the dynamic deformation by using additional suspension points.

5.H: Especially at the wafer edge, narrow trenches produced by plasma etching (e.g. Bosch process) sometimes exhibit a non-orthogonal position to the surface (obliquely accelerated ions). This can lead to collisions or degradation of the device behavior during "out-of-plane" movement (especially rotation) of electrode combs. In the invention described here, the parallelism of the electrode plates is maintained even when etched at an angle, since they are only moved "in-plane" with respect to one another. The remaining mechanics of the suspension, on the other hand, are less sensitive than the electrode combs, which are as close to one another as possible for high capacitance (wider trenches can be used for the transmission).

5.I The position can be measured capacitively via comb drives. The problem is that no or only a weakened signal of the position (change in capacitance) can be measured when the combs move out. This problem is solved by the invention described, since the combs can be permanently interleaved.

5.J: When suspending micro-optical elements operated resonantly, with torsion axes at only two points, it can be difficult to set the resonant frequency of adjacent "parasitic" vibration modes to be far enough from the useful mode. The invention described here allows for greater spacing of frequencies, especially to "in-plane" rotational modes, by using additional suspension points.

5.K: When suspending micro-optical elements with torsion axes at only two points, which are operated resonantly using lateral electrode combs, the usable drive voltage of the "out-of-plane" rotation is often limited by the "pull-in" voltage of an "in-plane" rotation mode. The embodiments described here enable higher stability of the in-plane mode by using additional suspension points.

5.L: In 2D elements operated resonantly using lateral electrode combs, a square-wave voltage is applied to the mirror plate, since the inner frame usually forms the ground for the mirror AND the gimbal outer frame. This leads to constantly changing fields and thus forces between the plate and the ground below the element as the plate oscillates. This can create nonlinearities in the vibration. In the invention described here, the mirror plate does not have to be operated with alternating fields, thus the influence of the area subjected to alternating fields on the nonlinearities of the vibration is much smaller.

Operation of the system may be performed by a plurality of controllers, such as the control means 96.

1. By applying a square-wave voltage, as exemplarily shown in FIG. 33, to the electrostatic drive, which is in the range of twice the resonance frequency of the coupled oscillator, the micromechanical structure, the system is caused to oscillate. This can be done, for example, with the aid of frequency variation, as shown as an example in FIG. 34. This resonant oscillation corresponds to the first operating mode. According to FIG. 34, a start frequency of control means can be selected to be greater than twice the frequency of the mechanical, i.e., parametric resonance frequency. It can be within a tolerance range of 100%, advantageously 50% and more advantageously 20% or less, which can be selected to be even smaller as the frequency increases.

2. If there is an oscillation as described under one, the drive voltage or the drive voltages is/are modulated in frequency and/or amplitude and/or phase position in the course of the oscillation such that the oscillation form, i.e., the amplitude course over the time, changes. The quasi-linear range of a sinusoidal oscillation can be increased, for example, or non-linear ranges of the oscillation can be compensated/optimized. With a corresponding "push-pull" arrangement, both decelerating and accelerating forces can be coupled in at any position of the oscillation outside the zero crossing. This corresponds to the second operating mode which becomes more effective especially with an increasing distance to resonance.

3. If there is an oscillation as described under one, at the reversal point, when the speed of the system is zero or at times of low speeds, a voltage is applied at the drive which is so large that the resulting forces are in equilibrium with the restoring forces resulting from the mechanical springs. The optical element is thus held in its deflected position. Modulation of the drive voltage can now be used for a quasi-static change in position of the optical element 14. This corresponds to the third mode of operation and is only possible on one "side"/"oscillation half" of the original resonant oscillation. The usable angle can be increased by a coaxial arrangement of several systems.

4. By applying a static voltage to the electrostatic drive, the system is statically deflected when a voltage threshold is exceeded. This can be favored, for example, by using mechanical "bias" elements which bring the torsion axis (or also the translational oscillator) into a slight pre-deflection. With this pre-deflection, a moment, which deflects the structure, can also be generated outside the center position in the plane, see FIG. 10. This static deflection corresponds to the fourth operating mode.

A corresponding combination of the operating modes and 2D variations described and shown here, as well as a combination with classical elements and operating variations is also possible.

Although some aspects have been described in the context of an apparatus, it is understood that these aspects also represent a description of the corresponding method so that a block or device of an apparatus is also to be understood to be a corresponding method step or feature of a method step. Similarly, aspects described in connection with or as a method step also represent a description of a corresponding block or detail or feature of a corresponding apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A micromechanical structure comprising:
a substrate;
a movable element arranged in a reference plane in an undeflected state;
a transmission structure comprising a first transmission side coupled to the substrate, and a second transmission side coupled to the movable element;
an actuator configured to provide a force along a force direction parallel to the reference plane and apply the force to the first transmission side;
wherein the transmission structure is configured to transfer the force along the force direction to a movement of the movable element out of the reference plane;
wherein the substrate, the movable element and the transmission structure are arranged in a common substrate plane.

2. The micromechanical structure in accordance with claim 1, wherein the first transmission side is coupled along a first torsion axis to the second transmission side via first torsion spring elements and wherein the second transmission side is coupled along a second torsion axis to the movable element via second torsion spring elements;
wherein the first torsion axis is arranged parallel to the second torsion axis; and
wherein the first torsion axis comprises greater a distance to an edge of the movable element, which the first torsion axis and the second torsion axis comprise the smallest distance to and which is arranged parallel to the first torsion axis and the second torsion axis, than the second torsion axis, the actuator being configured to provide a tensile force between the first transmission side and the substrate at least at times.

3. The micromechanical structure in accordance with claim 1, wherein the first transmission side is coupled along a first torsion axis to the second transmission side via first torsion spring elements and wherein the second transmission side is coupled along a second torsion axis to the movable element via second torsion spring elements;
wherein the first torsion axis is arranged parallel to the second torsion axis; and
wherein the first torsion axis comprises smaller a distance to an edge of the movable element, which the first torsion axis and the second torsion axis comprise the smallest distance to and which is arranged parallel to the first torsion axis and the second torsion axis, than the second torsion axis, the actuator being configured to provide a compressive force between the first transmission side and the substrate at least at times.

4. The micromechanical structure in accordance with claim 1, wherein the transmission structure is a first transmission structure, and wherein the micromechanical structure comprises a second transmission structure, the first and second transmission structures being arranged symmetrically around the movable element in a plane parallel to the reference plane;
wherein the actuator is a first actuator configured to actuate the first transmission structure, wherein the micromechanical structure comprises a second actuator configured to actuate the second transmission structure.

5. The micromechanical structure in accordance with claim 4, wherein the first transmission structure and the second transmission structure are arranged opposite to each other relative to the movable element, wherein the actuators are configured to simultaneously produce a compressive force or simultaneously produce a tensile force.

6. The micromechanical structure in accordance with claim 1, wherein the transmission structure is a first transmission structure, wherein the actuator is a first actuator, further comprising:
a second transmission structure coupled between the movable element and the substrate, and a second actuator configured to actuate the second transmission structure;
a third transmission structure coupled between the movable element and the substrate, and a third actuator configured to actuate the third transmission structure;
a fourth transmission structure coupled between the movable element and the substrate, and a fourth actuator configured to actuate the fourth transmission structure;
wherein the first, second, third and fourth transmission structure are arranged symmetrically around the movable element; and
wherein the movable element is rotationally movable around two mutually different rotation axes.

7. The micromechanical structure in accordance with claim 1, wherein the first transmission side or the second transmission side is formed as a U-shaped or semicircular structure.

8. The micromechanical structure in accordance with claim 1, wherein the first transmission side is formed as a first U-shaped structure and wherein the second transmission side is formed as a second U-shaped structure, the first U-shaped structure and the second U-shaped structure comprising the same orientation, wherein, in a rest position of the micromechanical structure, the first U-shaped structure is arranged such that it encloses the second U-shaped structure.

9. The micromechanical structure in accordance with claim 1, wherein the first transmission side and the second transmission side are coupled to each other via torsion spring elements.

10. The micromechanical structure in accordance with claim 9, wherein the torsion spring elements comprise smaller a dimension along a thickness direction perpendicular to the reference plane than the first transmission side and the second transmission side.

11. The micromechanical structure in accordance with claim 1, wherein the second transmission side and the movable element are coupled to each other via torsion spring elements.

12. The micromechanical structure in accordance with claim 1, wherein the second transmission side comprises a mechanical bias, the mechanical bias being configured to move, in a rest state of the micromechanical structure, the movable element at least partly out of the reference plane.

13. The micromechanical structure in accordance with claim 12, comprising a bias element mechanically fixed to the second transmission side and configured to provide the mechanical bias based on a second thermal expansion coefficient of a material of the bias element, different to a first thermal expansion coefficient of a material of the second transmission side.

14. The micromechanical structure in accordance with claim 1, wherein the first transmission side is formed as a beam structure, and wherein the second transmission side is formed as a beam structure, the second transmission side being coupled to the first transmission side via torsion spring elements.

15. The micromechanical structure in accordance with claim 1, wherein the first transmission side is formed as a first partially opened frame structure, and wherein the second transmission side is formed as a second partly opened frame structure which partly encloses the movable element.

16. The micromechanical structure in accordance with claim 1, wherein the transmission structure is formed as a scissor gear mechanism, configured to provide a translational displacement of the movable element out of the reference plane.

17. The micromechanical structure in accordance with claim 1, wherein a lever mechanism configured to increase a stroke of the transmission structure is arranged between the first transmission side and the second transmission side.

18. The micromechanical structure in accordance with claim 1, wherein a first torsion spring element and a second torsion spring element are arranged between the movable element and the substrate along a torsion axis of the movable element.

19. The micromechanical structure in accordance with claim 1, comprising a torsion spring element arrangement coupled between the first transmission side and the second transmission side or between the second transmission side and the movable element or between the movable element and the substrate, and comprising a first torsion spring element and a second torsion spring element which are arranged to be inclined to one another in a V-shape.

20. The micromechanical structure in accordance with claim 1, comprising a torsion spring element arrangement coupled between first coupling locations at the first transmission side and second coupling locations of the second transmission side or between first coupling locations at the second transmission side and second coupling locations at the movable element or between first coupling locations at the movable element and second coupling elements at the substrate, and comprising a first torsion spring element bent along an axial path and a second torsion spring element bent along an axial path, which are arranged to each other such that a first distance between the first coupling locations and a second between the second coupling locations are greater than a minimum distance between the first and the second torsion spring elements along the axial path;
wherein the first and the second torsion spring elements are arranged not to be in contact with each other over an entire axial path.

21. The micromechanical structure in accordance with claim 1, comprising a torsion spring element coupled between the first transmission side and the second transmission side or between the second transmission side and the movable element or between the movable element and the substrate, and formed to be X-shaped.

22. The micromechanical structure in accordance with claim 1, wherein the actuator comprises a first electrode structure supported on the substrate, and comprises a second electrode structure supported on the first transmission side, the actuator being configured to provide the force between the first electrode structure and the second electrode structure.

23. The micromechanical structure in accordance with claim 1, wherein the actuator is formed as an electrostatic drive, and wherein the electrostatic drive comprises interdigital electrodes arranged next to one another along a direction perpendicular to a force direction of the actuator.

24. The micromechanical structure in accordance with claim 1, wherein the actuator is formed as an electrostatic drive, and wherein the electrostatic drive comprises interdigital electrodes which, along a first direction, comprise a variable electrode dimension along a second direction perpendicular to the first direction.

25. The micromechanical structure in accordance with claim 1, wherein the first transmission side is connected to the substrate via a three-point suspension.

26. The micromechanical structure in accordance with claim 1, wherein the first transmission side is connected to the substrate by flexure spring elements, a bending direction of the flexure spring elements being arranged parallel to the force direction.

27. The micromechanical structure in accordance with claim 26, wherein the flexure spring elements comprise smaller a dimension along a thickness direction perpendicular to the reference plane than the first transmission side and the second transmission side.

28. The micromechanical structure in accordance with claim 1, comprising a flexure spring arrangement bi-stable along the force direction, coupled between the substrate and the first transmission side, and comprising an inclined arrangement relative to a surface normal of the substrate or, alternatively, of the first transmission side.

29. The micromechanical structure in accordance with claim 1, wherein at least a part of a substrate, at least a part of the transmission structure and at least a part of the movable element are formed integrally.

30. The micromechanical structure in accordance with claim 1, wherein the substrate, the movable element and the transmission structure are formed integrally.

31. The micromechanical structure in accordance with claim 1, wherein the substrate, the movable element and the transmission structure are single-crystalline.

32. The micromechanical structure in accordance with claim 1,
wherein the first transmission side and the second transmission side are coupled to each other via torsion spring elements;
wherein the second transmission side and the movable element are coupled to each other via torsion spring elements; and
wherein the first transmission side is connected to the substrate by flexure spring elements, a bending direction of the flexure spring elements being arranged parallel to the force direction.

33. A micromechanical system comprising a first micromechanical structure in accordance with claim 1, arranged as a movable element of a second micromechanical structure in accordance with claim 1.

34. An apparatus comprising:
a micromechanical structure in accordance with claim 1, or a micromechanical system comprising a first micromechanical structure in accordance with claim 1, arranged as a movable element of a second micromechanical structure in accordance with claim 1; and
a controller configured to control the actuator;
wherein the controller is configured for adjusting an oscillation of the movable element at a target frequency to apply a control signal to the actuator, comprising a value of a start frequency, the value of the start frequency being greater than the target frequency, and to reduce a frequency of the control signal in a plurality of steps until the target frequency is acquired; or
wherein the controller is configured for adjusting an oscillation of the movable element at a target frequency to apply a control signal to the actuator, comprising a value of a start frequency, the value of the start frequency being smaller than the target frequency, and to increase the frequency of the control signal in a plurality of steps until the target frequency is acquired, wherein the target frequency is a resonant frequency of the apparatus.

35. The apparatus in accordance with claim 34, wherein the controller is configured to select the target frequency such that it corresponds, within a tolerance range of 100%, to double a parametric resonant frequency of the micromechanical structure and is configured to cause the micromechanical structure to oscillate, using the control signal at the target frequency, which comprises an oscillation mode; and to modulate, over a course of the oscillation, at least one of a frequency, an amplitude or a phase position of the control signal so as to cause a change in the oscillation mode.

36. The apparatus in accordance with claim 35, wherein the controller is configured to couple in decelerating and/or accelerating forces at times when the oscillation of the movable element, relative to a rest position, is located outside a zero crossing so as to cause the change in the oscillation mode.

37. The apparatus in accordance with claim 35, wherein the controller is configured to apply the control signal, within a tolerance range of 10%, at a time when the oscillation of the movable element comprises a point of reversal such that the movable element is kept at a position.

38. The apparatus in accordance with claim 34, wherein the controller is configured to apply a start frequency in a rest position of the movable element and to excite the movable element to a parametric resonant oscillation out of a reference plane by applying the control signal at the start frequency or by a frequency variation of the control signal.

* * * * *